(12) United States Patent
Sundaresan et al.

(10) Patent No.: US 11,798,994 B2
(45) Date of Patent: *Oct. 24, 2023

(54) MANUFACTURE OF POWER DEVICES HAVING INCREASED CROSS OVER CURRENT

(71) Applicant: GeneSiC Semiconductor Inc., Dulles, VA (US)

(72) Inventors: Siddarth Sundaresan, Dulles, VA (US); Ranbir Singh, Dulles, VA (US); Jaehoon Park, Dulles, VA (US)

(73) Assignee: GeneSiC Semiconductor Inc., Dulles, VA (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/227,951

(22) Filed: Apr. 12, 2021

(65) Prior Publication Data

US 2022/0037473 A1  Feb. 3, 2022

Related U.S. Application Data

(62) Division of application No. 16/945,781, filed on Jul. 31, 2020, now Pat. No. 11,004,940.

(51) Int. Cl.
*H01L 29/16* (2006.01)
*H01L 27/02* (2006.01)
(Continued)

(52) U.S. Cl.
CPC ...... *H01L 29/1608* (2013.01); *H01L 27/0255* (2013.01); *H01L 29/4933* (2013.01); *H01L 29/7804* (2013.01); *H01L 29/7813* (2013.01)

(58) Field of Classification Search
CPC ............ H01L 29/1608; H01L 27/0255; H01L 29/4933; H01L 29/7804; H01L 29/7813;
(Continued)

(56) References Cited

U.S. PATENT DOCUMENTS 5,461,250 A  10/1995  Burghartz et al.
5,731,605 A   3/1998  Schlangenotto et al.
(Continued)

FOREIGN PATENT DOCUMENTS

EP    0899791 B1    3/1999
JP    2008541459 A  11/2008
WO    2011013042 A1  2/2011

*Primary Examiner* — Duy T Nguyen
(74) *Attorney, Agent, or Firm* — Dave Law Group LLC; Raj S. Dave

(57) ABSTRACT

An embodiment relates to a n-type planar gate DMOSFET comprising a Silicon Carbide (SiC) substrate. The SiC substrate includes a N+ substrate, a N− drift layer, a P-well region and a first N+ source region within each P-well region. A second N+ source region is formed between the P-well region and a source metal via a silicide layer. During third quadrant operation of the DMOSFET, the second N+ source region starts depleting when a source terminal is positively biased with respect to a drain terminal. The second N+ source region impacts turn-on voltage of body diode regions of the DMOSFET by establishing short-circuitry between the P-well region and the source metal when the second N+ source region is completely depleted.

20 Claims, 93 Drawing Sheets

(51) Int. Cl.
*H01L 29/49* (2006.01)
*H01L 29/78* (2006.01)

(58) Field of Classification Search
CPC . H01L 29/0653; H01L 29/45; H01L 29/0696; H01L 29/0869; H01L 29/1095; H01L 29/41741; H01L 29/41766; H01L 29/66068; H01L 29/7806
USPC .......................................................... 257/77
See application file for complete search history.

(56) References Cited

U.S. PATENT DOCUMENTS

| | | | |
|---|---|---|---|
| 5,811,335 A * | 9/1998 | Santangelo | H01L 29/66333 257/E29.198 |
| 8,436,367 B1 | 5/2013 | Sdrulla et al. | |
| 9,318,597 B2 | 4/2016 | Pala et al. | |
| 9,875,332 B2 | 1/2018 | Yeric | |
| 9,876,104 B2 | 1/2018 | Matocha et al. | |
| 9,899,512 B2 | 2/2018 | Losee et al. | |
| 10,763,356 B1 * | 9/2020 | Sundaresan | H01L 29/7813 |
| 2006/0255423 A1 | 11/2006 | Ryu et al. | |
| 2011/0024834 A1 * | 2/2011 | Hull | H01L 29/4983 257/E29.256 |
| 2013/0234159 A1 * | 9/2013 | Tsuchiya | H01L 29/7395 257/77 |
| 2014/0145209 A1 * | 5/2014 | Kumagai | H01L 29/0878 257/77 |
| 2017/0005219 A1 * | 1/2017 | Goushcha | H01L 31/0216 |
| 2017/0236915 A1 * | 8/2017 | Gorczyca | H01L 29/4916 257/77 |
| 2017/0243970 A1 * | 8/2017 | Losee | H01L 29/41758 |
| 2017/0271467 A1 * | 9/2017 | Kono | H01L 21/0485 |
| 2019/0013312 A1 | 1/2019 | Saggio et al. | |
| 2020/0295139 A1 * | 9/2020 | Sundaresan | H01L 29/7802 |

* cited by examiner

MANUFACTURE OF POWER DEVICES HAVING INCREASED CROSS OVER CURRENT

CROSS-REFERENCE TO RELATED APPLICATIONS

This application is a divisional application of U.S. application Ser. No. 16/945,781 filed on Jul. 31, 2020, issued as U.S. Pat. No. 11,004,940 B1 on May 11, 2021, the contents of which are hereby incorporated by reference in their entirety.

FIELD OF THE INVENTION

This disclosure relates to power semiconductor devices using a vertical silicon carbide (SiC) double-implantation metal oxide semiconductor field-effect transistor (DMOSFET). A power metal oxide semiconductor field-effect transistor (MOSFET) is a specific type of MOSFET designed to handle significant power levels.

BACKGROUND

Silicon based power devices have long dominated power electronics and power system applications. On the other hand, silicon carbide (SiC) is a wider band-gap (Eg) material with Eg=3.3 eV as compared to silicon (Eg=1.1 eV) and hence, SiC has a higher blocking voltage than Silicon (Si). SiC has a higher breakdown electric field ($3\times10^6$ V/cm to $5\times10^6$ V/cm) compared to silicon (Si) (breakdown electric field for Si is $0.3\times10^6$ V/cm) and is a better thermal conductor (3.7 (W/cm-K) for SiC versus 1.6 (W/cm-K) for Si). SiC has been a material of choice for power MOSFETs. However, "[e]ven with the successful introduction of SiC power MOSFETs into the commercial marketplace, several key reliability issues have not been fully resolved." [source: Key Reliability Issues for SiC Power MOSFETs, A. Lelis, D. Habersat, R. Green, and E. Mooro of the U.S. Army Research Laboratory, published in ECS Transactions, 58 (4) 87-93 (2013), DOI: 10.1149/05804.0087ecst].

"[W]hile SiC power MOSFETs share many similarities to silicon MOSFETs, many challenging differences remain. In particular, the wide-bandgap nature of 4H-SiC (EG=3.26 eV) is both a blessing and a curse, bringing a low intrinsic carrier concentration and a high critical electric field, while presenting challenges with inversion-layer mobility and reliability in passivating dielectric layers." [Source: Challenges in SiC Power MOSFET Design by Kevin Matocha of the GE Global Research Center—Semiconductor Technology Laboratory, Niskayuna, N.Y. USA, published in ISDRS 2007, Dec. 12-14, 2007, College Park, Md., USA].

"[A] silicon carbide (SiC) device may include a gate electrode disposed above a SiC semiconductor layer, wherein the SiC semiconductor layer comprises: a drift region having a first conductivity type; a well region disposed adjacent to the drift region, wherein the well region has a second conductivity type; and a source region having the first conductivity type disposed adjacent to the well region, wherein the source region comprises a source contact region and a pinch region, wherein the pinch region is disposed only partially below the gate electrode, wherein a sheet doping density in the pinch region is less than $2.5\times10^{14}$ cm$^{-2}$, and wherein the pinch region is configured to deplete at a current density greater than a nominal current density of the SiC device to increase the resistance of the source region." [source: Silicon carbide device and method of making thereof, Peter Almern Losee, Ljubisa Dragoljub Stevanovic, Gregory Thomas Dunne, Alexander Viktorovich Bolotnikov, published as U.S. Pat. No. 9,899,512B2 on Feb. 20, 2018].

US20190013312A1 discloses body regions numbered 3, 5, respectively, that accommodate a first and a second source region numbered 4, 6, of the N type, extending from the upper surface 2A into the interior of the body regions 3, 5 and states: "A first metallization layer extends over the first surface and forms, in direct contact with the implanted structure and with the JFET region, a JBS diode." [source: MOSFET device of silicon carbide having an integrated diode and manufacturing process thereof, Mario Giuseppe Saggio, Simone RASCUNA, published at USPTO as US20190013312A1 on Jan. 10, 2019].

"An n-MOSFET device (11) has an n-type channel (2) between a substrate (1) and a gate structure (7, 8), the channel (2) being formed by a layer of n-doped germanium of a thickness such that the channel (2) is fully-depleted with no applied gate voltage whereby the device (11) is operative in accumulation mode." [source: Germanium n-mosfet devices and production methods, Daniele Caimi, Athanasios Dimoulas, Jean Fompeyrine, Chiara Marchiori, Christophe P. Rossel, Marilyne Sousa, Axelle M. Tapponnier, David J. Webb, published as WO2011013042A1 on Feb. 3, 2011].

U.S. Pat. No. 9,318,597B2 discloses that a semiconductor device that includes a vertical field-effect-transistor (FET) and a bypass diode. It further states that the vertical FET device includes a substrate, a drift layer formed over the substrate, a gate contact and a plurality of source contacts located on a first surface of the drift layer opposite the substrate, a drain contact located on a surface of the substrate opposite the drift layer, and a plurality of junction implants, each of the plurality of junction implants laterally separated from one another on the surface of the drift layer opposite the substrate and extending downward toward the substrate and that each of the one or more bypass diodes are formed by placing a Schottky metal contact on the first surface of the drift layer, such that each Schottky metal contact runs between two of the plurality of junction implants. [source: Layout configurations for integrating schottky contacts into a power transistor device, Vipindas Pala, Edward Robert Van Brunt, Lin Cheng, John Williams Palmour, published as U.S. Pat. No. 9,318,597B2 at USPTO on Apr. 19, 2016].

U.S. Pat. No. 9,876,104B2 discloses a multi-cell MOSFET device including a MOSFET cell with an integrated Schottky diode wherein the MOSFET includes n-type source regions formed in p-type well regions which are formed in an n-type drift layer, a p-type body contact region is formed on the periphery of the MOSFET and the source metallization of the device forms a Schottky contact with an n-type semiconductor region adjacent the p-type body contact region of the device. [source: High voltage semiconductor devices and methods of making the devices, Kevin Matocha, Kiran Chatty, Sujit Banerjee, published as U.S. Pat. No. 9,876,104B2 on Jan. 23, 2018].

U.S. Pat. No. 8,436,367B1 discloses that a SiC Power Semiconductor device of the Field Effect Type (MOSFET, IGBT or the like) with "muted" channel conduction, negative temperature coefficient of channel mobility, in situ "ballasted" source resistors and optimized thermal management of the cells for increased Safe Operating Area is described. Controlling the location of the Zero Temperature Crossover Point (ZTCP) in relationship to the drain current is achieved by the partition between the "active" and "inactive" channels and by adjusting the mobility of the carriers in the channel for the temperature range of interest." [source: SiC power vertical DMOS with increased safe operating area, Dumitru Sdrulla, Marc Vandenberg, published at USPTO as U.S. Pat. No. 8,436,367B1 on May 7, 2013].

Considering the knowledge of persons skilled in the art, there is a long-felt need for power devices having increased third quadrant cross over current to overcome performance and reliability issues.

SUMMARY

Disclosed are one or more aspects of design and manufacture of power devices having increased third quadrant cross over current.

In one aspect, a device comprising a unit cell on a Silicon Carbide (SiC) substrate is described. The unit cell comprises a first conductivity type first source region, a first conductivity type second source region, a second conductivity type well region and a silicide layer. The device comprises a vertical Silicon Carbide (SiC) double-implantation metal oxide semiconductor field-effect transistor (DMOSFET) comprising a drain terminal on a backside of the SiC substrate and a source terminal on a topside of the SiC substrate. The first conductivity type second source region comprises a thickness ranging from 1% to 90% lower than a thickness of the first conductivity type first source region. The first conductivity type second source region is interspersed between the second conductivity type well region and the silicide layer.

In an embodiment, the first conductivity type second source region comprises a sheet of source region located between a recessed SiC trench region and the second conductivity type well region.

In another embodiment, the sheet of source region comprises a thin sheet of source region.

In yet another embodiment, the first conductivity type second source region comprises at least one of (a) a target thickness and (b) a target doping concentration.

In yet another embodiment, the target thickness ranges from 1 nm to 1 μm.

In yet another embodiment, the target doping concentration ranges from $10^{15}$ cm$^{-3}$ to $10^{21}$ cm$^{-3}$.

In yet another embodiment, the first conductivity type second source region comprises a sheet of source region located between the silicide layer and the second conductivity type well region.

In yet another embodiment, the sheet of source region comprises a thin sheet of source region.

In yet another embodiment, the first conductivity type second source region comprises at least one of (a) a target thickness and (b) a target doping concentration.

In yet another embodiment, the target thickness ranges from 1 nm to 1 μm.

In yet another embodiment, the target doping concentration ranges from $10^{15}$ cm$^{-3}$ to $10^{21}$ cm$^{-3}$.

In yet another embodiment, a doping concentration of the first conductivity type second source region ranges from 1% to 90% lower than a doping concentration of the first conductivity type first source region.

In another aspect, a device comprising a unit cell on a Silicon Carbide (SiC) substrate is described. The unit cell comprises a first conductivity type source region, a second conductivity type well contact region, a second conductivity type well region, a first metal region and a silicide layer. The device comprises a vertical Silicon Carbide double-implantation metal oxide semiconductor field-effect transistor (DMOSFET) comprising a drain terminal on a backside of the SiC substrate and a source terminal on a topside of the SiC substrate. The first metal region is in contact with the second conductivity type well contact region. The silicide layer is in contact with the second conductivity type well contact region through the first metal region.

In an embodiment, the first metal region comprises a target work function.

In another embodiment, the target work function ranges from 3.5 electron volts to 6 electron volts.

In yet another aspect, a device comprising a unit cell on a Silicon Carbide (SiC) substrate is described. The unit cell comprises a first conductivity type source region, a second conductivity type well region, a second conductivity type well contact region and a silicide layer. The device comprises a vertical Silicon Carbide double-implantation metal oxide semiconductor field-effect transistor (DMOSFET) comprising a drain terminal on a backside of the SiC substrate and a source terminal on a topside of the SiC substrate. A lateral extent of the second conductivity type well contact region varies with a non-zero value in direction orthogonal to the unit cell.

In an embodiment, the second conductivity type well contact region comprises a periodic contact with a source metal via the silicide layer between an adjacent interlayer dielectric (ILD) region.

In another embodiment, the second conductivity type well contact region comprises a periodic spacing between the first conductivity type source region and the second conductivity type well contact region.

In yet another embodiment, the second conductivity type well contact region comprises a target size, a target spacing between adjacent junction points located between the second conductivity type well contact region, and the silicide layer between the adjacent ILD region.

In yet another embodiment, the target size ranges from 10 nm to 10 μm and the target spacing ranging from 10 nm to 10 μm.

In yet another embodiment, the second conductivity type well contact region meanders from a perspective of a cross-sectional view of the device and the second conductivity type well region contacts with the silicide layer through the second conductivity type well contact region alone.

In yet another embodiment, the second conductivity type well contact region comprises a target size, a target spacing between adjacent junction points located between the second conductivity type well contact region, and the silicide layer between the adjacent ILD region.

In yet another embodiment, the target size ranges from 10 nm to 10 μm and the target spacing ranging from 10 nm to 10 μm.

In yet another aspect, a method of design and manufacture of a power device having increased third quadrant cross over current is described. The method comprises preparing a unit cell of a Silicon Carbide (SiC) substrate comprising a first conductivity type substrate and a first conductivity type drift layer, forming a second conductivity type well region by performing a second conductivity type implantation through a first patterned hard mask layer on the SiC substrate, forming a first conductivity type first source region by performing a first conductivity type implantation through a second patterned hard mask layer on the SiC substrate, forming a first conductivity type second source region, through a third patterned hard mask layer between a silicide layer on a topside of the SiC substrate and the second conductivity type well region, and forming a vertical Silicon Carbide (SiC) double-implantation metal oxide semiconductor field-effect transistor (DMOSFET) comprising a drain terminal on a backside of the SiC substrate and a source terminal on the topside of the SiC substrate. The first conductivity type second source region comprises a thickness less than a thickness of the first conductivity type first source region.

In an embodiment, forming the first conductivity type second source region comprises forming a sheet of source region.

In another embodiment, forming the sheet of source region comprises forming a thin sheet of source region.

In yet another embodiment, forming the first conductivity type second source region comprises removing a portion of the SiC substrate by performing etching onto the topside of the SiC substrate.

In yet another embodiment, forming the first conductivity type second source region with at least one of (a) a target thickness and (b) a target doping concentration is performed by monitoring the etching performed onto the SiC substrate, and controlling the etching performed onto the SiC substrate.

In yet another embodiment, forming the first conductivity type second source region comprises performing a subsequent first conductivity type implantation through the third patterned hard mask layer on the topside of the SiC substrate.

In yet another embodiment, forming the first conductivity type second source region with at least one of (a) a target thickness and (b) a target doping concentration is performed by monitoring dosage and energy level of the subsequent first conductivity type implantation, and controlling the dosage and the energy level of the subsequent first conductivity type implantation.

In yet another embodiment, the first conductivity type second source region comprises a doping concentration ranging from 1% to 90% lower than a doping concentration of the first conductivity type first source region.

In yet another aspect, a method of design and manufacture of a power device having increased third quadrant cross over current is described. The method includes preparing a unit cell of a Silicon Carbide (SiC) substrate comprising a first conductivity type substrate and a first conductivity type drift layer, forming a second conductivity type well region by performing a second conductivity type implantation through a first patterned hard mask layer on the SiC substrate, forming a first conductivity type source region by performing a first conductivity type implantation through a second patterned hard mask layer on the SiC substrate, forming a second conductivity type well contact region by performing a subsequent second conductivity type implantation through a third patterned layer on the SiC substrate, forming a first metal region in direct contact with the second conductivity type well contact region, and forming a vertical Silicon Carbide (SiC) double-implantation metal oxide semiconductor field-effect transistor (DMOSFET) comprising a drain terminal on a backside of the SiC substrate and a source terminal on a topside of the SiC substrate.

In an embodiment, forming the first metal region with a target work function is performed by controlling a barrier height of the first metal region, selecting a metal comprising an appropriate work function, and adjusting thermal temperature and time for annealing a first metal contact region once the first metal region is formed.

In another embodiment, the method includes forming a second metal region in direct contact with the first conductivity type drift layer. The second metal region bridges the unit cell and an adjacent unit cell. A work function of the first metal region is less than a work function of the second metal region.

In yet another aspect, a method of design and manufacture of a power device having increased third quadrant cross over current is described. The method includes preparing a unit cell of a Silicon Carbide (SiC) substrate comprising a first conductivity type substrate and a first conductivity type drift layer, forming a second conductivity type well region by performing a second conductivity type implantation through a first patterned hard mask layer on the SiC substrate, forming a first conductivity type source region by performing a first conductivity type implantation through a second patterned hard mask layer on the SiC substrate, forming a second conductivity type well contact region, by performing a subsequent second conductivity type implantation through a third patterned hard mask layer, meandering at respective locations on the SiC substrate, and forming a vertical Silicon Carbide (SiC) double-implantation metal oxide semiconductor field-effect transistor (DMOSFET) comprising a drain terminal on a backside of the SiC substrate and a source terminal on a topside of the SiC substrate.

In an embodiment, the second conductivity type well contact region comprises a periodic contact with a source metal via a silicide layer between an adjacent interlayer dielectric (ILD) region.

In another embodiment, forming the second conductivity type well contact region enables the second conductivity type well region in contact with a silicide layer through (a) the second conductivity type well contact region and (b) a periodic spacing between the second conductivity type well contact region and the first conductivity type source region In yet another embodiment, forming the second conductivity type well contact region enables the second conductivity type well region in contact with a silicide layer through the second conductivity type well contact region alone.

In yet another embodiment, forming the second conductivity type well contact region at respective locations on the SiC substrate is performed by controlling a size of the second conductivity type well contact region to a target size, and controlling a spacing between adjacent junction points located between the second conductivity type well contact region to a target spacing, and a silicide layer between an adjacent ILD region.

In yet another embodiment, the target size ranges from 10 nm to 10 μm and the target spacing ranges from 10 nm to 10 μm.

BRIEF DESCRIPTION OF THE FIGURES

The embodiments are illustrated by way of example and not limitation in the figures of the accompanying drawings, in which like references indicate similar elements and in which:

FIGS. 2a-2t illustrates an embodiment of a process of manufacturing the DMOSFET structure shown in FIG. 1a.

FIGS. 5a-5t illustrate an embodiment of a process of manufacturing the DMOSFET structure shown in FIG. 4a.

FIGS. 7a-7x illustrate an embodiment of a process of manufacturing the DMOSFET structure shown in FIG. 6a.

FIGS. 9a-9t illustrate an embodiment of a process of manufacturing the DMOSFET structure shown in FIG. 8a.

FIGS. 13a-13t illustrate an embodiment of a process of manufacturing the DMOSFET structure shown in FIG. 12a.

Figure 1A:
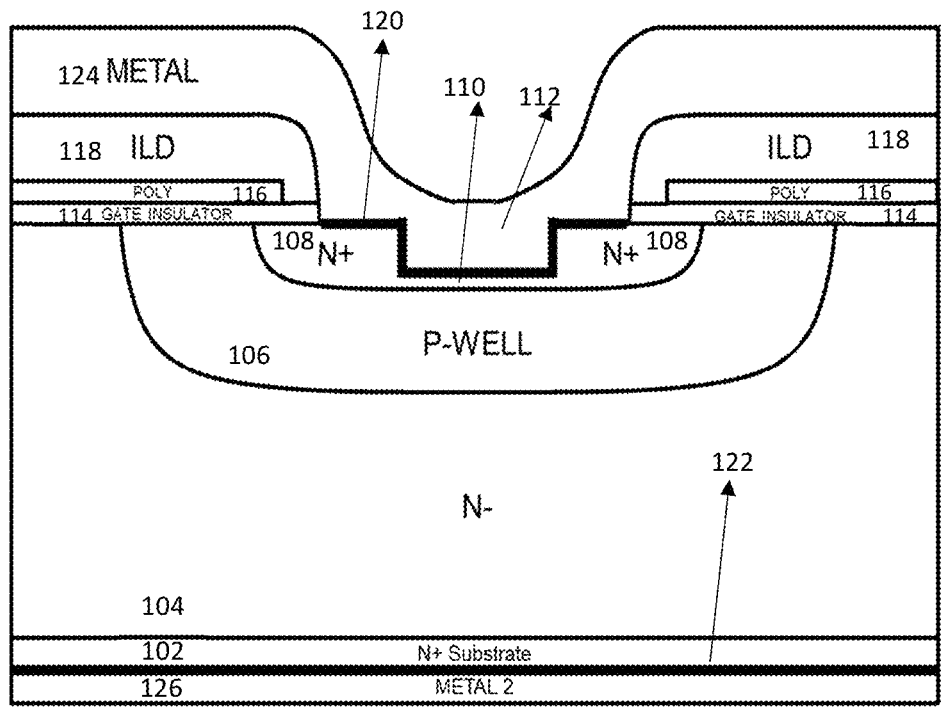
FIG. 1a illustrates an embodiment of a cross sectional structure of a unit cell of a double-implantation metal oxide semiconductor field-effect transistor (DMOSFET) comprising a first conductivity type second source region within a first conductivity type first source region.

Other features of the present embodiments will be apparent from the accompanying drawings and from the detailed description that follows.

DETAILED DESCRIPTION

Definitions and General Techniques

Unless otherwise defined herein, scientific and technical terms used herein shall have the meanings that are commonly understood by those of ordinary skill in the art. Further, unless otherwise required by context, singular terms shall include pluralities and plural terms shall include the singular. Generally, nomenclatures used in connection with, and techniques of, semiconductor processing described herein are those well-known and commonly used in the art.

The methods and techniques described herein are generally performed according to conventional methods well known in the art and as described in various general and more specific references that are cited and discussed throughout the present specification unless otherwise indicated. The nomenclatures used in connection with, and the procedures and techniques of semiconductor device technology, semiconductor processing, and other related fields described herein are those well-known and commonly used in the art.

For simplicity and clarity of illustration, the drawing figures illustrate the general manner of construction, and descriptions and details of well-known features and techniques may be omitted to avoid unnecessarily obscuring the present disclosure. Additionally, elements in the drawing figures are not necessarily drawn to scale. For example, the dimensions of some of the elements in the figures may be exaggerated relative to other elements to help improve understanding of embodiments of the present disclosure. The same reference numerals in different figures denotes the same elements.

The terms "first," "second," "third," "fourth," and the like in the description and in the claims, if any, are used for distinguishing between similar elements and not necessarily for describing a particular sequential or chronological order. It is to be understood that the terms so used are interchangeable under appropriate circumstances such that the embodiments described herein are, for example, capable of operation in sequences other than those illustrated or otherwise described herein. Furthermore, the terms "include," and "have," and any variations thereof, are intended to cover a non-exclusive inclusion, such that a process, method, system, article, device, or apparatus that comprises a list of elements is not necessarily limited to those elements, but may include other elements not expressly listed or inherent to such process, method, system, article, device, or apparatus.

The terms "left," "right," "front," "back," "top," "bottom," "over," "under," and the like in the description and in the claims, if any, are used for descriptive purposes and not necessarily for describing permanent relative positions. It is to be understood that the terms so used are interchangeable under appropriate circumstances such that the embodiments of the apparatus, methods, and/or articles of manufacture described herein are, for example, capable of operation in other orientations than those illustrated or otherwise described herein.

The following terms and phrases, unless otherwise indicated, shall be understood to have the following meanings.

The term "unit cell" as used herein refers to a piece of a pattern in a semiconductor which is repeated in the semiconductor.

The term "SiC" as used herein refers to silicon carbide which is a compound semiconductor and is a mixture of silicon and carbon with the chemical formula SiC. Silicon is covalently bonded with carbon. In 4H-SiC, 4H is written in the Ramsdell classification scheme where the number indicates the layer and the letter indicates the Bravais lattice. That means in a 4H-SiC structure four hexagonal layers of SiC are present. SiC exists in a kind of polymorphic crystalline building known as a polytype, e.g. 3C-SiC, 4H-SiC, 6H-SiC. Presently 4H-SiC is used in power device manufacturing.

The term "substrate" as used herein refers to the supporting material on or in which the components of an integrated circuit are fabricated or attached.

The term "JFET" as used herein refers to junction gate field-effect transistor which is a three-terminal semiconductor device that can be used as electronically-controlled switches, amplifiers, or voltage-controlled resistors. A FET (field-effect transistor) is a unipolar transistor in which current carriers are injected at a source terminal and pass to a drain terminal through a channel of semiconductor material whose conductivity depends largely on an electric field applied to the semiconductor from a control electrode. There are two main types of FETs, a junction FET and an insulated-gate FET. In the junction FET, the gate is isolated from the channel by a p-n junction. In an insulated-gate FET, the gate is isolated from the channel by an insulating layer so that the gate and channel form a capacitor with the insulating layer as the capacitor dielectric.

The term "MOSFET" as used herein refers to metal oxide semiconductor field-effect transistor. which is a four-terminal device with source (S), gate (G), drain (D) and body (B) terminals. The body of the MOSFET is frequently connected to the source terminal so making it a three-terminal device like field effect transistor.

The term "DMOSFET" as used herein refers to double-implantation metal oxide semiconductor field-effect transistor. A common physical structure of SiC MOSFETs is the planar double-implanted MOSFET in 4H-SiC (SiC-DMOSFET).

The term "dopant" as used herein refers to an impurity added from an external source to a material by diffusion, coating, or implanting into a substrate, and changing the properties thereof. In semiconductor technology, an impurity may be added to a semiconductor to modify its electrical properties or to a material to produce a semiconductor having desired electrical properties. N-type (negative) dopants (e.g., such as phosphorus for a group IV semiconductor) typically come from group V of the periodic table. When added to a semiconductor, n-type dopants create a material that contains conduction electrons. P-type (positive) dopants (e.g., such as boron for a group IV semiconductor) typically come from group III and result in conduction holes (i.e., vacancies in the electron shells).

The term "drain" as used herein refers to the electrode of a field effect transistor which receives charge carriers which pass through the transistor channel from the source electrode.

The term "source" as used herein refers to the active region/electrode to which the source of charge carriers is connected in a field effect transistor.

The term "gate" as used herein refers to the control electrode or control region that exerts an effect on a semiconductor region directly associated therewith, such that the conductivity characteristic of the semiconductor region is altered in a temporary manner, often resulting in an on-off type switching action. The control electrode or control region of a field effect transistor is located between the source and drain electrodes, and regions thereof.

The term "topside" as used herein refers to outer side/top of the DMOSFET. The topside of the vertical SiC DMOSFET may comprise a source terminal.

The term "bottom side" as used herein refers to underside/base of the DMOSFET. The bottom side of the vertical SiC DMOSFET may comprise a drain terminal.

The term "front side" as used herein refers to a side of the DMOSFET which is visible in front.

The term "back side" as used herein refers to rear side of the DMOSFET. The back side of the vertical SiC DMOSFET may comprise the drain terminal.

The term "impurity" as used herein refers to a foreign material present in a semiconductor crystal, such as boron or arsenic in silicon, which is added to the semiconductor to produce either p-type or n-type semiconductor material, or to otherwise result in material whose electrical characteristics depend on the impurity dopant atoms.

The term "PN junction" as used herein refers to the interface and region of transition between p-type and n-type semiconductors.

The term "polysilicon" as used herein refers to a polycrystalline form of silicon.

The term "p-type" as used herein refers to extrinsic semiconductor in which the hole density exceeds the conduction electron density.

The term "bandgap" as used herein refers to the difference between the energy levels of electrons bound to their nuclei (valence electrons) and the energy levels that allow electrons to migrate freely (conduction electrons). The band gap depends on the particular semiconductor involved.

The term "channel" as used herein refers to a path for conducting current between a source and drain of a field effect transistor.

The term "chip" as used herein refers to a single crystal substrate of semiconductor material on which one or more active or passive solid-state electronic devices are formed. A chip may contain an integrated circuit. A chip is not normally ready for use until packaged and provided with external connectors.

The term "contact" as used herein refers to the point or part of a conductor which touches another electrical conductor or electrical component to carry electrical current to or from the conductor or electrical component.

The term "drift layer" as used herein refers to lightly doped region to support the high voltage in power DMOSFET.

The term "well" used herein refers certain regions in a metal-oxide-semiconductor (MOS) transistor. MOS transistors are always created in a "well" region. A PMOS (positive-channel MOS) transistor is made in an N-doped region, called "n-well" region. Similarly, an NMOS transistor (negative-channel MOS) is made in a "p-type" region called "p-well". This ensures that the leakage between two transistors, through the bottom side, is low due to the reverse bias between the transistor areas and the well region.

The term "plus" used herein refers certain regions in a metal-oxide-semiconductor (MOS) transistor where doping concentration is excessive.

The term "source interconnect metallization" as used herein refers to interconnection metallization that interconnects many DMOSFETs using fine-line metal patterns.

The term "device" as used herein refers to the physical realization of an individual electrical element in a physically independent body which cannot be further divided without destroying its stated function.

The term "surface" as used herein refers to the outer or exterior boundary of a thing.

The term "trench" as used herein refers to electrical isolation of electronic components in a monolithic integrated circuit by the use of grooves or other indentations in the surface of the substrate, which may or may not be filled with electrically insulative (i.e., dielectric) material.

The term "dielectric" as used herein refers to a non-conductor of electricity, otherwise known as an insulator.

The term "ILD" as used herein refers to interlayer dielectric material used to electrically separate closely spaced interconnect lines arranged in several levels (multilevel metallization) in an advanced integrated circuit.

The term "active region" as used herein refers to a region of the DMOSFET where the current conduction happens.

The term "depletion region" as used herein refers to a region where flow of charged carriers decreases over a given time.

The term "thermal budget" as used herein refers to total amount of thermal energy transferred to a wafer during the given elevated temperature operation.

The term "work function" as used herein refers to minimum quantity of energy required to remove an electron to infinity from the surface of a given metal.

The terms "first conductivity type region" and "second conductivity type region" as used herein, are used to describe n-type and p-type regions respectively for a N type device. For a P type device "first conductivity type region" and "second conductivity type region" are used to describe p-type and n-type regions respectively Embodiments relate to silicon carbide (SiC) DMOSFET power devices having increased third quadrant cross over current.

An embodiment relates to tuning turn-on voltage of one or more body diode regions of the DMOSFET.

An embodiment relates to reducing injection of minority carriers during conduction of the one or more body diode regions.

An embodiment relates to tuning source contact resistance of the one or more body diode regions of the DMOSFET.

An embodiment relates to improved device reliability.

An embodiment relates to reducing differential ON resistance for a given chip size.

An embodiment relates to mitigate basal plane dislocation (BPD).

An embodiment relates to formation of a first conductivity type second source region between a silicide layer and a second conductivity type well region of the DMOSFET.

An embodiment relates to formation of a first metal region in direct contact with a second conductivity type well contact region.

An embodiment relates to connecting one or more Schottky diode regions in series with the one or more body diode regions of the DMOSFET.

An embodiment relates to formation of the second conductivity type well contact region that meanders and comprise a periodic spacing between the first conductivity type source region and the second conductivity type well contact region.

An embodiment relates to formation of the second conductivity type well contact region that meanders and enables the second conductivity type well region to be contact in with a source metal only through the second conductivity type well contact region.

An embodiment relates to a power DMOSFET device structure designed to handle significant power level includes an intrinsic anti-parallel p-n junction diode, formed between the body and well regions, respectively. The anti-parallel p-n junction diode within the power DMOSFET structure conducts during third quadrant operation of the power DMOSFET. The third quadrant operation occurs when source terminal is biased positively with respect to drain terminal, a situation that is commonly encountered when power MOSFETs are utilized in motor control related power conversion applications. To circumvent performance and reliability issues related to slower switching speed of the p-n diode and conversion of the basal plane dislocations into stacking faults, respectively, a Schottky diode is either externally or internally connected in an anti-parallel with the intrinsic p-n body diode of the DMOSFET. In this scenario, there exists a specific cross-over current, above which the current still flows mainly through the p-n diode, despite the connection of the Schottky diode.

An embodiment relates to a Silicon Carbide (SiC) double-implantation metal oxide semiconductor field effect transistor (DMOSFET) with increased cross over current. The magnitude of the cross over current of the DMOSFET is increased by at least one of increasing built-in potential (e.g. turn-on voltage) of the one or more body diode regions of the DMOSFET and reducing injection of minority carriers during conduction of the one or more body diode regions. In an embodiment, the SiC DMOSFET is a n-type planar gate DMOSFET. In another embodiment, the SiC DMOSFET is a p-type planar gate DMOSFET. In yet another embodiment, the SiC DMOSFET is a n-type trench gate DMOSFET. In yet another embodiment, the SiC DMOSFET is a p-type trench gate DMOSFET. The magnitude of the cross over current is increased by performing below embodiments. The below embodiments are described specifically with respect to the n-type planar gate DMOSFET.

In one embodiment, each unit cell of the DMOSFET comprises a second N+ source region between a silicide layer and a p-well region to impact the turn-on voltage of the one or more body diode regions of the DMOSFET.

In another embodiment, each unit cell of the DMOSFET comprises a first metal region in direct contact with a P+ region to connect one or more Schottky diode regions in series with the one or more body diode regions of the DMOSFET to impact the turn-on voltage of the one or more body diode regions of the DMOSFET.

In yet another embodiment, each unit cell of the DMOSFET comprises the P+ region that meanders and comprises a periodic spacing between a N+ source region and the P+ region to form periodic contacts to a first pad metal (e.g. a source metal) via the silicide layer between interlayer dielectric bumps (ILD) to impact the differential on-resistance of the one or more body diode regions of the DMOSFET.

In yet another embodiment, each unit cell of the DMOSFET comprises the P+ region that meanders and enables the P-well region to be in contact with the silicide layer (i.e. the first pad metal) only through the meandering P+ region to impact the differential on-resistance of the one or more body diode regions of the DMOSFET.

FIG. 1a illustrates an embodiment of a cross sectional structure of a unit cell of a double-implantation metal oxide semiconductor field-effect transistor (DMOSFET) comprising a first conductivity type second source region within a first conductivity type first source region. The DMOSFET (shown in FIG. 1a) is a n-type planar gate DMOSFET. In an embodiment, the DMOSFET is a p-type planar gate DMOSFET. The DMOSFET (shown in FIG. 1a) comprises a silicon carbide (SiC) substrate. The SiC substrate comprises a N+ substrate 102 and a N− drift layer 104. The DMOSFET also comprises a P-well region 106, a first N+ source region 108 (i.e. the first conductivity type first source region) and a second N+ source region 110 (i.e. the first conductivity type second source region). The first N+ source region 108 is formed within the P-well region 106. The second N+ source region 110 is formed within each first N+ source region 108 by etching the SiC substrate to remove a portion of the SiC substrate and form a recessed SiC trench 112. In an embodiment, the second N+ source region 110 is a depletion region when the DMOSFET is operated in the third quadrant. The recessed SiC trench 112 leaves the remnant thin first N+ source region 108 as the second N+ source region 110. The second N+ source region 110 comprises a thickness less than a thickness of the first N+ source region 108 which enables the second N+ source region 110 to get depleted easily compared to the first N+ source region 108. The second N+ source region 110 may comprise the thickness ranging from 1% to 90% lower than the thickness of the first N+ source region 108. In an embodiment, the second N+ source region 110 comprises a doping concentration less than a doping concentration of the first N+ source region 108. The second N+ source region 110 may comprise the doping concentration ranging from 1% to 90% lower than the doping concentration of the first N+ source region 108.

The DMOSFET also comprises a gate insulator 114, a polysilicon layer 116 and an interlayer dielectric (ILD) 118 on both sides of top surface of the SiC substrate. The DMOSFET further comprises a first silicide layer 120 on top of the recessed SiC trench 112 and a second silicide layer 122 on bottom side/back side of the SiC substrate to form ohmic contacts for a source terminal and a drain terminal respectively. The DMOSFET further comprises a first pad metal 124 (e.g. a source metal) and a second pad metal 126 (e.g. a drain metal) on top of the first silicide layer 120 and bottom of the second silicide layer 122 respectively.

During third quadrant operation of the n-type planar gate DMOSFET (i.e. when the source terminal is positively biased with respect to the drain terminal), an intrinsic p-n junction between the second N+ source region 110 and the p-well region 106 is reverse biased as electric potential of the first pad metal 124 is low when compared to electric potential of the second pad metal 126. The second N+ source region 110 starts depleting during the third quadrant operation. The first pad metal 124 (e.g. the source metal) is directly short circuited (e.g. connected) with the P-well region 106, when the second N+ source region 110 is completely depleted. The second N+ source region 110 enables one or more body diode regions of the DMOSFET to have an increased turn-on voltage and the one or more body diode regions turn on only when the second N+ source region 110 is completely depleted. The increased turn-on voltage is due to intrinsic bandgap of the SiC. As the complete depletion of the second N+ source region 110 depends on at least one of the thickness and the doping concentration of the second N+ source region 110, the turn-on voltage of the second N+ source region 110 also depends on the thickness and the doping concentration of the second N+ source region 110. The turn-on voltage of the one or more body diode regions is tuned by controlling/adjusting the thickness and the doping concentration of the second N+ source region 110 to a target thickness and a target doping concentration respectively. In an embodiment, the target thickness ranges from 1 nm to 1 μm. In another embodiment, the target doping concentration ranges from $10^{15}$ cm$^{-3}$ to $10^{21}$ cm$^{-3}$. The target thickness and the target doping concentration of the second N+ source region 110 is achieved by monitoring and controlling precisely the etching performed onto the SiC substrate.

Figure 1B:
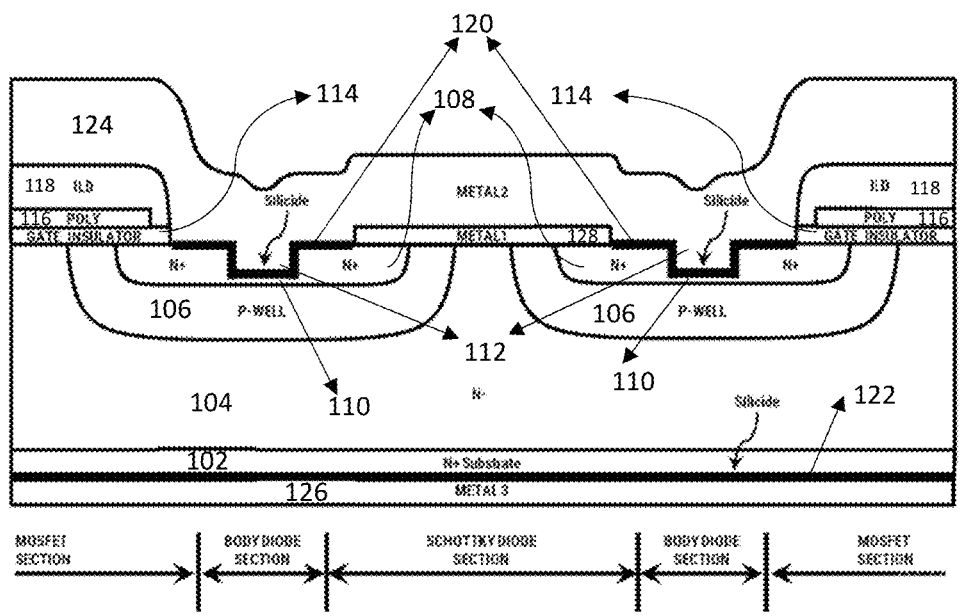
FIG. 1B illustrates an embodiment of a cross sectional structure of one or more unit cells of the DMOSFET, comprising one or more unit cells of an integrated Schottky diode, each DMOSFET unit cell comprising the first conductivity type second source region within the first conductivity type first source region.

FIG. 1B illustrates an embodiment of a cross sectional structure of one or more unit cells of the DMOSFET, comprising one or more unit cells of an integrated Schottky diode, each DMOSFET unit cell comprising the first conductivity type second source region within the first conductivity type first source region. The DMOSFET (shown in FIG. 1B) is a n-type planar gate SiC DMOSFET. The DMOSFET shown in FIG. 1B operates in a similar way to FIG. 1a. In addition to FIG. 1a, the DMOSFET (shown in FIG. 1B) comprises a metal region 128 (e.g. a Schottky metal region 128) in direct contact with the N− drift layer 104 and bridges adjacent P-well regions 106 (i.e. bridges the adjacent unit cells) of the one or more P-well regions 106. The DMOSFET comprises each second N+ source region 110 between the respective silicide SiC trench 112 and the respective P-well region 106.

Figure 1C:
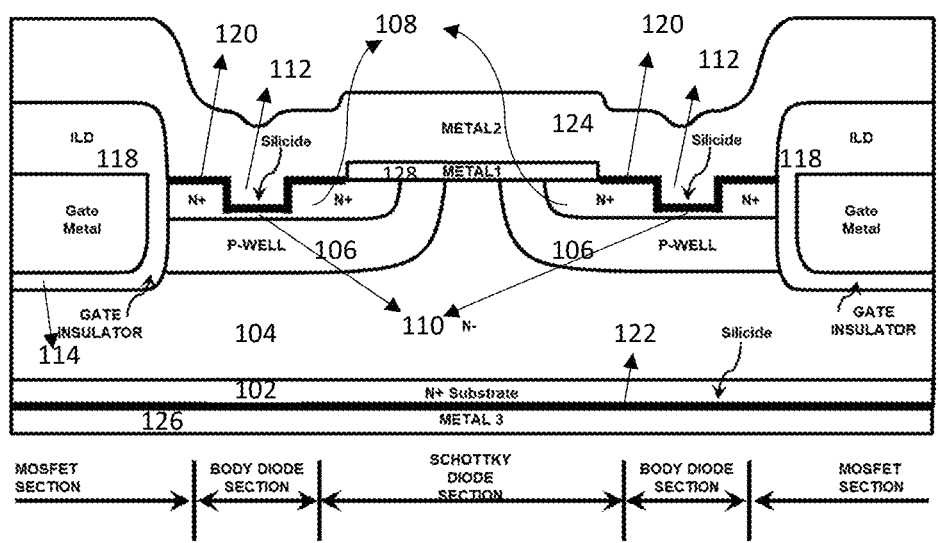
FIG. 1c illustrates an embodiment of a cross sectional structure of one or more unit cells of a trench gate MOSFET, comprising one or more unit cells of the integrated Schottky diode, each MOSFET unit cell comprising the first conductivity type second source region within the first conductivity type first source region.

FIG. 1c illustrates an embodiment of a cross sectional structure of one or more unit cells of a trench gate MOSFET, comprising one or more unit cells of the integrated Schottky diode, each MOSFET unit cell comprising the first conductivity type second source region within the first conductivity type first source region. The trench gate MOSFET shown in FIG. 1c is a n-type trench gate SiC MOSFET. In an embodiment, the trench gate MOSFET is a p-type trench gate SiC MOSFET. The trench gate MOSFET shown in FIG. 1c operates in a similar way to planar gate DMOSFET shown in FIG. 1a and FIG. 1B. The main difference between the trench gate MOSFET and the planar gate DMOSFET is that the trench gate MOSFET comprises one or more trench gate structures instead of one or more planar gate structures. The one or more trench gate structures of the trench gate MOSFET comprises sidewalls that are exposing to the first N+ source region 108 and the one or more P-well regions 106. The bottom of the one or more trench gate structures is in vicinity of the bottom of the one or more P-well regions 106. In an embodiment, the bottom of the one or more trench gate structures is adjusted appropriately depending on electrical properties of the MOSFET device. Each trench gate structure of the trench gate MOSFET comprises the gate insulator 114 as liner along the sidewall and the bottom of the respective trench gate structure. Each trench gate structure comprises the polysilicon layer 116 that fills the gate-insulator lined trenches and serves as gate electrode. The trench gate MOSFET further comprises the interlayer dielectric (ILD) 118 over each polysilicon layer 116 to open short circuitry between the first pad metal 124 (e.g. the source metal) and the gate electrode.

Figure 2A:
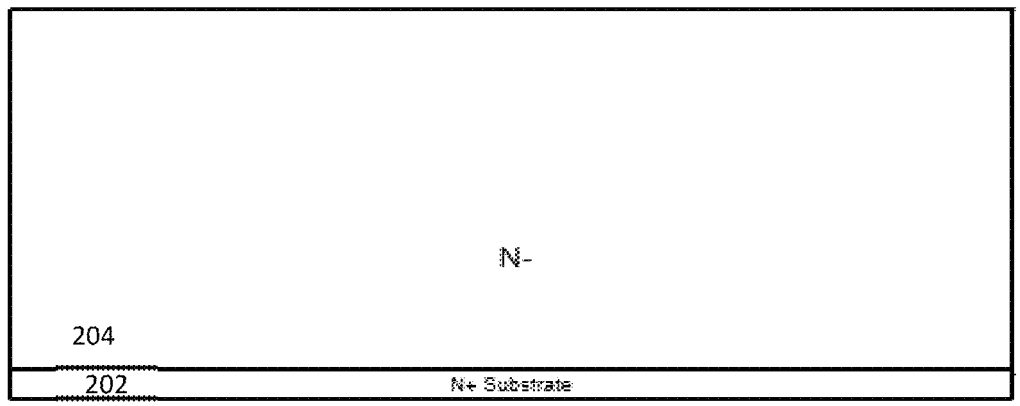
Figure 2B:
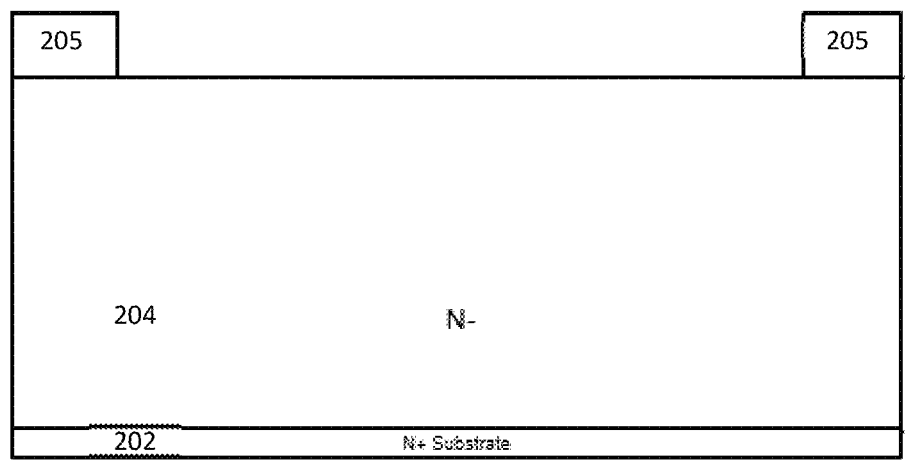
Figure 2C:
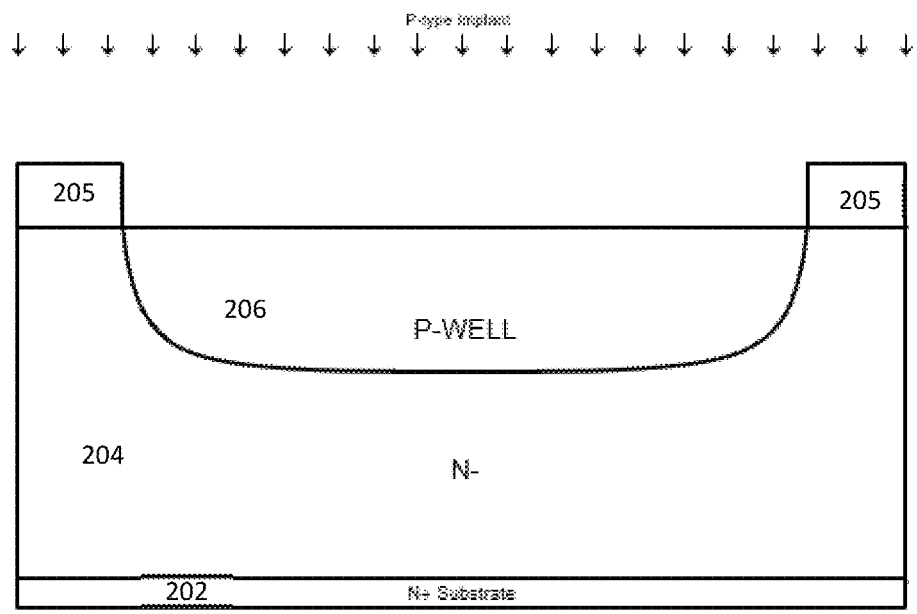
Figure 2D:
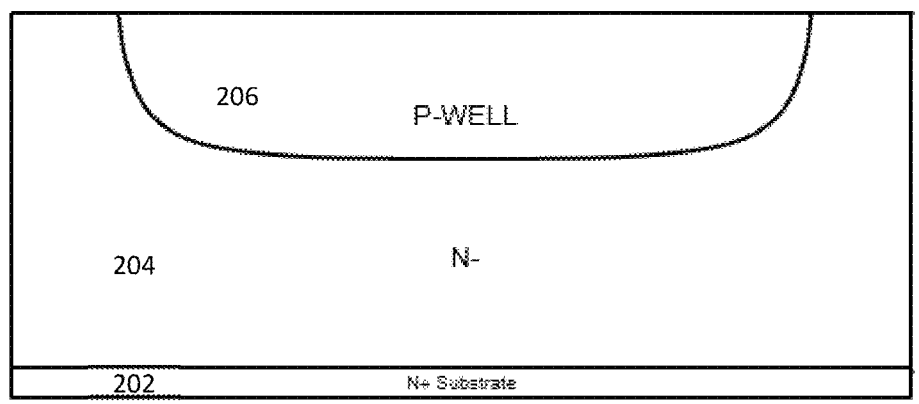
Figure 2E:
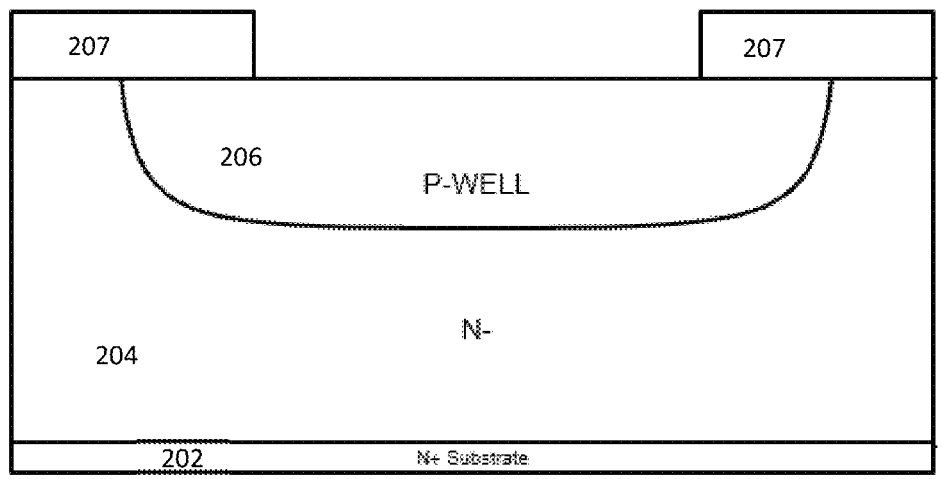
Figure 2F:
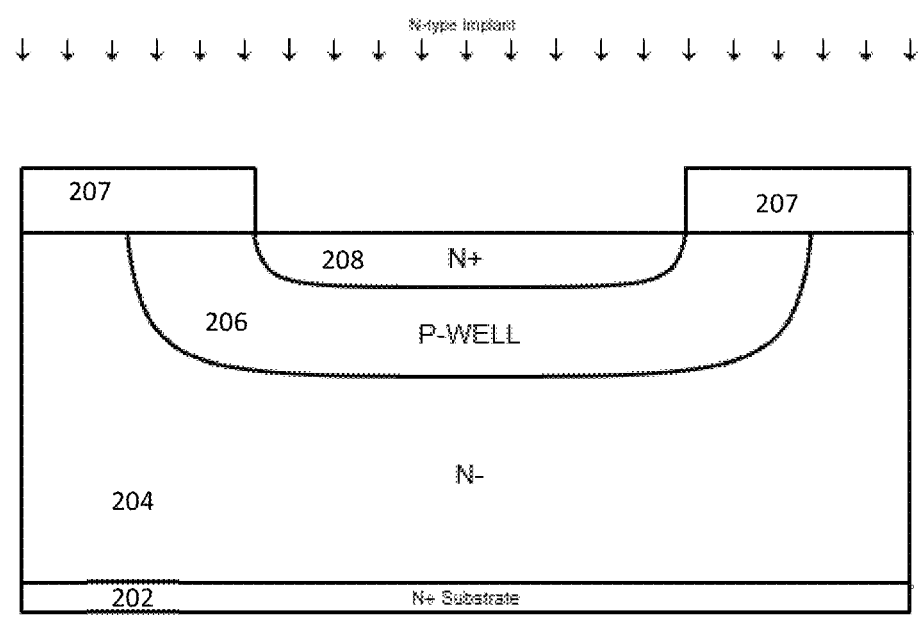
Figure 2G:
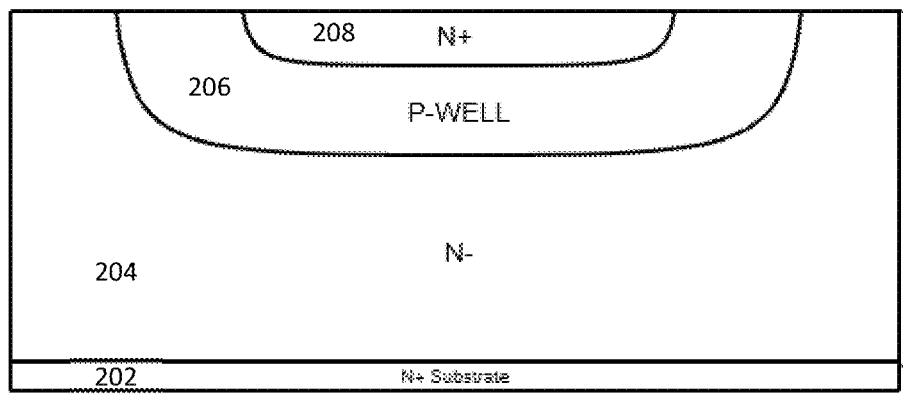
Figure 2H:
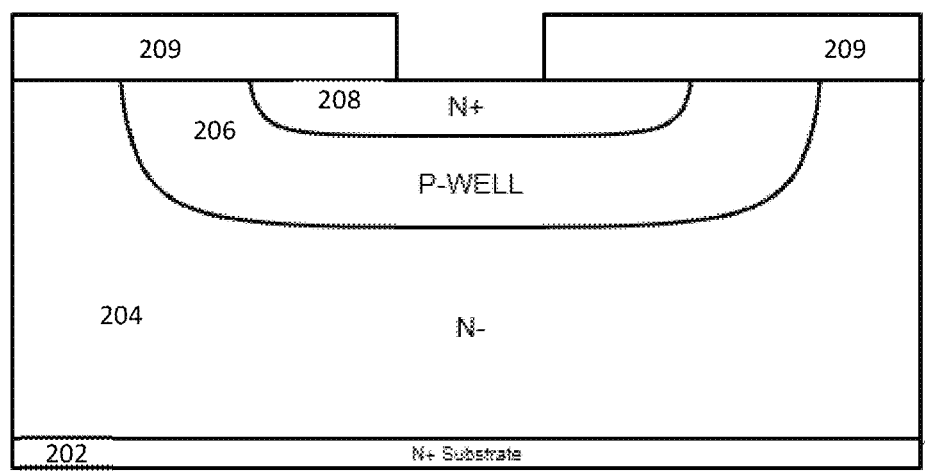
Figure 2I:
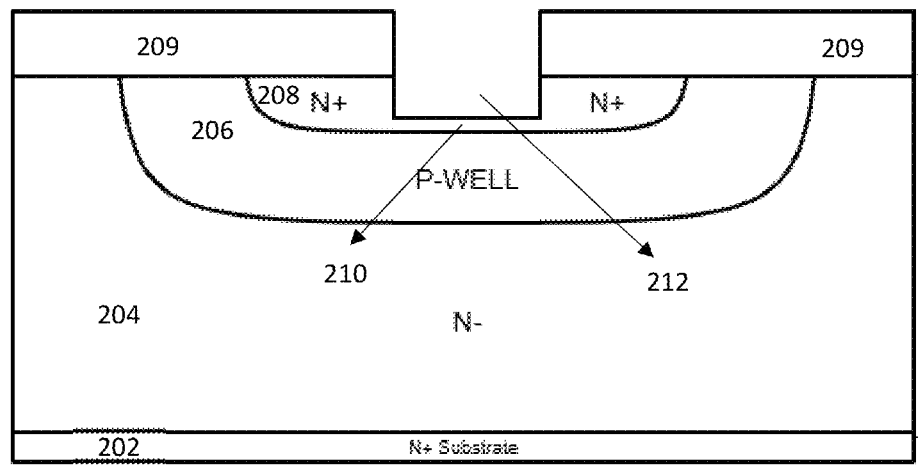
Figure 2J:
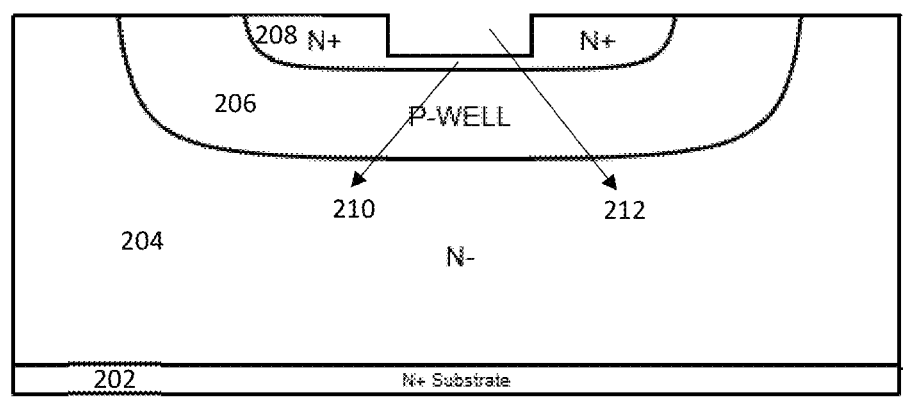
Figure 2K:
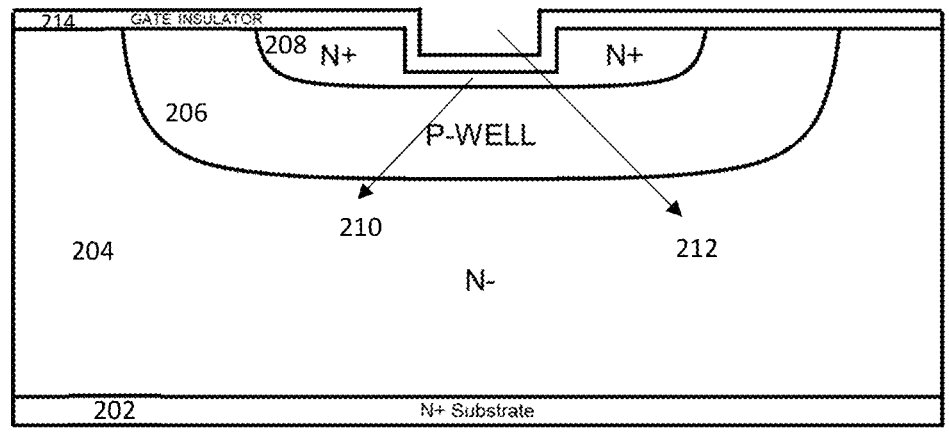
Figure 2L:
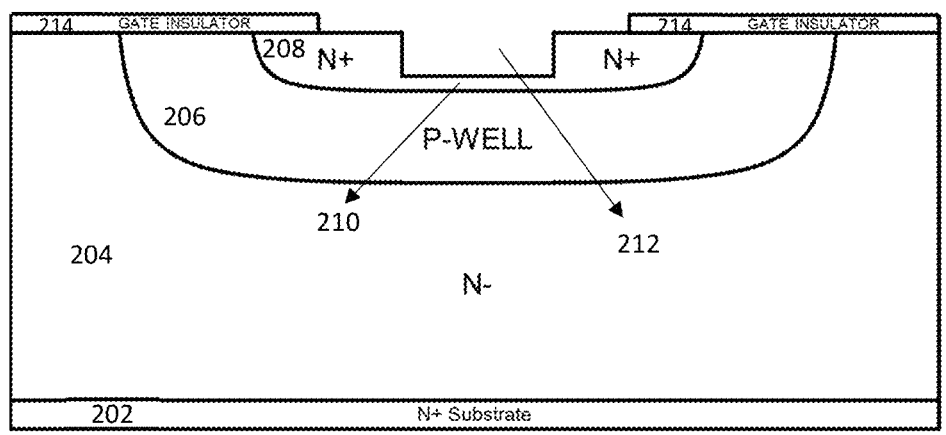
Figure 2M:
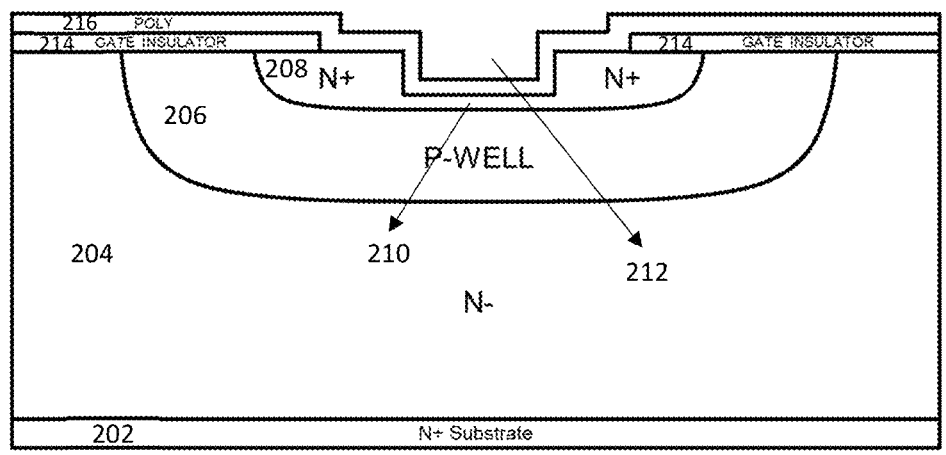
Figure 2N:
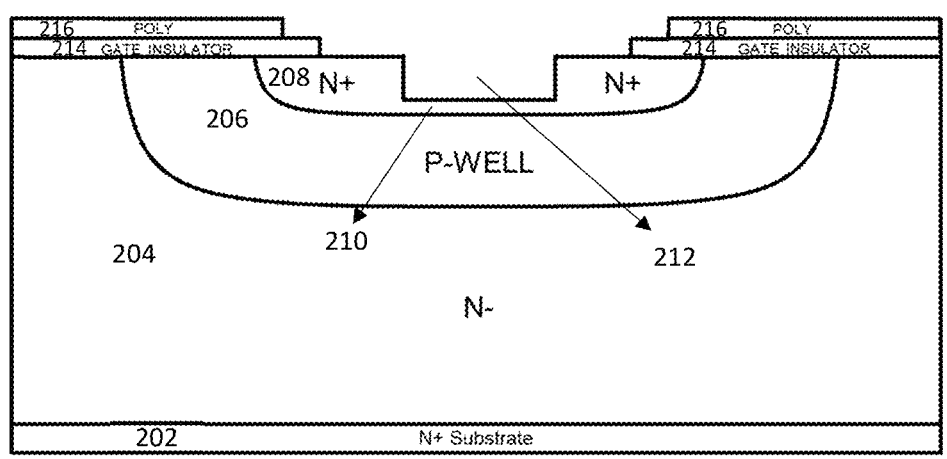
Figure 2O:
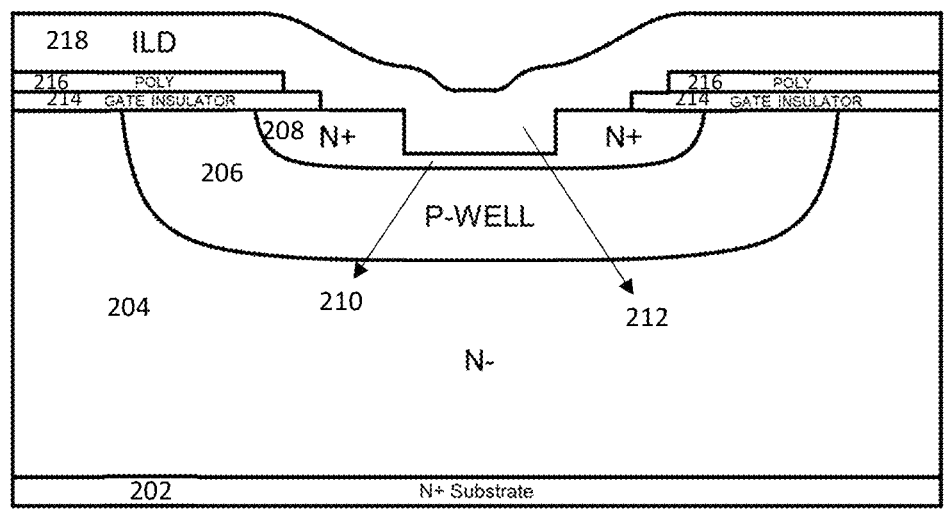
Figure 2P:
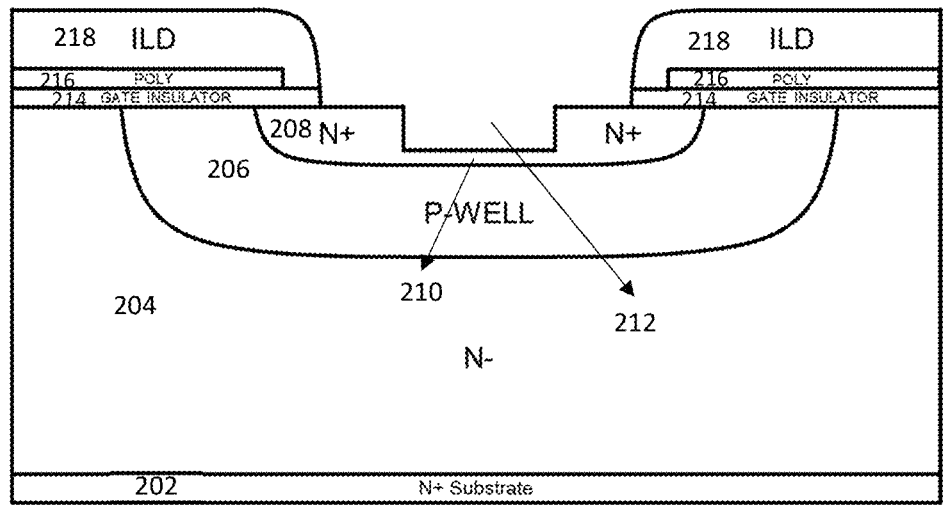
Figure 2Q:
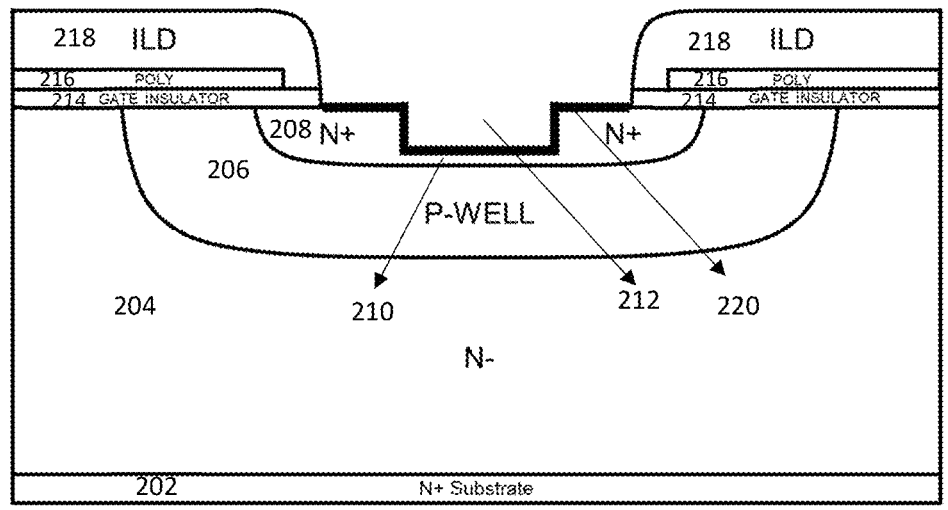
Figure 2R:
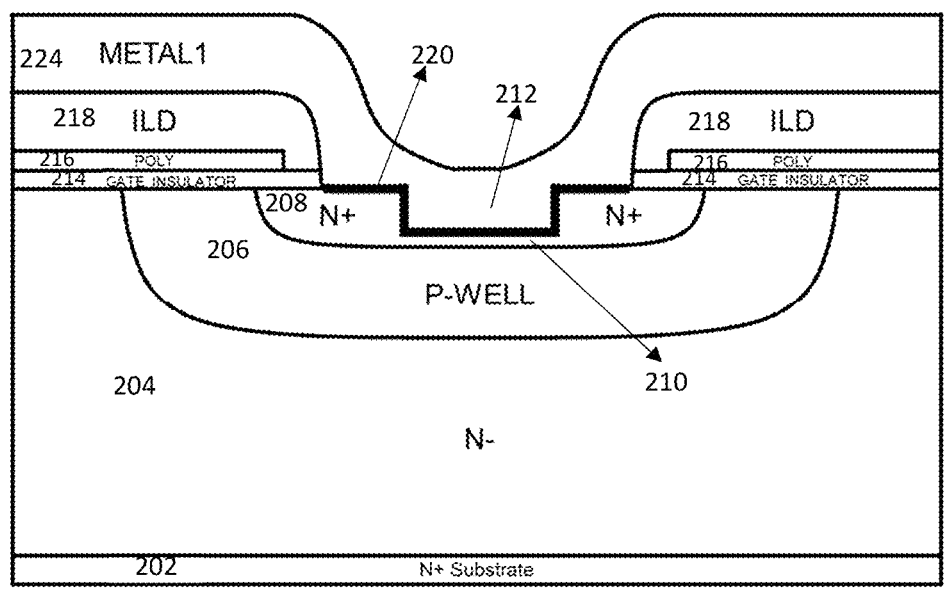
Figure 2S:
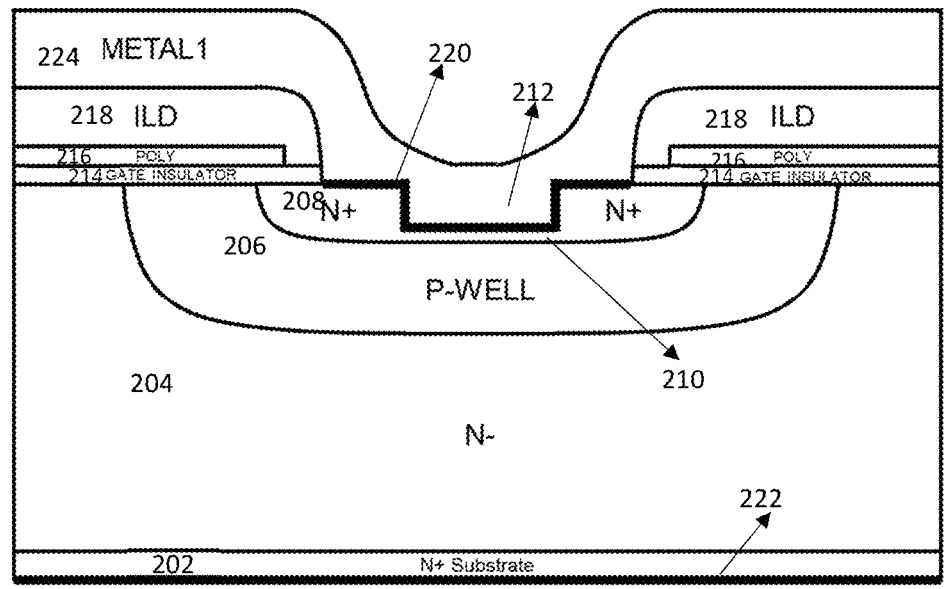
Figure 2T:
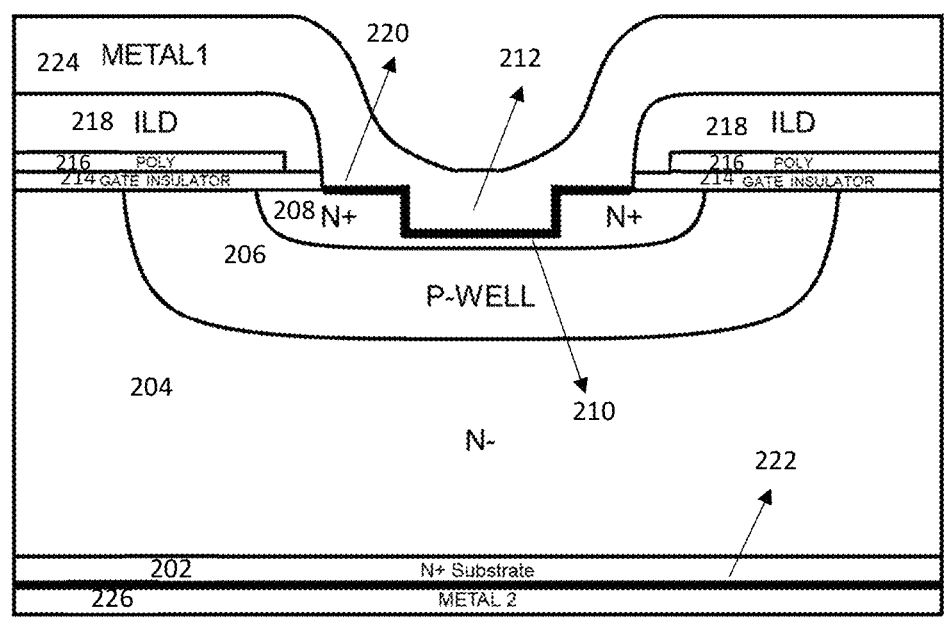

FIGS. 2a-2t illustrate an embodiment of a process of manufacturing the DMOSFET structure shown in FIG. 1a. The process of manufacturing the DMOSFET structure (shown in FIG. 1a) comprises preparing a Silicon Carbide (SiC) substrate having a N+ substrate 202 and a N− drift layer 204 as shown in FIG. 2a. The N− drift layer 204 of the SiC substrate is epi-grown and prepared such that a doping concentration and a thickness of the N− drift layer 204 are selected primarily based on blocking voltage and forward conduction loss. The N+ substrate 202 is highly conductive when compared to the N− drift layer 204 and the N+ substrate 202 is in direct contact with the N-drift layer 204. A first patterned hard mask layer 205 is formed on top of the SiC substrate as shown in FIG. 2b. The first patterned hard mask layer 205 is thick enough for completely blocking high energy impurities during implantation. In an embodiment, the first patterned hard mask layer 205 is a hard mask of at least one of oxide, nitride and a polysilicon.

A first p-type ion implantation is formed in FIG. 2c through the first patterned hard mask layer 205 to form a p-well region 206. In an embodiment, the first p-type ion implantation is performed with one or more p-type impurities (e.g. aluminum, boron, etc.). In another embodiment, first p-type ion implantation may comprise a screen oxide layer. The first patterned hard mask layer 205 is then removed, after the first p-type ion implantation, by at least one of dry etching and wet etching process as shown in FIG. 2d. A second patterned hard mask layer 207 is then formed on the top of the SiC substrate as shown in FIG. 2e for subsequent ion implantation. The second patterned hard mask layer 207 is a photoresist based material and thick enough for preventing any unwanted high energy impurity particles penetrating the second patterned hard mask layer 207. A first n-type ion implantation is performed through the second patterned hard mask layer 207 to form a first N+ source region 208 within the p-well region 206 as shown in FIG. 2f. In an embodiment, the first n-type ion implantation is performed with one or more n-type impurities (e.g. nitrogen, phosphorous etc.). The second patterned hard mask layer 207 is then removed after the first n-type ion implantation by at least one of dry etching and wet etching process as shown in FIG. 2g.

A third patterned hard mask layer 209 is formed on top of the SiC substrate as shown in FIG. 2h. An etching is performed onto the SiC substrate through the third patterned hard mask layer 209. The SiC etching performed consumes a central portion of each first N+ source region 208 and forms a recessed SiC trench region 212 per each first N+ source region 208. The recessed SiC trench region 212 does not fully penetrates the first N+ source region 208 in vertical direction and leaves a remnant of the first N+ source region 208 to form a second N+ source region 210 under the bottom of the recessed SiC trench region 212 as shown in FIG. 2i. The SiC etching is controlled accurately and precisely considering plausible loss of the Sic Substrate, during at least one of thermal activation annealing, sacrificial oxidation and dry oxidation for one of a gate oxide formation and a silicide layer formation for ohmic contacts, when target SiC trench depth is reached. The target SiC trench depth leaves at least one of a target thickness and a target doping concentration of the second N+ source region 210 under the bottom of the recessed SiC trench region 212. In an embodiment, the target thickness ranges from 1 nm to 1 µm. In another embodiment, the target doping concentration ranges from $10^{15}$ cm$^{-3}$ to $10^{21}$ cm$^{-3}$.

The third patterned hard mask layer 209 is then removed as shown in FIG. 2j by at least one of a dry etching and a wet etching process once the target SiC trench depth is reached. The SiC substrate undergoes thermal activation annealing with a carbon-based protection coating at a predefined temperature. In an embodiment, the predefined temperature is 1700-degree Celsius. The SiC substrate then may undergo an additional ion implantation for forming a current spreading layer to improve on-state resistance. Ion implantations (e.g. the first p-type implantation, the first n-type impanation, the second p-type implantation, edge termination implantation, current spreading layer implantation etc.) undergone by the SiC substrate is performed prior to the thermal activation annealing step. The carbon-based protection coating is then removed from the SiC substrate once the thermal activation annealing is completed. The SiC substrate then undergoes a sacrificial oxide growth and subsequently the sacrificial oxide removal. An active region of the DMOSFET is then patterned by forming and patterning field oxide layer on the SiC substrate.

A gate insulator 214 is then deposited/formed on top of the SiC substrate as shown in FIG. 2k. The gate insulator 214 is then patterned as shown in FIG. 2l. A polysilicon layer 216 is then formed on top of the SiC substrate as shown in FIG. 2m. The polysilicon layer 216 is then patterned as shown in FIG. 2n. The contacts for the polysilicon layer are kept open before pad metal deposition for forming a gate pad region and the gate bus region(s). An interlayer dielectric (ILD) 218 is then formed on top of the SiC substrate as shown in FIG. 2o. The interlayer dielectric (ILD) 218 is then patterned for exposing the portions of the SiC substrate via the openings of the ILD 218 as shown in FIG. 2p. A first silicide layer 220 is then formed on the exposed portions on top of the SiC substrate for forming a first Ohmic contact (e.g. a source terminal contact) as shown in FIG. 2q. In an embodiment, the first silicide layer 220 is a nickel-based silicide layer. In another embodiment, the nickel-based silicide is formed by Nickel deposition on the top of the SiC substrate, thermal activation annealing of the deposited Nickel for silicide formation, and removal of any un-reacted Nickel from the SiC substrate. A first pad metal 224 is then formed on top of the first silicide layer 220 of the SiC substrate as shown in FIG. 2r.

A second silicide layer 222 is then formed on bottom of the SiC substrate for forming a second Ohmic contact as shown in FIG. 2s. In an embodiment, the second silicide layer 222 is then formed on back of the SiC substrate for forming the second Ohmic contact (e.g. a drain terminal contact). In an embodiment, the second silicide layer 222 is also the nickel-based silicide layer. A second pad metal 226 is then formed on bottom of the second silicide layer 222 of the SiC substrate as shown in FIG. 2t. In an embodiment, the second pad metal formation is performed by at least one of e-beam and sputtering.

A fourth patterned hard mask layer 211 is then formed on the SiC substrate once the first Ohmic contact and the second Ohmic contact are formed on topside and bottom side/back side of the SiC substrate respectively. The fourth patterned hard mask layer 211 is formed for selectively removing the exposed portions of the ILD layer 218 and forming a metal region (i.e. a Schottky metal region 228) shown in FIG. 1B. The fourth patterned hard mask layer 211 is used for both etching the portion of the ILD layer 218 and lifting off the Schottky metal region 228 when Schottky metal is deposited. The Schottky metal region 228 is in direct contact with the N− drift layer 204 and bridge two adjacent P-well regions 206 (i.e. bridges the adjacent unit cells). The Schottky metal region 228 is then annealed with a pre-defined thermal budget for forming a Schottky metal contact between the Schottky metal region 228 and the portion of the N− drift layer 204 exposed at the top surface of the SiC substrate. In an embodiment, the predefined thermal budget ranges from 55° C. to 1100° C. In FIG. 1b the first pad metal and the second pad metal formation are performed once the Schottky metal region 228 formation is completed.

Figure 3A:
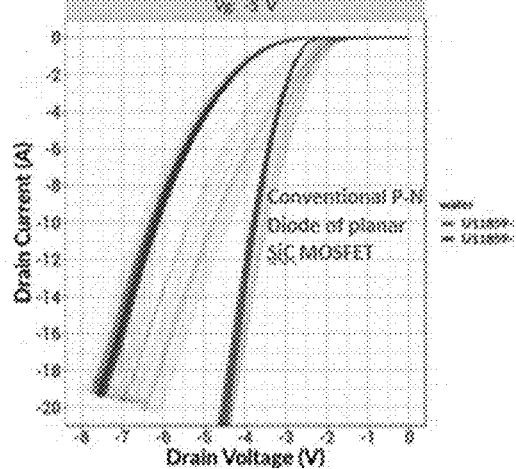
FIG. 3a illustrates an embodiment of a voltage-current characteristic of a SiC DMOSFET with conventional p-n junction vs the SiC DMOSFET with deactivated p-n junction (i.e. the first conductivity type second source region).

FIG. 3a illustrates an embodiment of a voltage-current characteristic of a SiC DMOSFET with conventional p-n junction vs the SiC DMOSFET with deactivated p-n junction (i.e. the first conductivity type second source region). The voltage-current characteristic shown in FIG. 3a depicts that at a drain current −16 A, the SiC planar DMOSFET with conventional p-n junction shows a voltage drop of ≈−4 v and the SiC DMOSFET with deactivated p-n junction (i.e. the first conductivity type second source region) shows a voltage drop of ≈−7V. The SiC DMOSFET comprise the p-n junction with increased built-in potential and increased differential on-resistance when the SiC DMOSFET comprises the first conductivity type second source region 110.

Figure 3B:
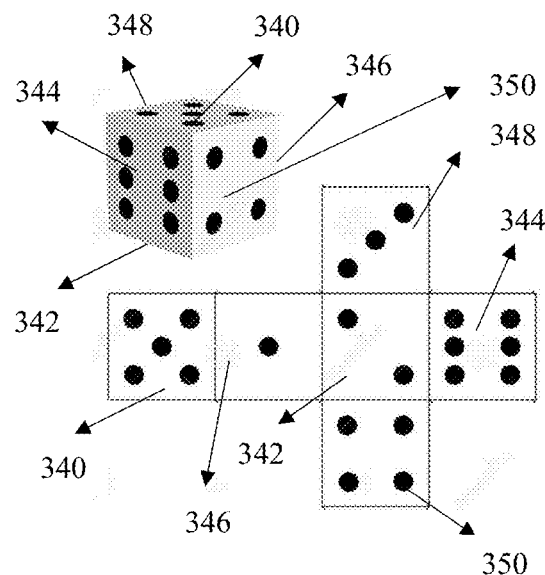
FIG. 3b is a perspective view that illustrates an embodiment of sides of the DMOSFET in relation to a dice.

FIG. 3b is a perspective view that illustrates an embodiment of sides of the DMOSFET in relation to a dice. The DMOSFET may comprise a structure similar to the dice as shown in FIG. 3b. The DMOSFET comprises at least the topside 340, the bottom side 342, a front side 344, the back side 346, a left side 348 and a right side 350. The topside 340 of the DMOSFET refers to an outer side/top of the DMOSFET. The topside 340 comprises the source terminal. The bottom side 342 refers to a base of the DMOSFET. In an embodiment, the bottom side 342 of the DMOSFET comprises the drain terminal. The back side 346 of the DMOSFET is hidden in the FIG. 3b and is located in adjacent to the topside 340 and the bottom side 342. In another embodiment, the back side 346 of the DMOSFET comprises the drain terminal. The front side 344 and the right side 350 of the DMOSFET is visible in the FIG. 3b, whereas the left side 348 and the back side 346 of the DMOSFET is hidden in the FIG. 3b.

Figure 3C:
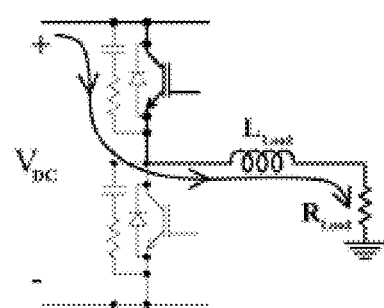
FIGS. 3c-3d illustrate current flow paths through the MOSFET and through an intrinsic anti-parallel diode region in an H-bridge circuit respectively.
Figure 3D:
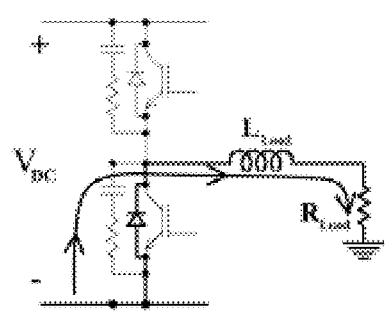

FIGS. 3c-3d shows the operation of the anti-parallel diode in a half-bridge inverter feeding an inductive load. The left picture (i.e. FIG. 3c) shows the state when the upper switch feeds the inductor. However, when that switch turns off, inductor's current continues its path through the anti-parallel diode of the bottom switch (right picture i.e. FIG. 3d)." [source: Re: Why are diodes connected anti-parallel across the MOSFET or IGBT in Inverter Module? Heydari, Gholamali, published on Research gate, Jul. 25, 2013].

Figure 4A:
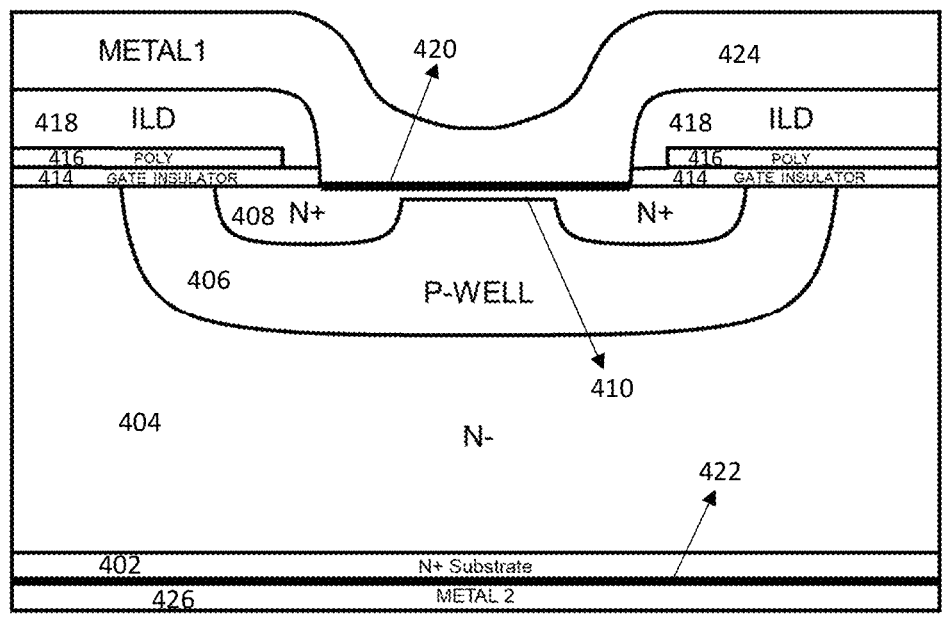
FIG. 4a illustrates an embodiment of a cross sectional structure of a unit cell of a double-implantation metal oxide semiconductor field-effect transistor (DMOSFET) comprising a first conductivity type second source region within a first conductivity type first source region.

FIG. 4a illustrates an embodiment of a cross sectional structure of a unit cell of a double-implantation metal oxide semiconductor field-effect transistor (DMOSFET) comprising a first conductivity type second source region within a first conductivity type first source region. The DMOSFET (shown in FIG. 4a) is a n-type planar gate DMOSFET. In an embodiment, the DMOSFET is a p-type planar gate DMOSFET. In another embodiment, the DMOSFET is one of a n-type trench gate DMOSFET and a p-type trench gate DMOSFET. The DMOSFET (shown in FIG. 4a) comprises a Silicon Carbide (SiC) substrate. The SiC substrate comprises a N+ substrate 402 and a N− drift layer 404. The DMOSFET also comprises a P-well region 406, a first N+ source region 408 (i.e. the first conductivity type first source region) and a second N+ source region 410 (i.e. the first conductivity type second source region). The first N+ source region 408 is formed within the P-well region 406. The second N+ source region 410 is formed within the first N+ source region 408 by performing a n-type implantation with controlled dosage and energy level. In an embodiment, the second N+ source region 410 is a depletion region during third quadrant MOSFET operation. The second N+ source region 410 comprises a thickness and a doping concentration which is significantly less than a thickness and a doping concentration of the first N+ source region 408 respectively which enables the second N+ source region 410 to get depleted easily compared to the first N+ source region 408. In an embodiment, the second N+ source region 410 comprises the thickness ranging from 1% to 90% lower than the thickness of the first N+ source region 408. In another embodiment, the second N+ source region 410 comprises the doping concentration ranging from 1% to 90% lower than the doping concentration of the first N+ source region 408.

The DMOSFET also comprises a gate insulator 414, a polysilicon layer 416 and an interlayer dielectric (ILD) 418 on both sides of top surface of the SiC substrate. The DMOSFET further comprises a first silicide layer 420 on top of the SiC substrate and a second silicide layer 422 on bottom side/back side of the SiC substrate to form ohmic contacts for a source terminal and a drain terminal respectively. The DMOSFET further comprises a first pad metal 424 (e.g. a source metal) and a second pad metal 426 (e.g. a drain metal) on top of the first silicide layer 420 and bottom of the second silicide layer 422 respectively.

During third quadrant operation of the DMOSFET (i.e. when the source terminal is positively biased with respect to the drain terminal), an intrinsic p-n junction between the second N+ source region 410 and the p-well region 406 is reverse biased as electric potential of the first pad metal 424 is low when compared to electric potential of the second pad metal 426. The second N+ source region 410 starts depleting during the third quadrant operation. The first pad metal 424 (e.g. the source metal) is directly short circuited (i.e. connected) with the P-well region 406, when the second N+ source region 410 is completely depleted. The second N+ source region 410 enables one or more body diode regions of the DMOSFET to have an increased turn-on voltage and the one or more body diode regions turn on only when the second N+ source region 410 is completely depleted. The increased turn-on voltage is due to intrinsic bandgap of the SiC. As the complete depletion of the second N+ source region 410 depends on at least one of a thickness and a doping concentration of the second N+ source region 410, the turn-on voltage of the one or more body diode regions also depends on the thickness and the doping concentration of the second N+ source region 410. The turn-on voltage of the one or more body diode regions is tuned by controlling/adjusting the thickness and the doping concentration of the second N+ source region 410 to a target thickness and a target doping concentration respectively. In an embodiment, the target thickness ranges from 1 nm to 1 μm. In another embodiment, the target doping concentration ranges from $10^{15}$ cm$^{-3}$ to $10^{21}$ cm$^{-3}$. The target thickness and the target doping concentration of the second N+ source region 410 is achieved by monitoring and controlling the dosage and the energy level of the n-type implantation.

Figure 4B:
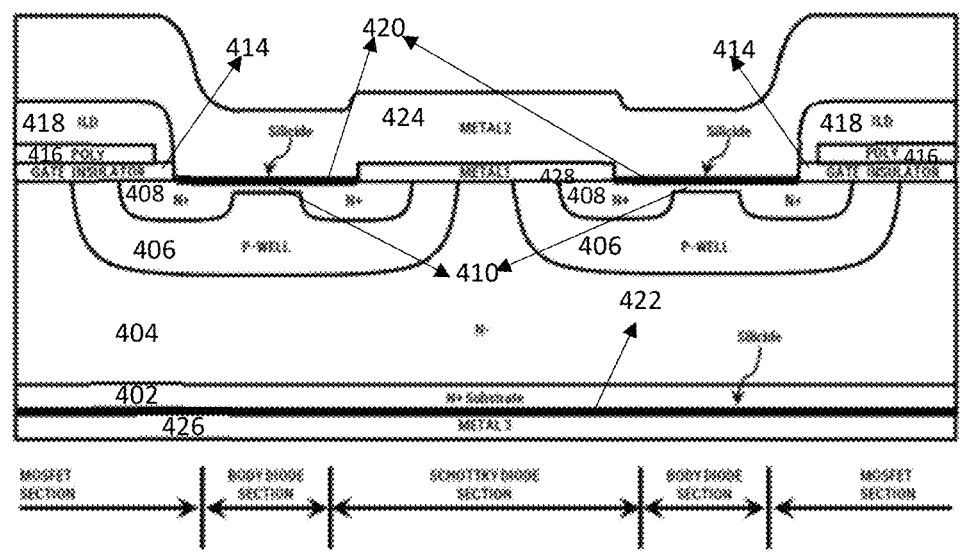
FIG. 4b illustrates an embodiment of a cross sectional structure of one or more unit cells of the DMOSFET, comprising one or more unit cells of an integrated Schottky diode, each DMOSFET unit cell comprising the first conductivity type second source region within the first conductivity type first source region.

FIG. 4b illustrates an embodiment of a cross sectional structure of one or more unit cells of the DMOSFET, comprising one or more unit cells of an integrated Schottky diode, each DMOSFET unit cell comprising the first conductivity type second source region within the first conductivity type first source region. The DMOSFET (shown in FIG. 4b) is a n-type planar gate DMOSFET. The DMOSFET shown in FIG. 4b operates in a similar way to FIG. 4a. In addition to FIG. 4a, the DMOSFET (shown in FIG. 4b) comprises a metal region (i.e. a Schottky metal region 428) and one or more P-well regions 406. The Schottky metal region 428 is in direct contact with the N− drift layer 404 and bridges the adjacent P-well regions 406 (i.e. bridges the adjacent unit cells) of the one or more P-well regions 406. The DMOSFET comprises each second N+ source region 410 between the first silicide layer 420 and the respective P-well region 406.

Figure 5A:
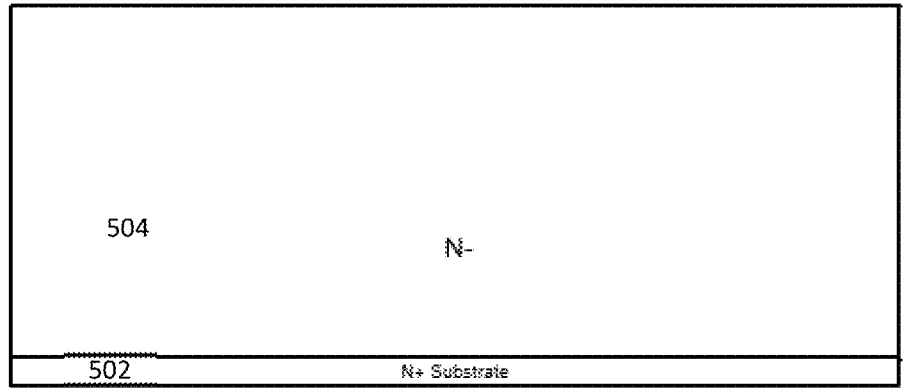
Figure 5B:
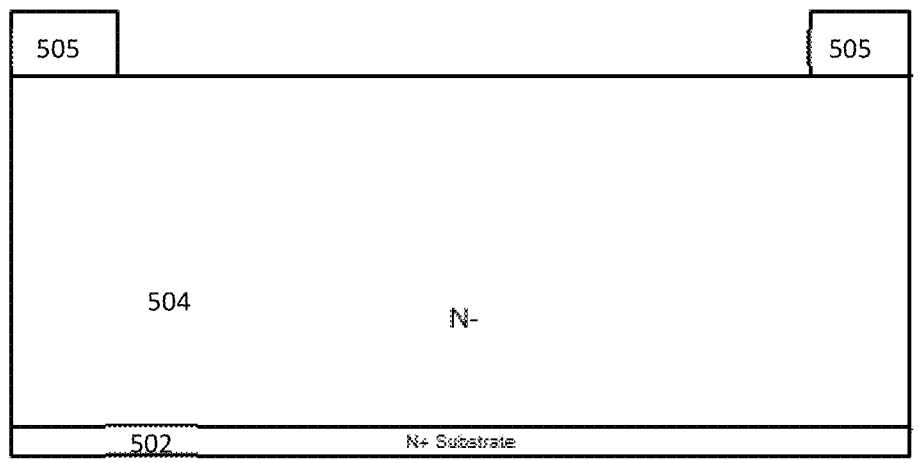
Figure 5C:
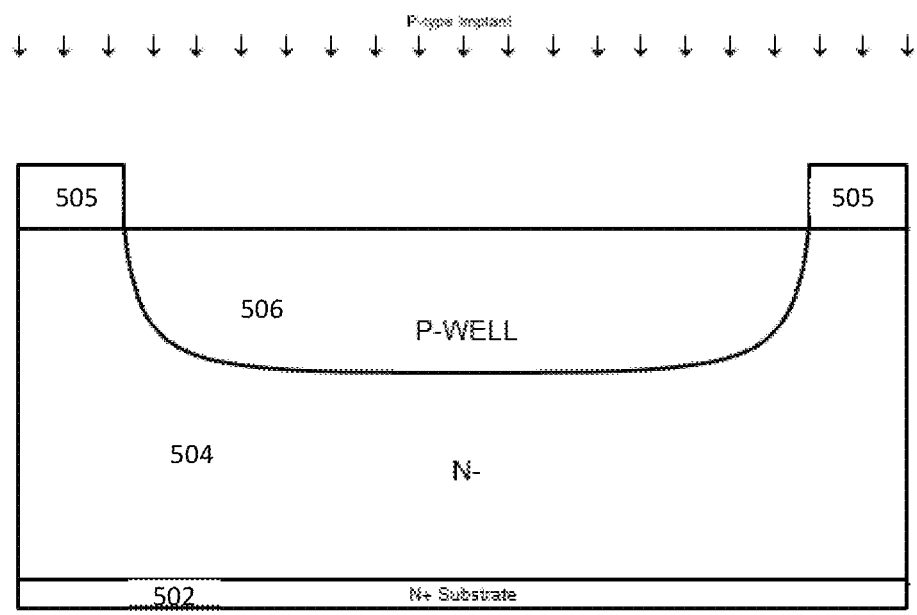
Figure 5D:
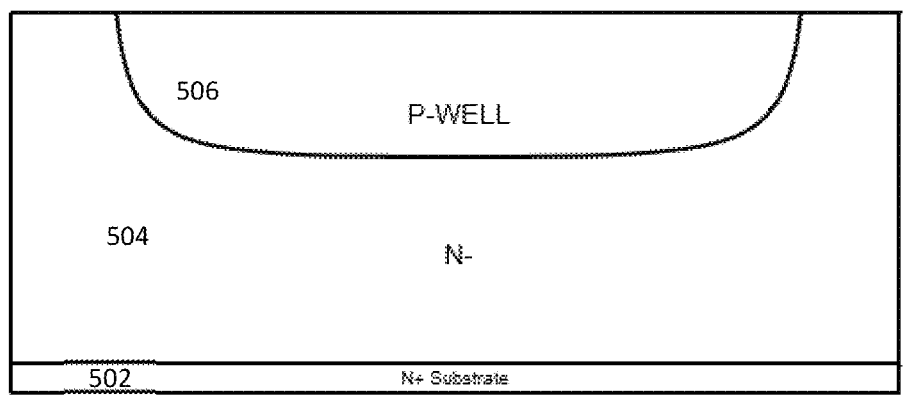
Figure 5E:
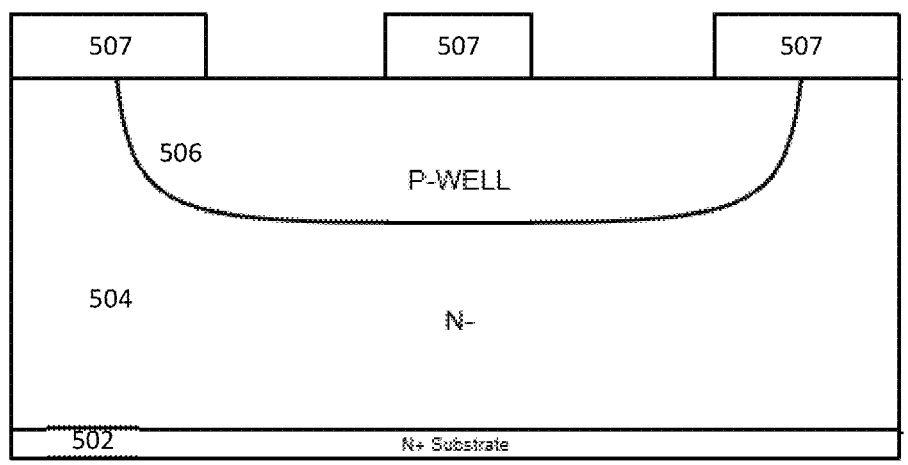
Figure 5F:
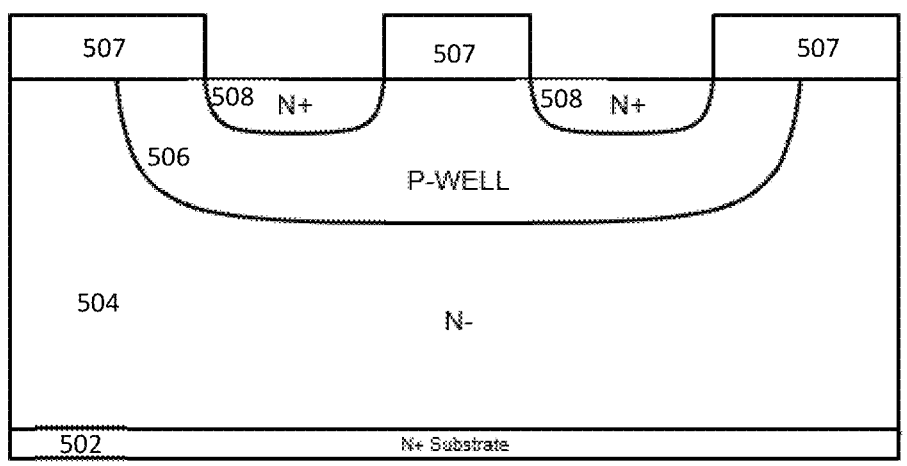
Figure 5G:
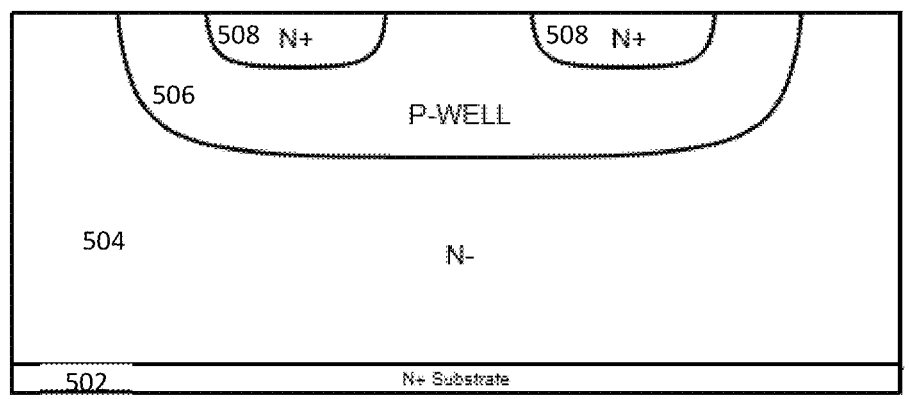
Figure 5H:
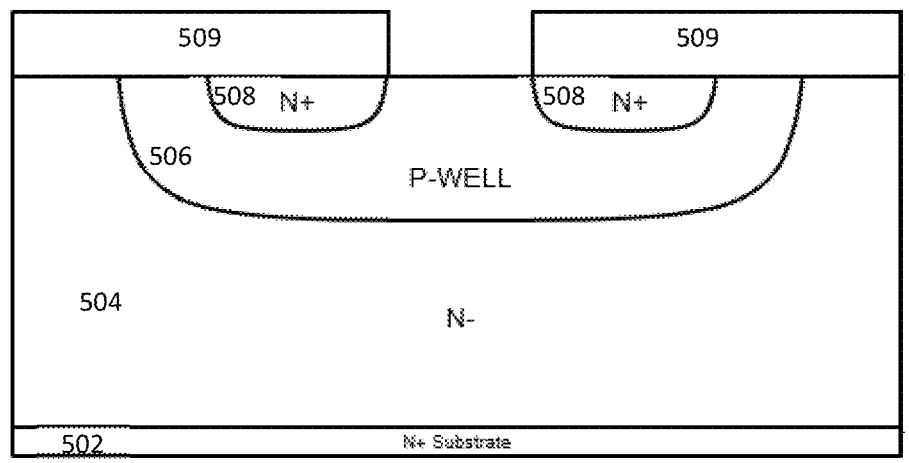
Figure 5I:
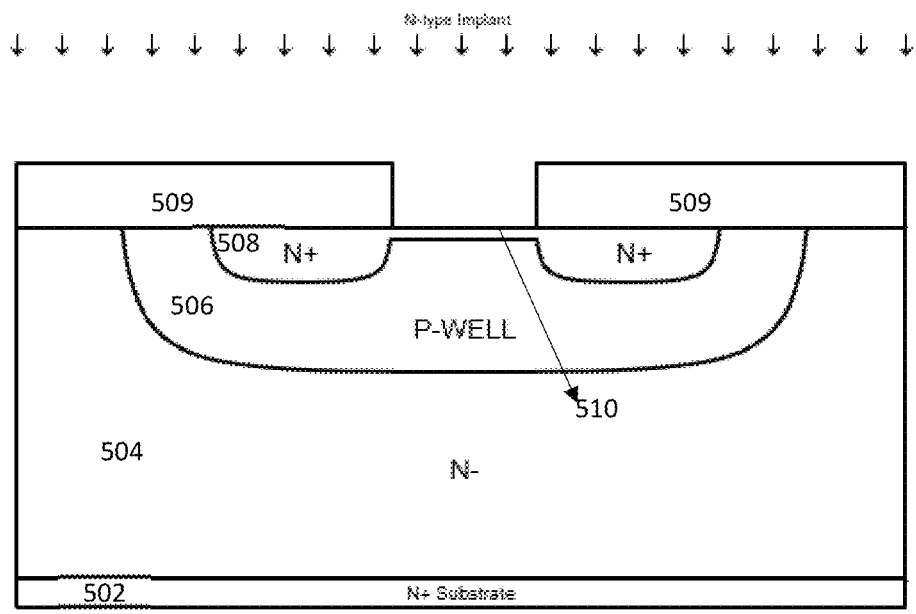
Figure 5J:
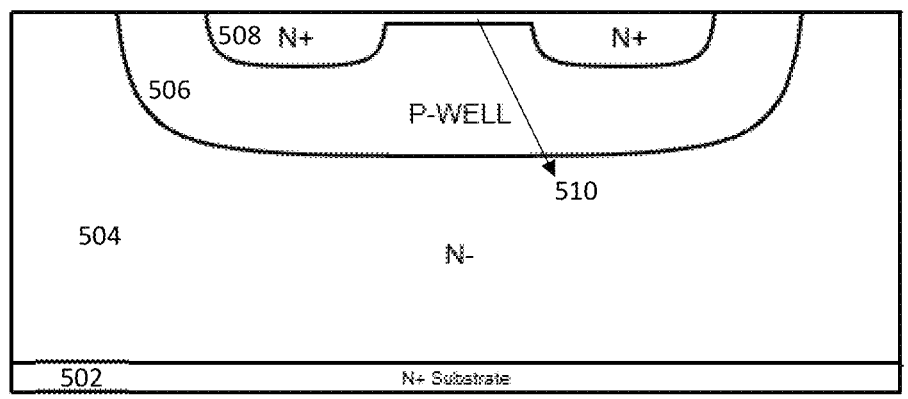
Figure 5K:
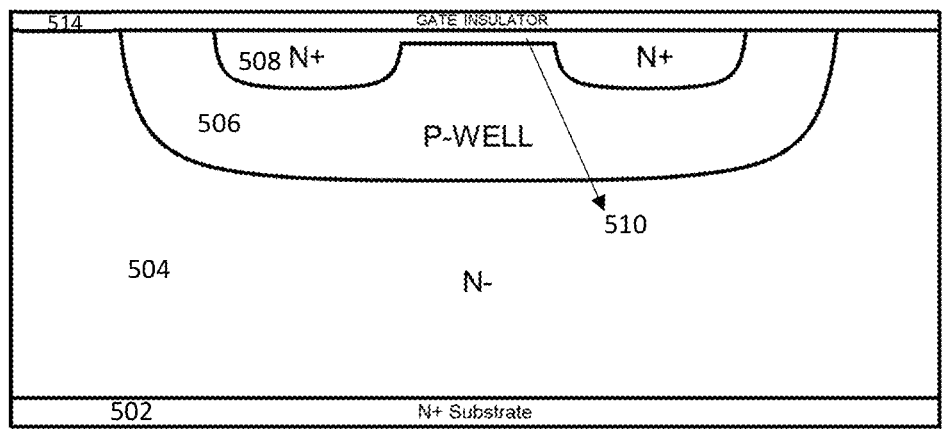
Figure 5L:
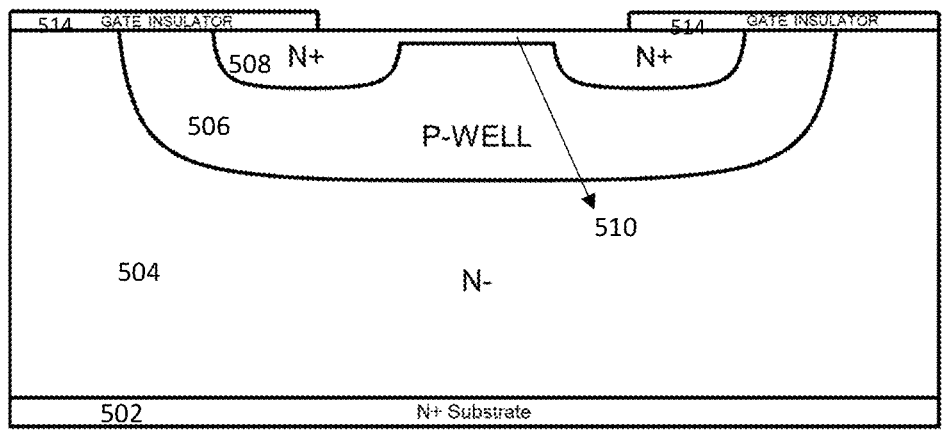
Figure 5M:
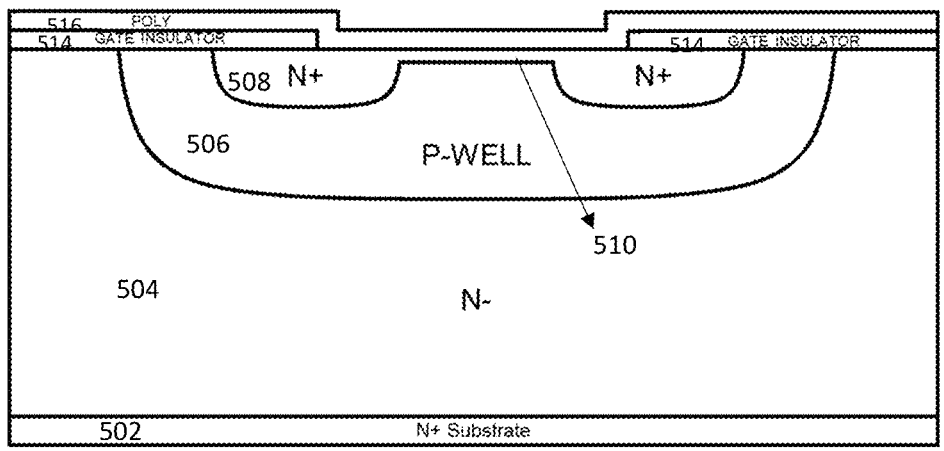
Figure 5N:
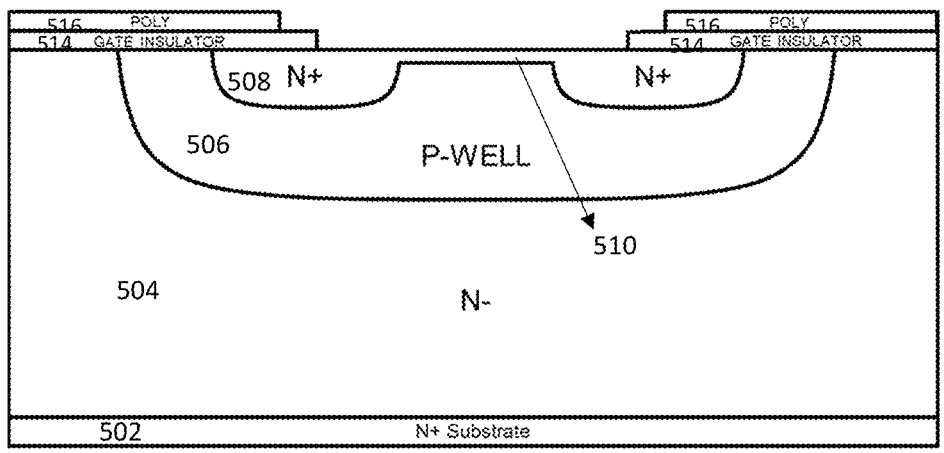
Figure 5O:
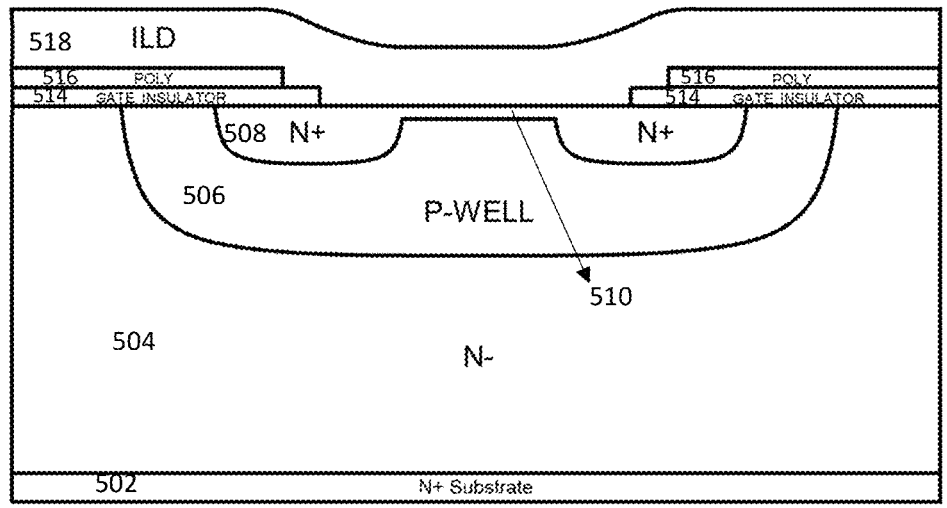
Figure 5P:
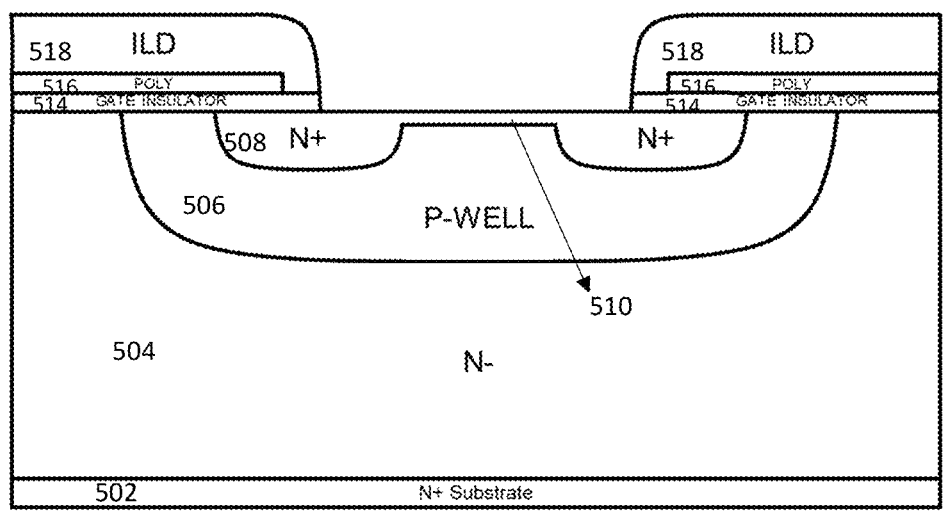
Figure 5Q:
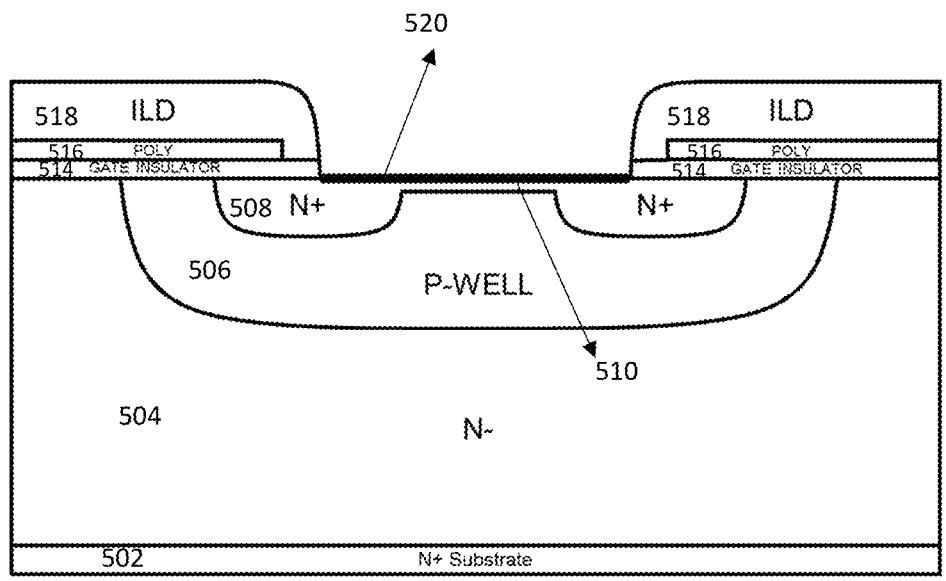
Figure 5R:
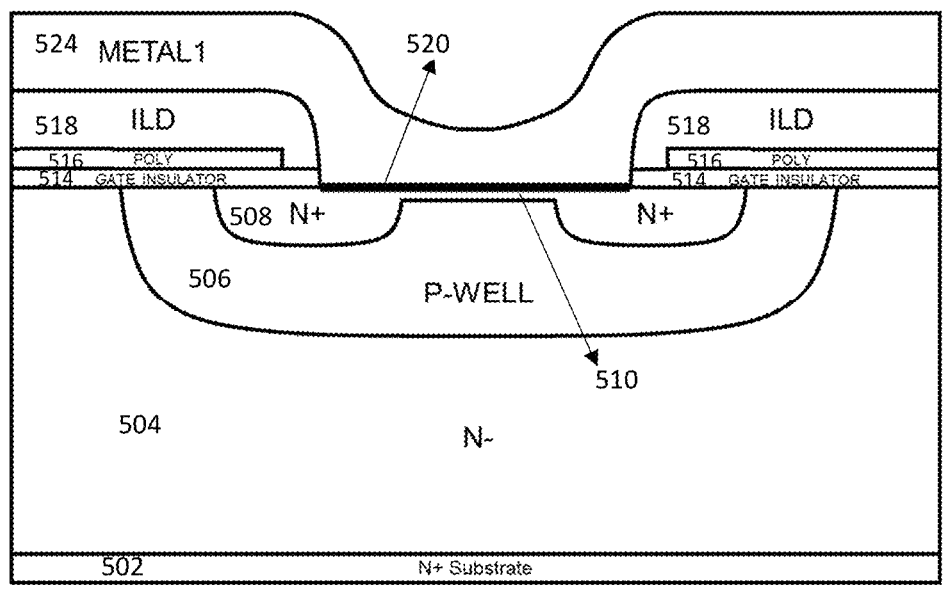
Figure 5S:
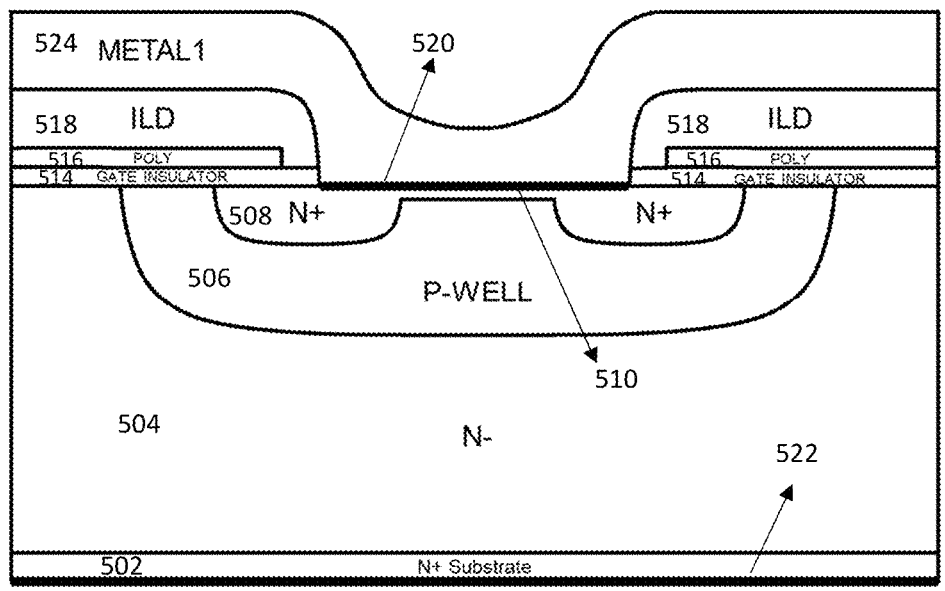
Figure 5T:
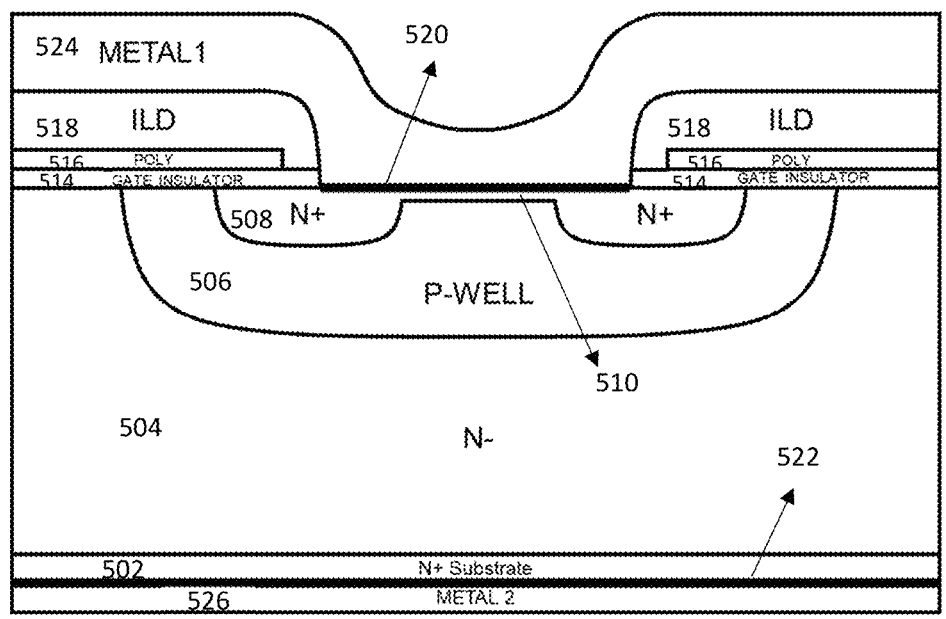

FIGS. 5a-5t illustrate an embodiment of a process of manufacturing the DMOSFET structure shown in FIG. 4a. The process of manufacturing the DMOSFET structure (shown in FIG. 5a) comprises preparing a Silicon Carbide (SiC) substrate having a N+ substrate 502 and a N− drift layer 504 as shown in FIG. 5a. The N− drift layer 504 of the SiC substrate is epi-grown and prepared such that a doping concentration and a thickness of the N− drift layer 504 are selected primarily based on blocking voltage and forward conduction loss. The N+ substrate 502 is highly conductive when compared to the N− drift layer 504 and the N+ substrate 502 is in direct contact with the N-drift layer 504. A first patterned hard mask layer 505 is formed on top of the SiC substrate as shown in FIG. 5b. The first patterned hard mask layer 505 is thick enough for completely blocking high energy impurities during implantation. In an embodiment, the first patterned hard mask layer 505 is a hard mask of at least one of oxide, nitride and a polysilicon.

A first p-type ion implantation is formed in FIG. 5c through the first patterned hard mask layer 505 to form a p-well region 506. In an embodiment, the first p-type ion implantation is performed with one or more p-type impurities (e.g. aluminum, boron, etc.). In another embodiment, first p-type ion implantation may comprise a screen oxide layer. The first patterned hard mask layer 505 is then removed, after the first p-type ion implantation, by at least one of dry etching process and wet etching process as shown in FIG. 5d. A second patterned hard mask layer 507 is then formed on the top of the SiC substrate as shown in FIG. 5e for subsequent ion implantation. The second patterned hard mask layer 507 is a photoresist based material and thick enough for preventing any unwanted high energy impurities particles penetrating the second patterned hard mask layer 507. A first n-type ion implantation is formed through the second patterned hard mask layer 507 to form a first N+ source region 508 (i.e. the first conductivity type first source region) within the p-well region 506 as shown in FIG. 5f. In an embodiment, the first n-type ion implantation is performed with one or more n-type impurities (e.g. nitrogen, phosphorous etc.). The second patterned hard mask layer 507 is then removed after the first n-type ion implantation by at least one of dry etching and wet etching process as shown in FIG. 5g.

A third patterned hard mask layer 509 is then formed on top of the SiC substrate as shown in FIG. 5h. A second n-type implantation is performed through the third patterned hard mask layer 509 to form a second N+ source region 510 within the first N+ source region 508 within each p-well region 506 as shown in FIG. 5i. The dosage and energy level of the second n-type implantation is controlled accurately and precisely to form the second N+ source region 510 having a target thickness and a target doping concentration. The target thickness may range from 1 nm to 1 µm. The target doping concentration may range from $10^{15}$ cm$^{-3}$ to $10^{21}$ cm$^{-3}$. In an embodiment, a doping concentration and a thickness of the second N+ source region 510 is less than a doping concentration and a thickness of the first N+ source region 508 respectively. In one embodiment, the doping concentration of the second N+ source region 510 is 1% to 90% lower than the doping concentration of the first N+ source region 508. In another embodiment, the thickness of the second N+ source region 510 is 1% to 90% lower than the thickness of the first N+ source region 508.

The third patterned hard mask layer 509 is then removed as shown in FIG. 5j by at least one of a dry etching and a wet etching process once the second N+ source region 510 having the target thickness and the target doping concentration is achieved. The SiC substrate undergoes thermal activation annealing with a carbon-based protection coating at a predefined temperature. In an embodiment, the predefined temperature for performing the thermal activation annealing is 1700-degree Celsius. The SiC substrate then may undergo an additional ion implantation for forming a current spreading layer to improve on-state resistance. Ion implantations (e.g. the first p-type implantation, the first n-type impanation, the second p-type implantation, edge termination implantation, current spreading layer implantation etc.) undergone by the SiC substrate is performed prior to the thermal activation annealing step. The carbon-based protection coating is then removed from the SiC substrate. The SiC substrate then undergoes a sacrificial oxide growth and subsequently the sacrificial oxide removal. An active region of the SiC DMOSFET is then patterned by forming and patterning field oxide layer on the SiC substrate.

A gate insulator 514 is then formed on top of the SiC substrate as shown in FIG. 5k. The gate insulator is then patterned as shown in FIG. 5l. A polysilicon layer 516 is then formed on top of the SiC substrate as shown in FIG. 5m. The polysilicon layer 516 is then patterned as shown in FIG. 5n. Contacts for the polysilicon layer is kept open for pad metal deposition for forming a gate pad region and one or more gate bus regions. An interlayer dielectric (ILD) 518 is then formed on top of the SiC substrate as shown in FIG. 5o. The interlayer dielectric (ILD) 518 is then patterned for exposing the portions of the SiC substrate via the openings of the ILD 518 as shown in FIG. 5p. A first silicide layer 520 is then formed on the exposed portions of top of the SiC substrate for forming a first Ohmic contact (e.g. a source terminal contact) as shown in FIG. 5q. In an embodiment, the first silicide layer 520 is a nickel-based silicide layer. In another embodiment, the nickel-based silicide is formed by Nickel deposition on the top of the SiC substrate, thermal activation annealing of the deposited Nickel for silicide formation, and removal of any un-reacted Nickel from the SiC substrate. A first pad metal 524 is then formed on top of the first silicide layer 520 of the SiC substrate as shown in FIG. 5r.

A second silicide layer 522 is then formed on bottom of the SiC substrate for forming a second Ohmic contact (e.g. a drain terminal contact) as shown in FIG. 5s. In an embodiment, the second silicide layer 522 is then formed on back of the SiC substrate for forming the second Ohmic contact (e.g. the drain terminal contact). In an embodiment, the second silicide layer 522 is also the nickel-based silicide layer. A second pad metal 526 is then formed on bottom of the second silicide layer 522 of the SiC substrate as shown in St. In an embodiment, the second pad metal formation is performed by at least one of e-beam and sputtering.

A fourth patterned hard mask layer 511 is then formed on the SiC substrate once the first Ohmic contact and the second Ohmic contact are formed on top and bottom side/back side of the SiC substrate respectively. The fourth patterned hard mask layer 511 is formed for selectively removing the exposed portions of the ILD layer 518 and forming a metal region 528 (i.e. a Schottky metal region 528) shown in FIG. 4b. The fourth patterned hard mask layer 511 is used for both etching the portion of the ILD layer 518 and lifting off the Schottky metal region 528 when Schottky metal is deposited. The Schottky metal region 528 is in direct contact with the top of the N− drift layer 504 and bridge two adjacent P-well regions 506 (e.g. bridges the adjacent unit cells). The Schottky metal region 528 is then annealed with a pre-defined thermal budget for forming a Schottky metal contact between the second Schottky metal region 528 and the portion of the N-drift layer 504 exposed at the top surface of the SiC substrate. In an embodiment, the predefined thermal budget ranges from 55° C. to 1100° C. In FIG. 4b the first pad metal and the second pad metal formation are performed once the Schottky metal region 528 formation is completed.

Figure 6A:
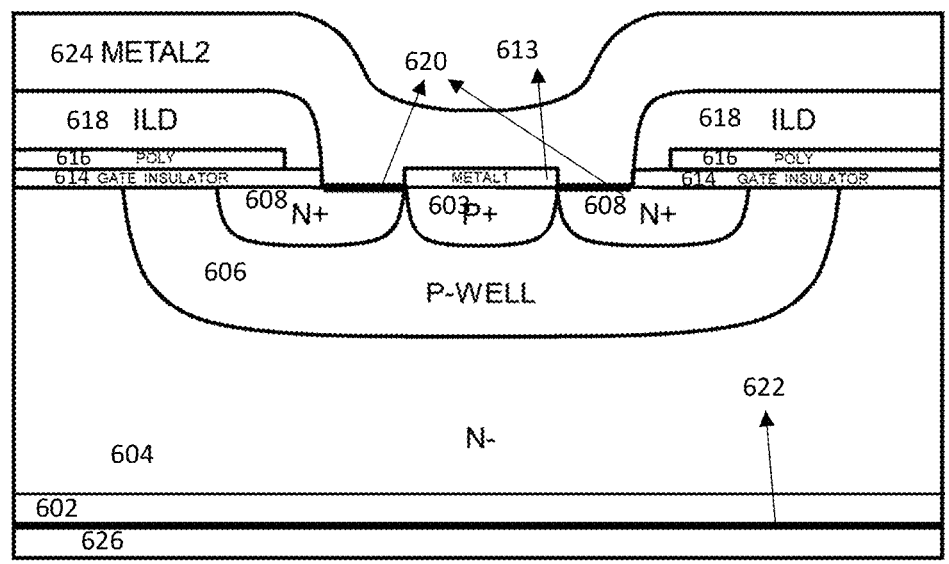
FIG. 6a illustrates an embodiment of a cross sectional structure of a unit cell of a double-implantation metal oxide semiconductor field effect transistor (DMOSFET) comprising a first metal region in direct contact with a second conductivity type well contact region.

FIG. 6a illustrates an embodiment of a cross sectional structure of a unit cell of a double-implantation metal oxide semiconductor field effect transistor (DMOSFET) comprising a first metal region in direct contact with a second conductivity type well contact region. The DMOSFET (shown in FIG. 6a) is a n-type planar gate SiC DMOSFET. In an embodiment, the DMOSFET is a p-type planar gate DMOSFET. In another embodiment, the DMOSFET is a p-type trench gate DMOSFET. In yet another embodiment, the DMOSFET is a n-type trench gate DMOSFET. The DMOSFET (shown in FIG. 6a) comprises a Silicon Carbide (SiC) substrate. The SiC substrate comprises a N+ substrate 602 and a N− drift layer 604. The DMOSFET also comprises a P-well region 606, a first N+ source region 608 and a P+ region 603 (i.e. the second conductivity type well contact region). The first N+ source region 608 is formed within the P-well region 606. The P+ region 603 (i.e. the second conductivity type well contact region) is formed within the P-well region 606 by performing a p-type implantation. The second conductivity type well contact region specifically refers to the P+ region 603. The first metal region 613 (e.g. a first Schottky metal region 613) is then formed in direct contact with the P+ region 603 to connect one or more Schottky diode regions in series with one or more body diode regions of the DMOSFET. The first Schottky metal region 613 comprises a target work function. In an embodiment, the target work function of the first Schottky metal region 613 ranges from 3.5 electron volts to 6 electron volts. The work function of the first Schottky metal region 613 and the series connection of the Schottky diode regions with the body diode regions allows the one or more body diode regions to turn-on only when significant number of carriers from the first Schottky metal region 613 is thermionically injected over Schottky barrier during third quadrant operation of the DMOSFET. Since the one or more Schottky diode regions are connected in series with the one or more body diode regions, the one or more Schottky diode regions consumes the voltage of the one or more body diode regions and the one or more Schottky diode regions turn on first before the one or more body diode regions. Any additional applied voltage that is greater than turn-on voltage of the one or more Schottky diode regions contributes to turn-on the one or more body diode regions. Due to the series connection of the one or more Schottky diode regions with the body diode regions, the body diode regions consume additional turn-on voltage compared to typical turn-on voltage. The one or more body diode regions get turn-on only when the first Schottky metal region 613 turn on with a forward voltage which corresponds at least to the barrier height of a first Schottky contact region for starting the on-set of the carrier injection over the Schottky barrier (i.e. when the first Schottky metal region 613 comprises the target work function). The forward voltage initiates the carrier injection to turn-on the Schottky diode regions. Any additional forward voltage that is greater than the turn-on voltage of the Schottky diode regions contributes to turn-on the body diode regions. The turn-on voltage of the body diode regions is tuned by at least one of controlling a Schottky barrier height and selecting a Schottky metal with an appropriate work function utilized in forming the first Schottky metal region 613. The turn-on voltage of the body diode regions is also tuned by adjusting thermal budget for annealing the first Schottky contact region once the first Schottky metal region 613 is formed on top of the SiC substrate. The predefined thermal budget may range from 55° C. to 1100° C. In an embodiment, the DMOSFET comprises a second metal region 628 (e.g. a second Schottky metal region 628) directly on top of the N− drift layer 604 and bridge adjacent P-well regions 606 of the one or more P-well regions 606 (i.e. bridges the adjacent unit cells) shown in FIG. 6b. The work function of the first Schottky metal region 613 is less than a work function of the second Schottky metal region 628.

Figure 6B:
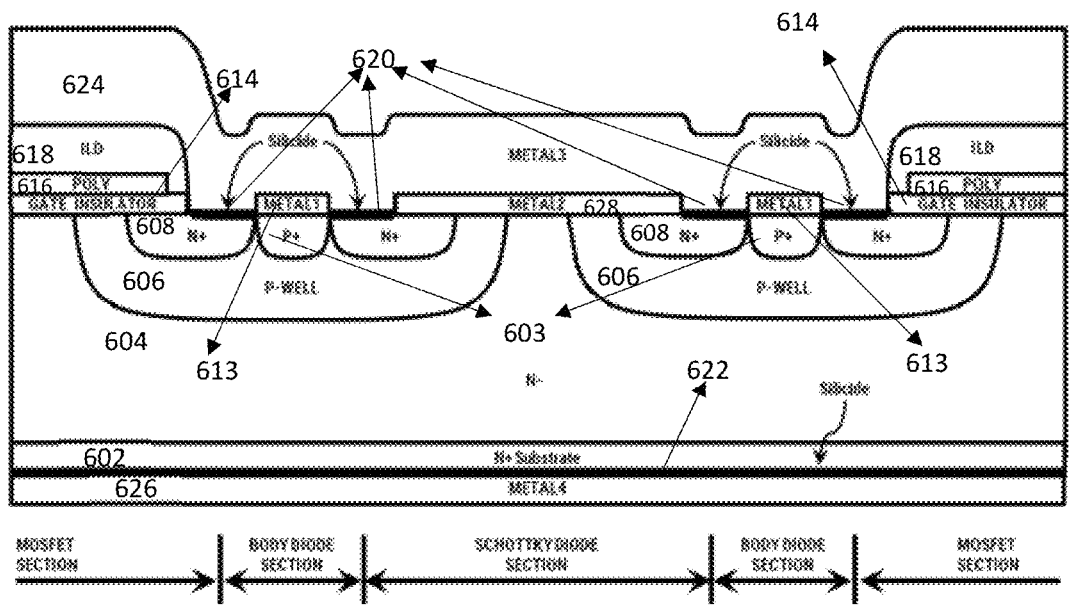
FIG. 6b illustrates an embodiment of a cross sectional structure of one or more unit cells of the DMOSFET, comprising one or more unit cells of an integrated Schottky diode, each DMOSFET unit cell comprising the first metal region in direct contact with the respective second conductivity type well contact region.

FIG. 6b illustrates an embodiment of a cross sectional structure of one or more unit cells of the DMOSFET, comprising one or more unit cells of an integrated Schottky diode, each DMOSFET unit cell comprising the first metal region in direct contact with the respective second conductivity type well contact region. The DMOSFET (shown in FIG. 6b) is a n-type planar gate SiC DMOSFET. The DMOSFET shown in FIG. 6b operates in a similar way to FIG. 6a. In addition to FIG. 6a, the DMOSFET (shown in FIG. 6b) comprises the second Schottky metal region 628 and one or more P-well regions 606. The second Schottky metal region 628 is in direct contact with the N− drift layer 604 and bridges the adjacent P-well regions 606 (i.e. the adjacent unit cells) of the one or more P-well regions 606. The work function of the first Schottky metal region 613 is less than the work function of the second Schottky metal region 628.

Figure 6C:
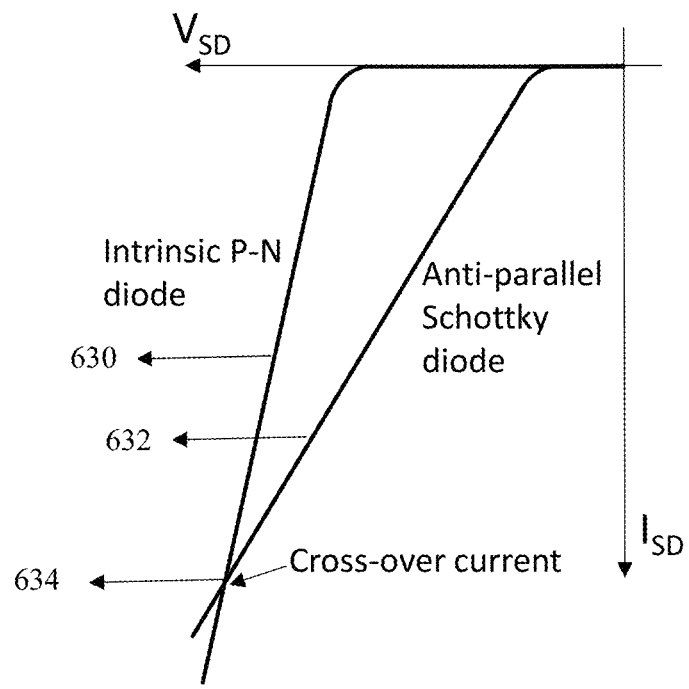
FIG. 6c illustrates an embodiment of a third quadrant current conduction through an intrinsic p-n junction diode region vs a Schottky diode region connected in parallel to the DMOSFET.

FIG. 6c illustrates an embodiment of a third quadrant current conduction through an intrinsic p-n junction diode region vs a Schottky diode region connected in parallel to DMOSFET. The third quadrant current of the body diode region is indicated as 630 in the FIG. 6c. The third quadrant current of the anti-parallel Schottky diode region is indicated as 632 in the FIG. 6c. At a certain point, the third quadrant current passing through the body diode region intersects with the third quadrant current passing through the Schottky diode region which is indicated as 634 in FIG. 6c. Above this point, the third quadrant current is bipolar in nature which results in performance and reliability issues.

Figure 6D:
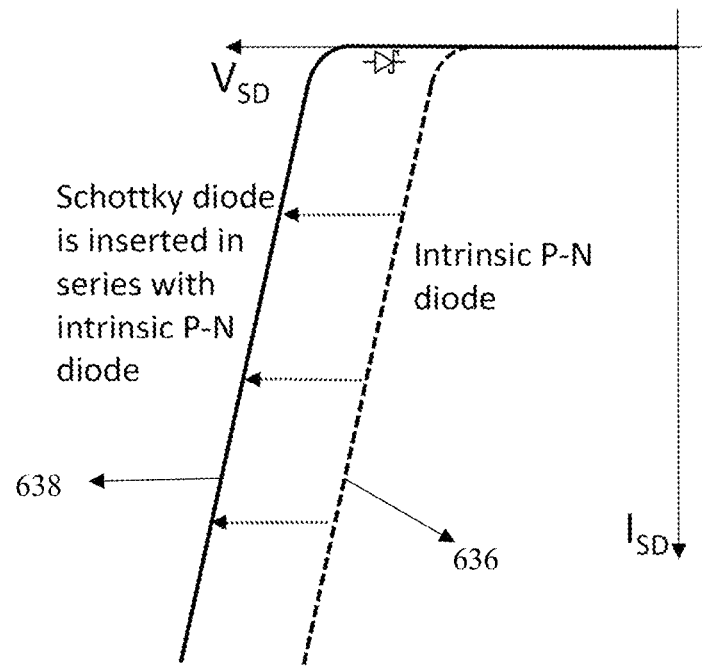
FIG. 6d illustrates an embodiment of a third quadrant current conduction through the DMOSFET after connecting the one or more Schottky diode regions in series with the one or more body diode regions of the DMOSFET.

FIG. 6d illustrates an embodiment of a third quadrant current conduction through the DMOSFET after connecting the one or more Schottky diode regions in series with the one or more body diode regions of the DMOSFET. The third quadrant current of the body diode region is indicated as 636 in the FIG. 6d. Due to the existence of the one or more Schottky diode regions in series connection with the one or more body diode regions, the magnitude of the third quadrant current is shifted by the additional current required for the one or more Schottky diode regions to turn-on first. The shift in the magnitude of the third quadrant current ((i.e.) the increased third quadrant current), after connecting the one or more Schottky diode regions in series with the one or more body diode regions, is indicated as 638 in FIG. 6d. It is evident from FIG. 6c and FIG. 6d, the magnitude of the third quadrant current is increased when the one or more Schottky Diode regions is connected in series with the one or more body diode regions of the DMOSFET.

Figure 7A:
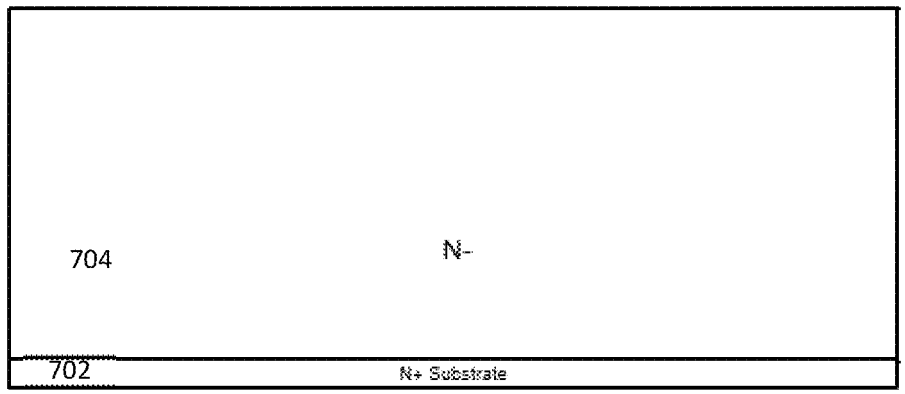
Figure 7B:
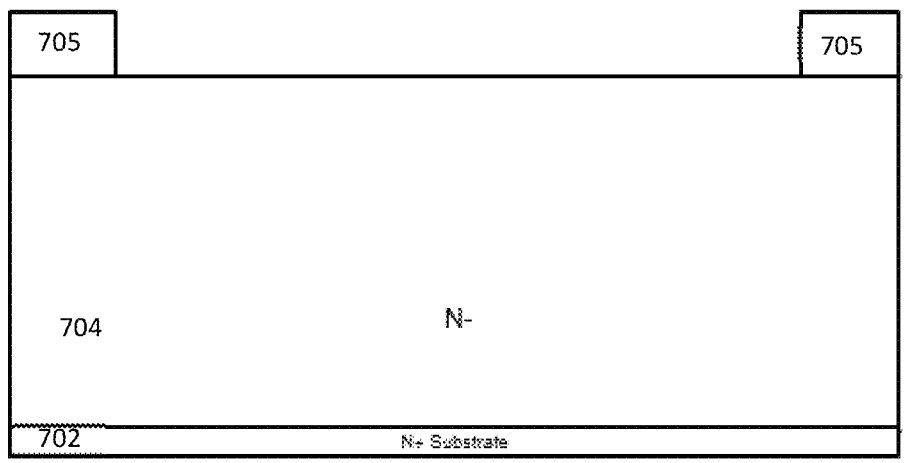
Figure 7C:
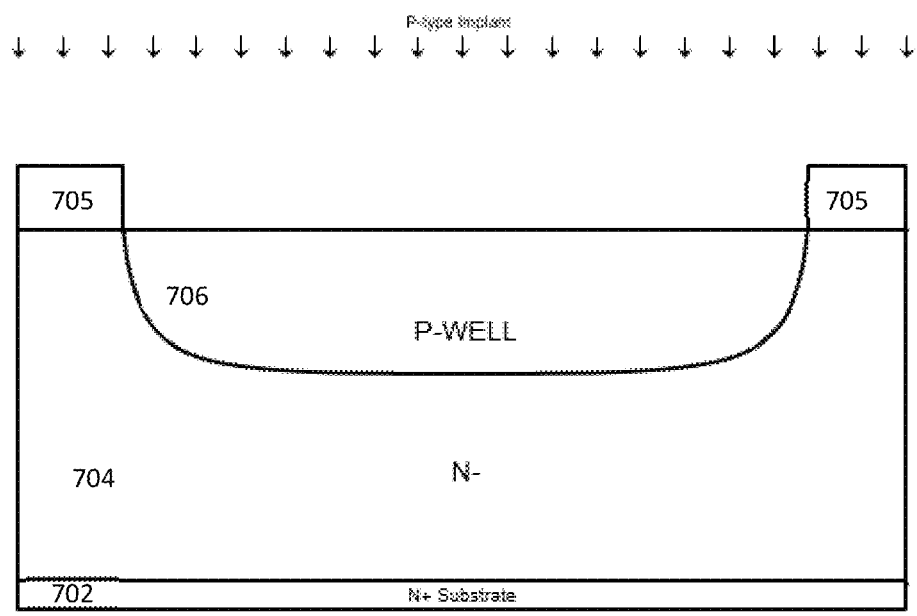
Figure 7D:
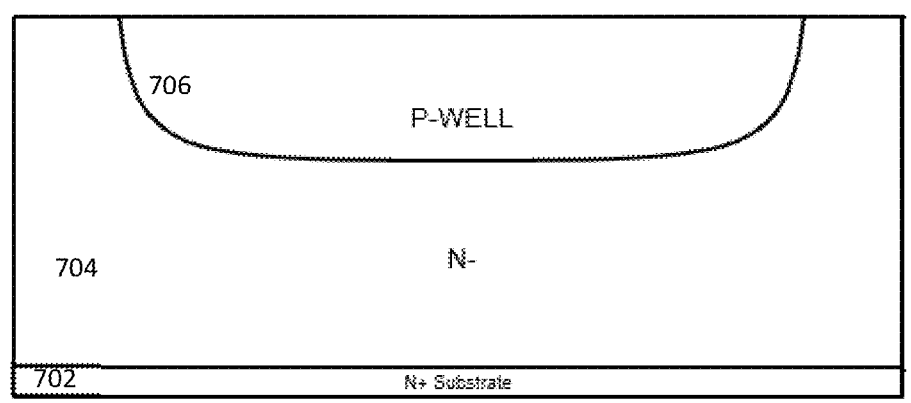
Figure 7E:
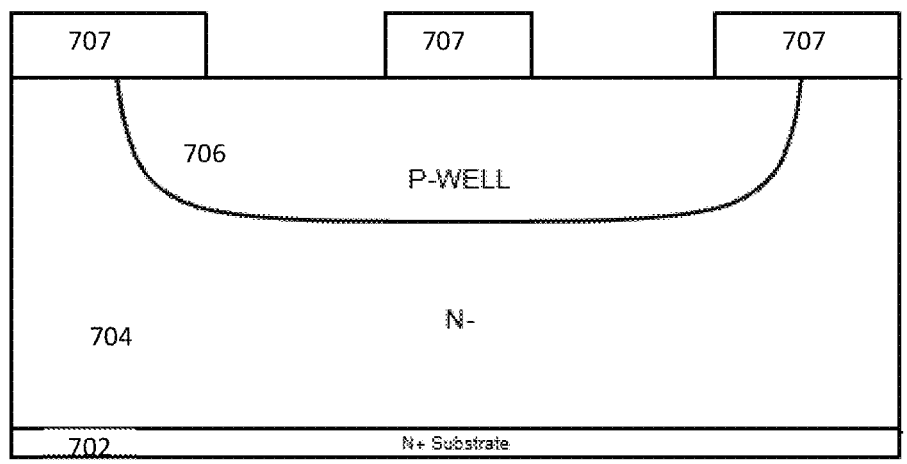
Figure 7F:
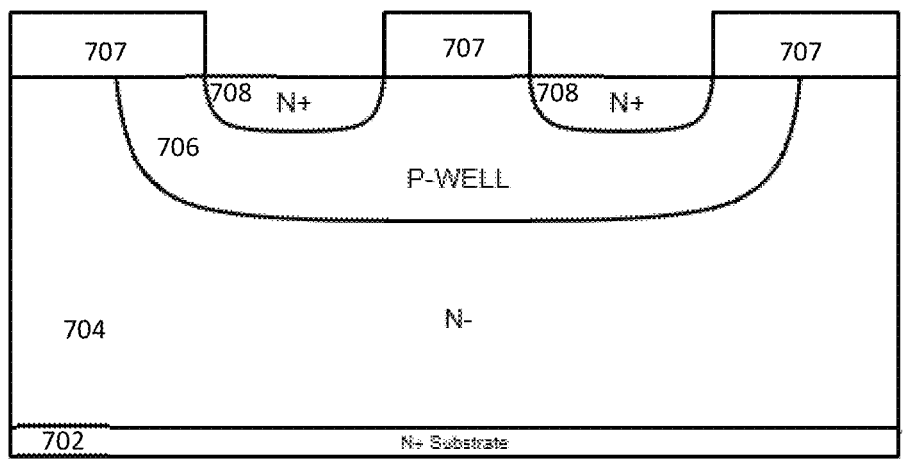
Figure 7G:
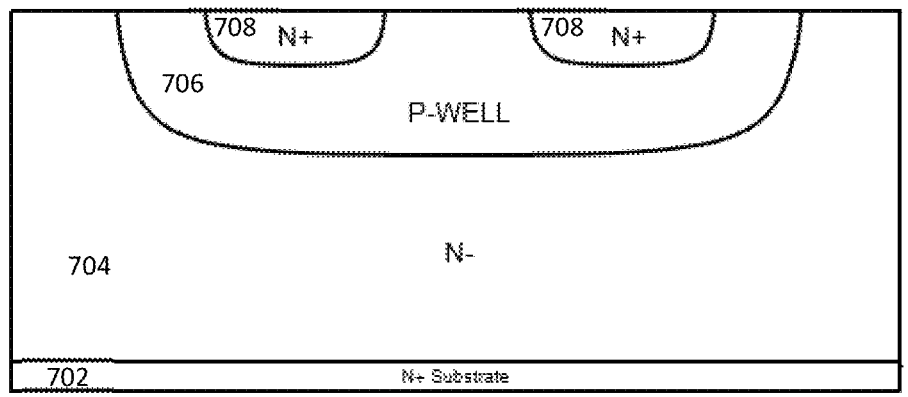
Figure 7H:
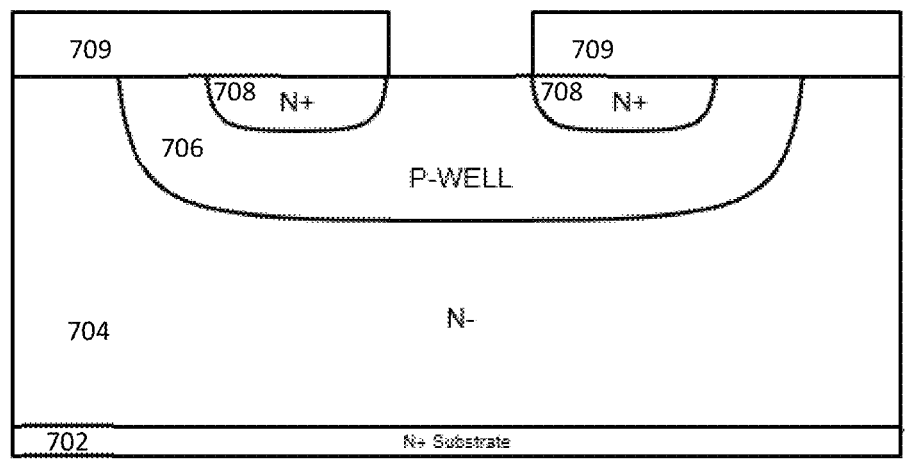
Figure 7I:
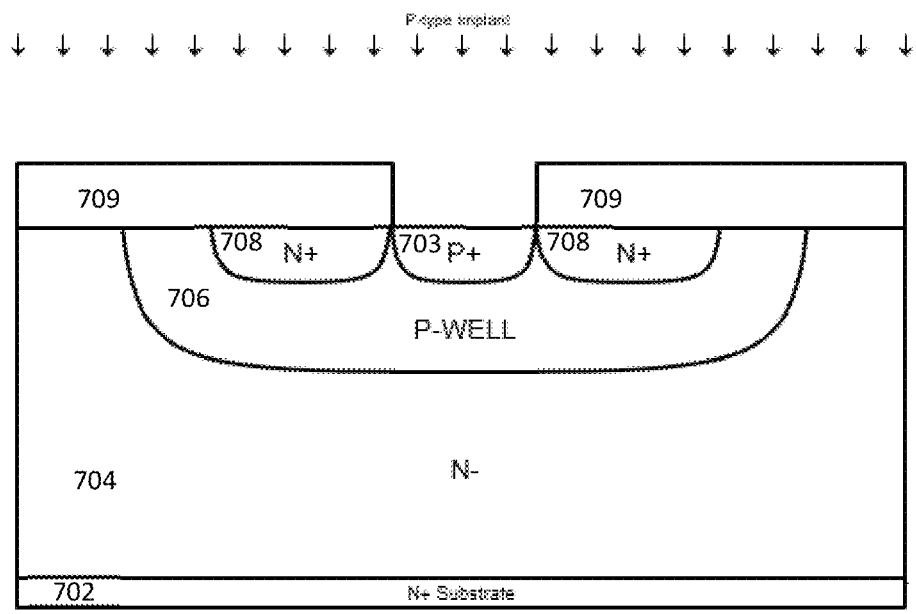
Figure 7J:
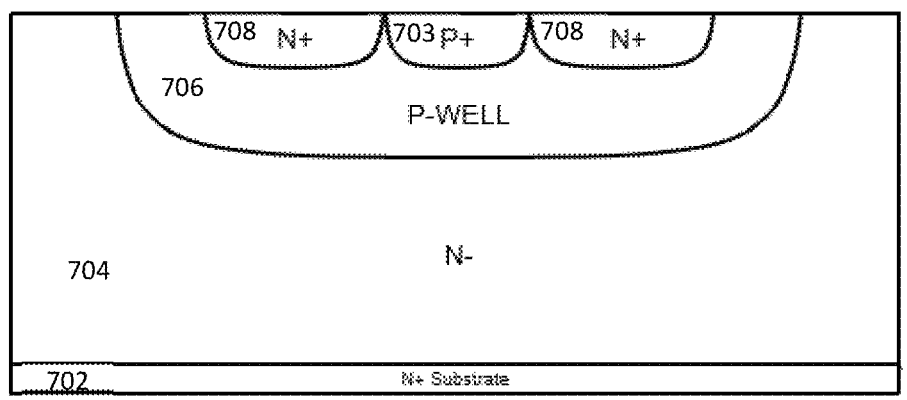
Figure 7K:
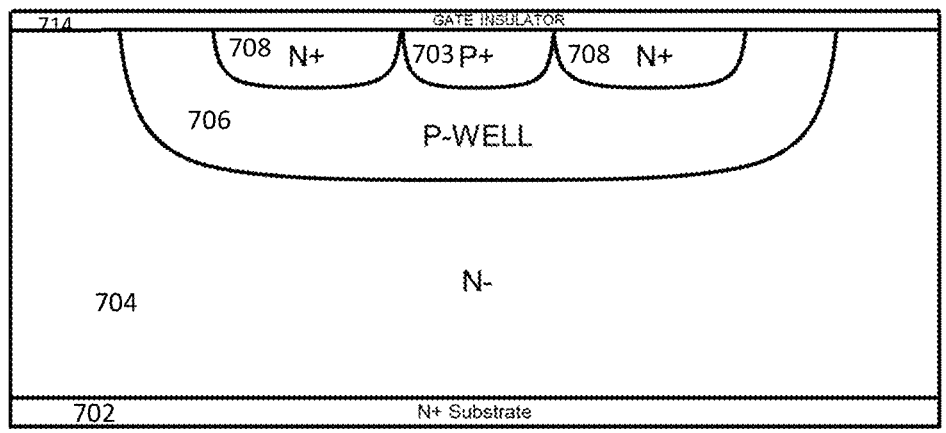
Figure 7L:
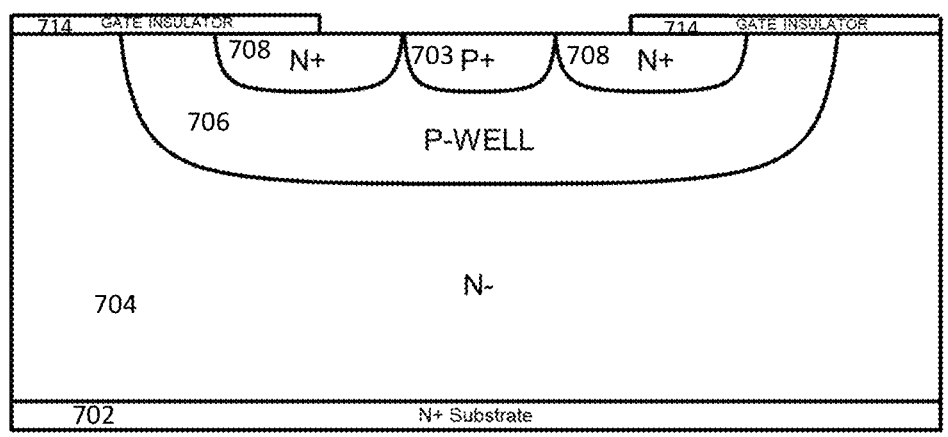
Figure 7M:
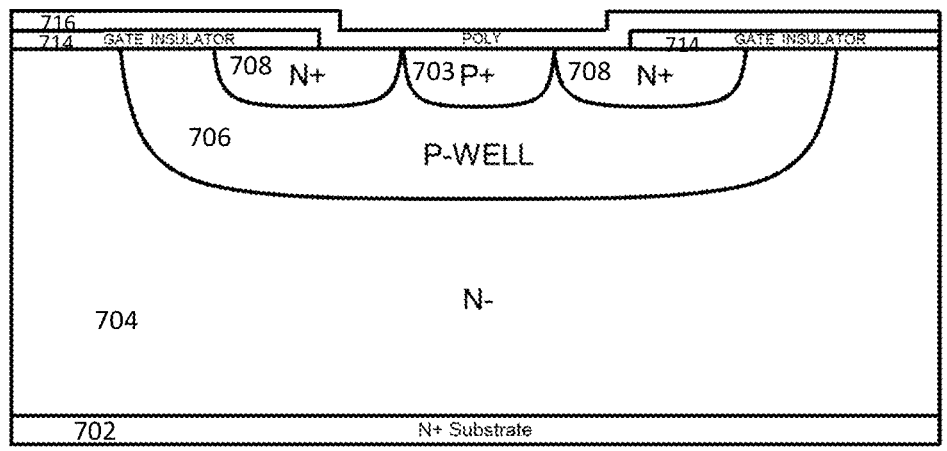
Figure 7N:
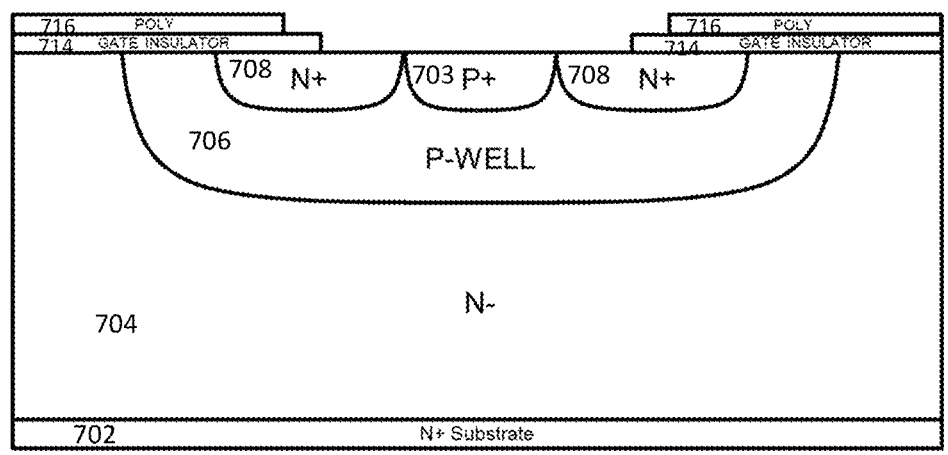
Figure 7O:
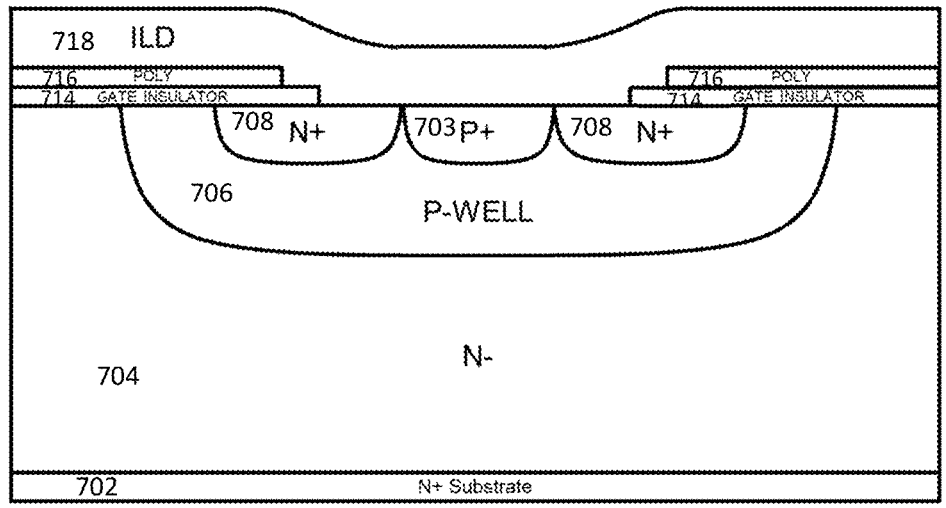
Figure 7P:
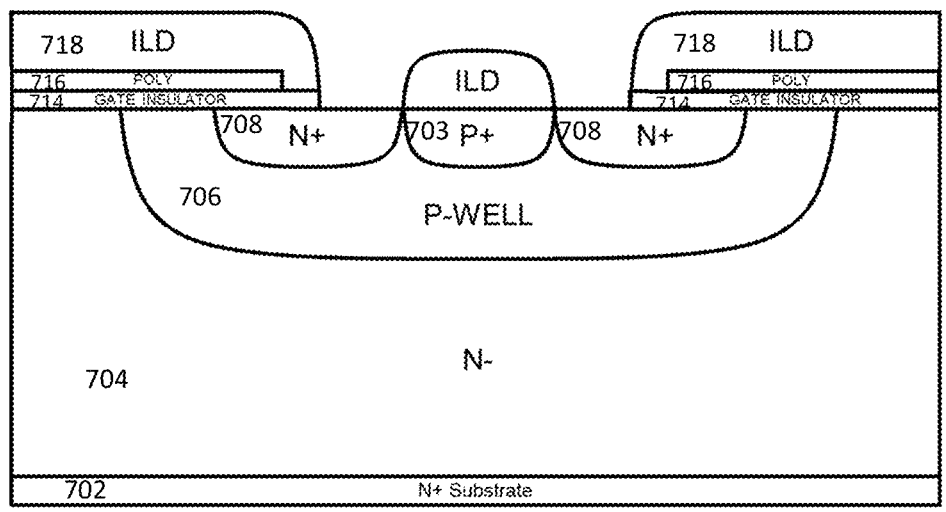
Figure 7Q:
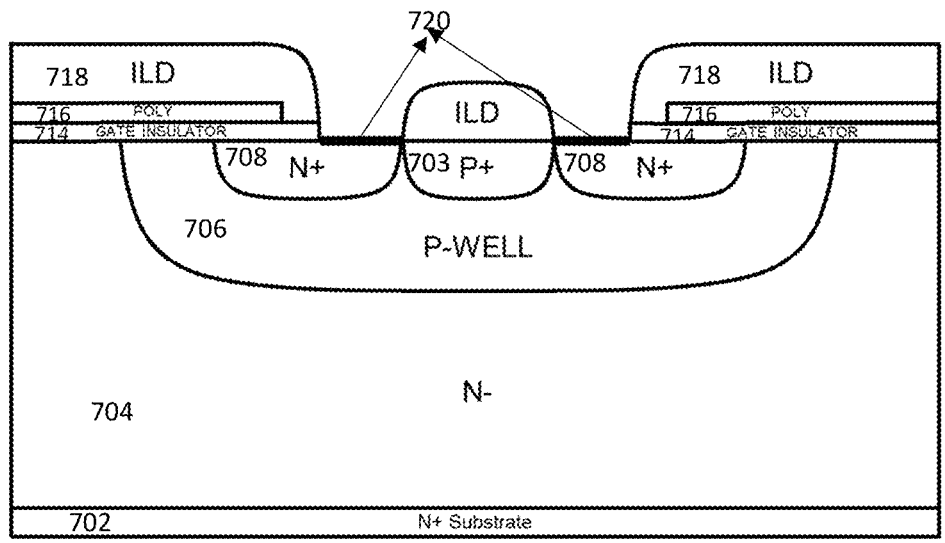
Figure 7R:
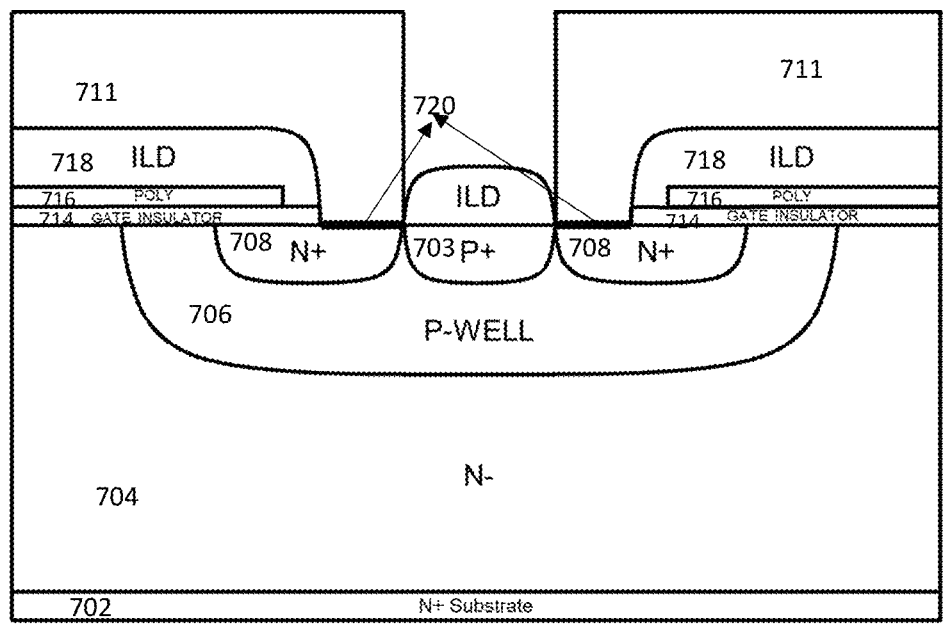
Figure 7S:
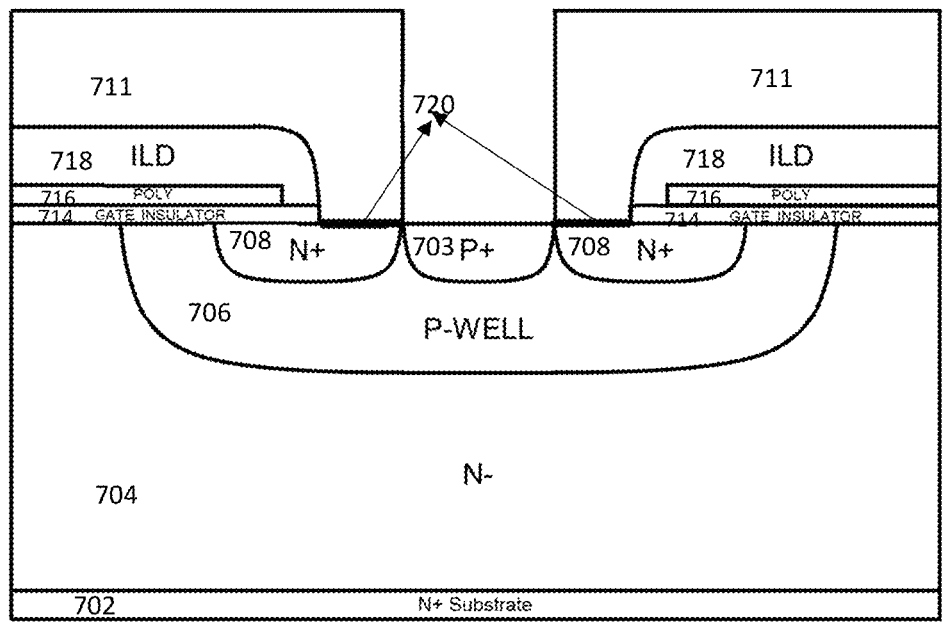
Figure 7T:
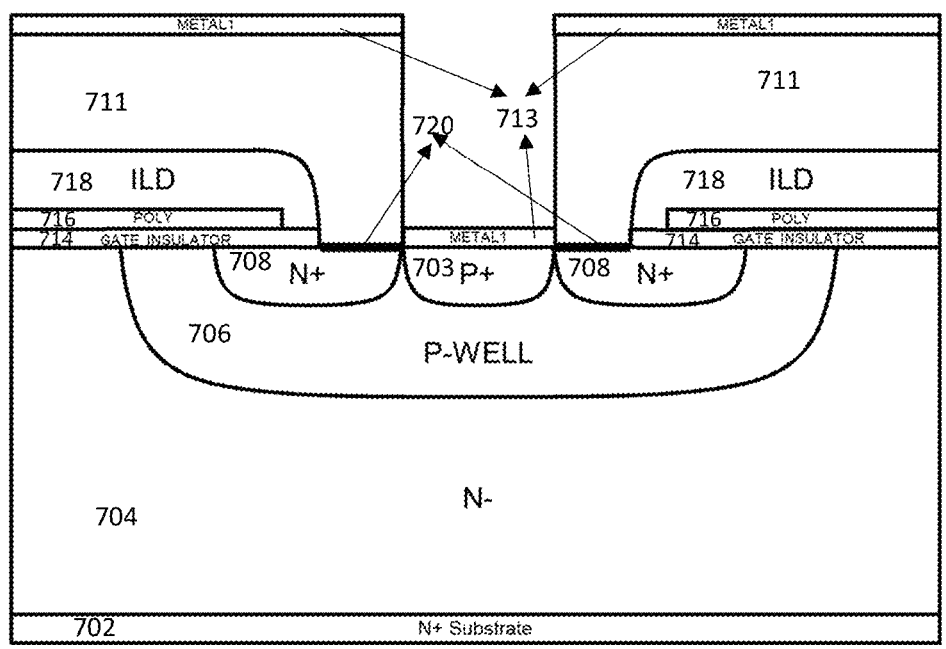
Figure 7U:
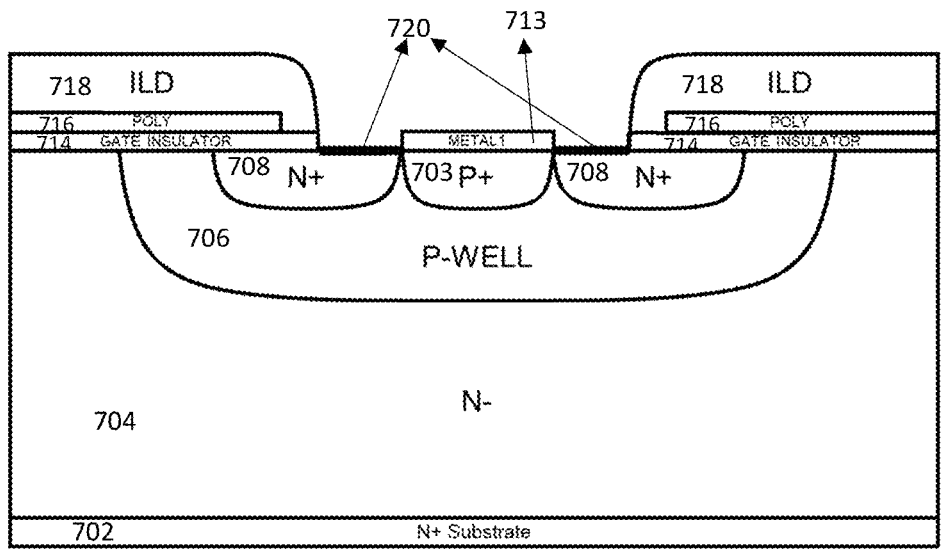
Figure 7V:
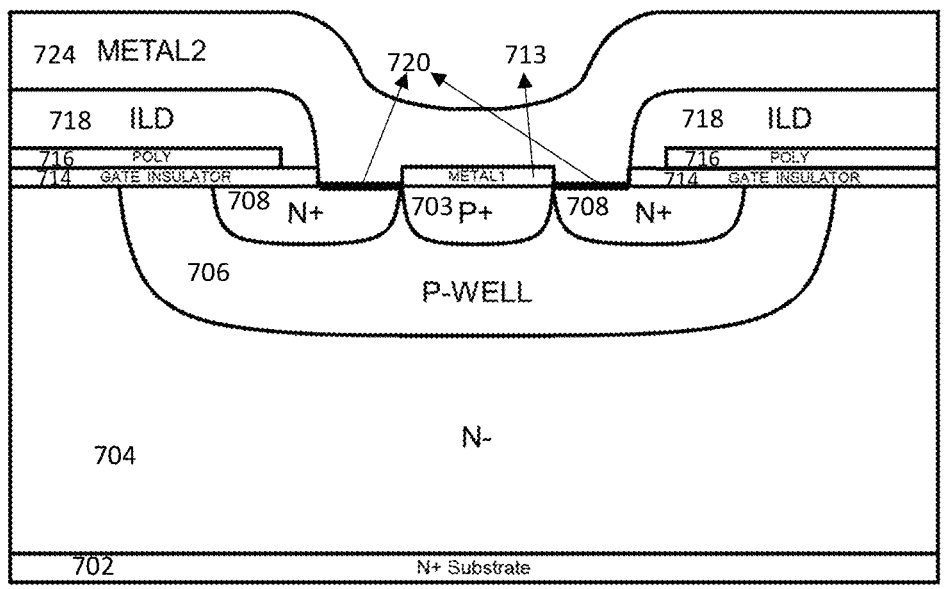
Figure 7W:
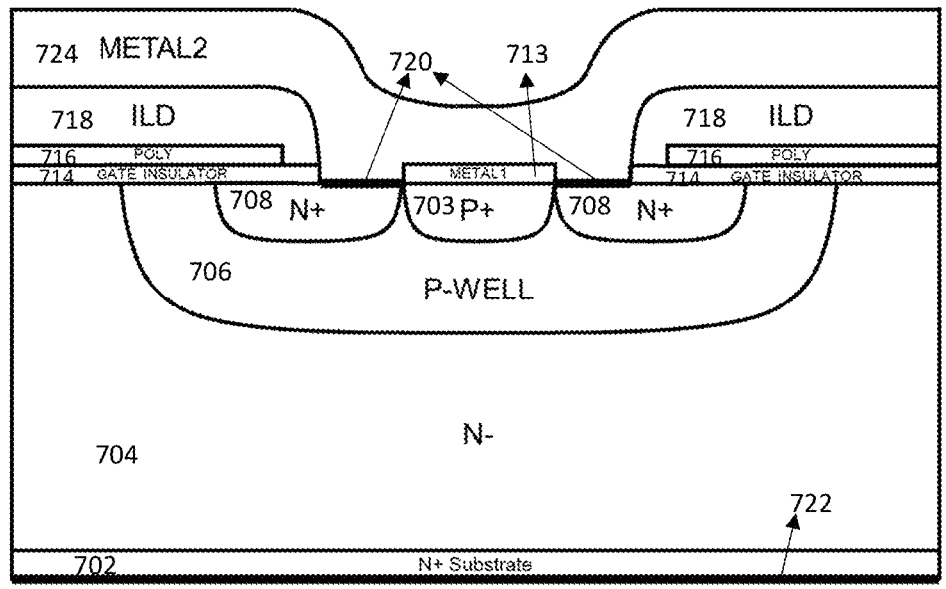
Figure 7X:
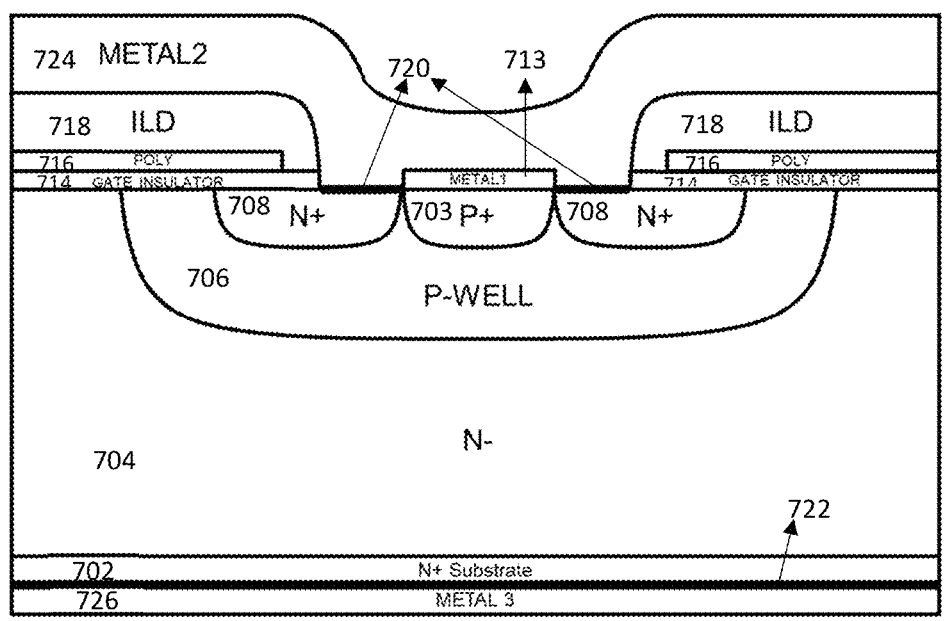

FIGS. 7a-7x illustrate an embodiment of a process of manufacturing the DMOSFET structure shown in FIG. 6a. The process of manufacturing the DMOSFET structure (shown in FIG. 7a) comprises preparing a Silicon Carbide (SiC) substrate having a N+ substrate 702 and a N− drift layer 704 as shown in FIG. 7a. The N− drift layer 704 of the SiC substrate is epi-grown and prepared such that a doping concentration and a thickness of the N− drift layer 704 are selected primarily based on blocking voltage and forward conduction loss. The N+ substrate 702 is highly conductive when compared to the N− drift layer 704 and the N+ substrate 702 is in direct contact with the N-drift layer 704. A first patterned hard mask layer 705 is formed on top of the SiC substrate as shown in FIG. 7b. The first patterned hard mask layer 705 is thick enough for completely blocking high energy impurities during implantation. In an embodiment, the first patterned hard mask layer 705 is a hard mask of at least one of oxide, nitride and polysilicon.

A first p-type ion implantation is formed in FIG. 7c through the first patterned hard mask layer 705 to form a p-well region 706. In an embodiment, the first p-type ion implantation is performed with one or more p-type impurities (e.g. aluminum, boron, etc.). In another embodiment, first p-type ion implantation may comprise a screen oxide layer. The first patterned hard mask layer 705 is then removed, after the first p-type ion implantation, by at least one of dry etching process and wet etching process as shown in FIG. 7d. A second patterned hard mask layer 707 is then formed on the top of the SiC substrate as shown in FIG. 7e for subsequent ion implantation. The second patterned hard mask layer 707 is a photoresist based material and thick enough for preventing any unwanted high energy impurities particles penetrating the second patterned hard mask layer 707. A first n-type ion implantation is formed through the second patterned hard mask layer 707 to form a N+ source region 708 within the p-well region 706 as shown in FIG. 7f. In an embodiment, the first n-type ion implantation is performed with one or more n-type impurities (e.g. nitrogen, phosphorous etc.). The second patterned hard mask layer 707 is then removed after the first n-type ion implantation by at least one of dry etching and wet etching process as shown in FIG. 7g.

A third patterned hard mask layer 709 is then formed on top of the SiC substrate as shown in FIG. 7h. A second p-type implantation is performed through the third patterned hard mask layer 709 to form a P+ region 703 within the p-well region 706 as shown in FIG. 7i.

The third patterned hard mask layer 709 is then removed as shown in FIG. 7j by at least one of a dry etching and a wet etching process once the P+ region 703 is formed. The SiC substrate undergoes thermal activation annealing with a carbon-based protection coating at a predefined temperature. In an embodiment, the predefined temperature for performing the thermal activation annealing is 1700-degree Celsius. The SiC substrate then may undergo an additional ion implantation for forming a current spreading layer to improve on-state resistance. Ion implantations (e.g. the first p-type implantation, the first n-type impanation, the second p-type implantation, edge termination implantation, current spreading layer implantation etc.) undergone by the SiC substrate is performed prior to the thermal activation annealing step. The carbon-based protection coating is then removed from the SiC substrate. The SiC substrate then undergoes a sacrificial oxide growth and subsequently the sacrificial oxide removal. An active region of the SiC DMOSFET is then patterned by forming and patterning field oxide layer on the SiC substrate.

A gate insulator 714 is then formed on top of the SiC substrate as shown in FIG. 7k. The gate insulator is then patterned as shown in FIG. 7l. A polysilicon layer 716 is then formed on top of the SiC substrate as shown in FIG. 7m. The polysilicon layer 716 is then patterned as shown in FIG. 7n. Contacts for the polysilicon layer is kept open for pad metal deposition for forming a gate pad region and one or more gate bus regions. An interlayer dielectric (ILD) 718 is then formed on top of the SiC substrate as shown in FIG. 7o. The interlayer dielectric (ILD) 718 is then patterned for exposing the portions of the SiC substrate via the openings of the ILD 718 as shown in FIG. 7p. A first silicide layer 720 is then formed on the exposed portions of top of the SiC substrate for forming a first Ohmic contact as shown in FIG. 7q. In an embodiment, the first silicide layer 720 is a nickel-based silicide layer. In another embodiment, the nickel-based silicide is formed by Nickel deposition on the top of the SiC substrate, thermal activation annealing of the deposited Nickel for silicide formation, and removal of any un-reacted Nickel from the SiC substrate. A fourth patterned hard mask layer 711 is formed on top of the SiC substrate as shown in FIG. 7r. An ILD etching is formed on the SiC substrate through the fourth patterned hard mask layer 711 to selectively remove the exposed portions of the ILD layer 718 as shown in FIG. 7s. A first metal is deposited on top of the SiC substrate through the fourth patterned hard mask layer 711 as shown in FIG. 7t. The first metal is lifted off and annealed to form a first metal region 713 (e.g. the first Schottky metal region 713) to be in direct contact with the P+ region 703 as shown in FIG. 7u. The first Schottky metal region 713 comprises a target work function. In an embodiment, the target work function may range from 3.5 electron volts to 6 electron volts. The first Schottky metal region 713 is then annealed with a predefined thermal budget for forming a first Schottky contact region between the first Schottky metal region 713 and the top of each P+ region 703. In an embodiment, the predefined thermal budget ranges from 55° C. to 1100° C. The thermal budget for forming the first Schottky contact region is precisely designed and controlled as it directly impacts electrical properties of the first Schottky contact regions. A first pad metal 724 is formed on top of the SiC substrate as shown in FIG. 7v.

A second silicide layer 722 is then formed on bottom of the SiC substrate for forming a second Ohmic contact as shown in FIG. 7w. In an embodiment, the second silicide layer 722 is then formed on back of the SiC substrate for forming the second Ohmic contact (e.g. a drain terminal contact). In an embodiment, the second silicide layer 722 is the nickel-based silicide layer. A second pad metal 726 is then formed on bottom of the second silicide layer 722 of the SiC substrate. In an embodiment, the second pad metal formation is performed by at least one of e-beam and sputtering.

A fifth patterned hard mask layer 715 is then formed on the SiC substrate once the first Ohmic contact and the second Ohmic contact are formed on topside and bottom side/back side of the SiC substrate respectively. The fifth patterned hard mask layer 715 is formed for selectively removing the exposed portions of the ILD layer 718 and depositing a second metal region 728 (i.e. a second Schottky metal region 728) (shown in FIG. 5b) on top of the SiC substrate. The fifth patterned hard mask layer 715 is used for both etching the portion of the ILD layer 718 and lifting off the second Schottky metal region 728 when second Schottky metal is deposited. The second Schottky metal region 728 is in direct contact with the N– drift layer 704 and bridge two adjacent P-well regions 706 (i.e. bridges the adjacent unit cells). The second Schottky metal region 728 is then annealed with a predefined thermal budget for forming a second Schottky metal contact between the second Schottky metal region 728 and the portion of the N– drift layer 704 exposed at the top surface of the SiC substrate. In an embodiment, the predefined thermal budget ranges from 55° C. to 1100° C. In FIG. 6b the first pad metal and the second pad metal formation are performed once the second Schottky metal region 728 formation is completed.

Figure 8A:
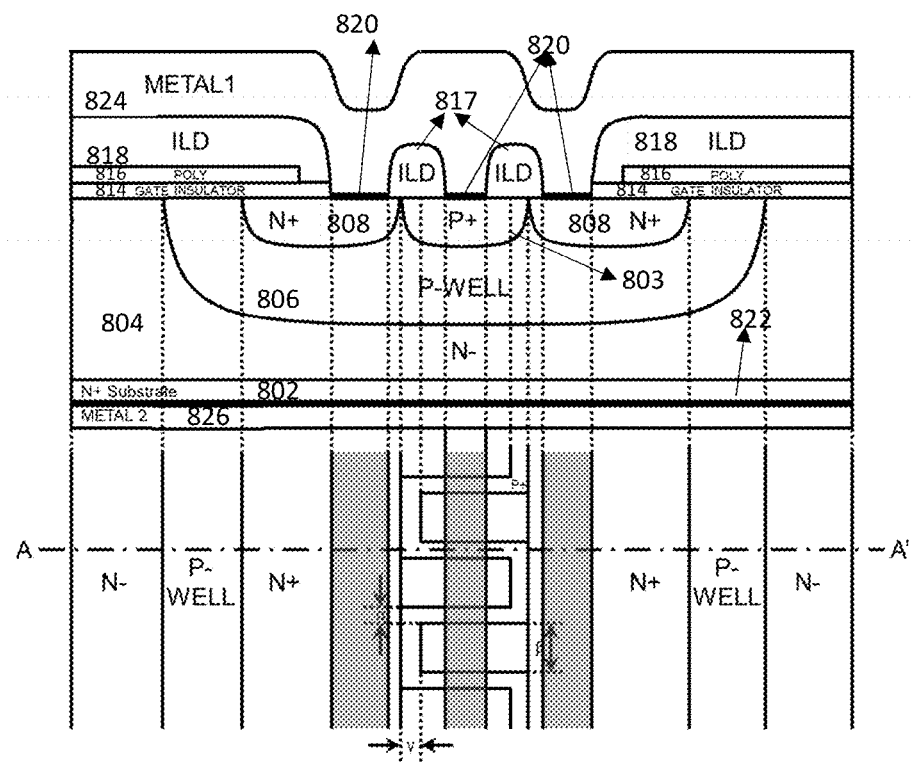
FIGS. 8a-8c illustrate an embodiment of cross-sectional structures of a unit cell of a double-implantation metal oxide semiconductor field effect transistor (DMOSFET) comprising a second conductivity type well contact region that meanders at three different locations respectively.
Figure 8B:
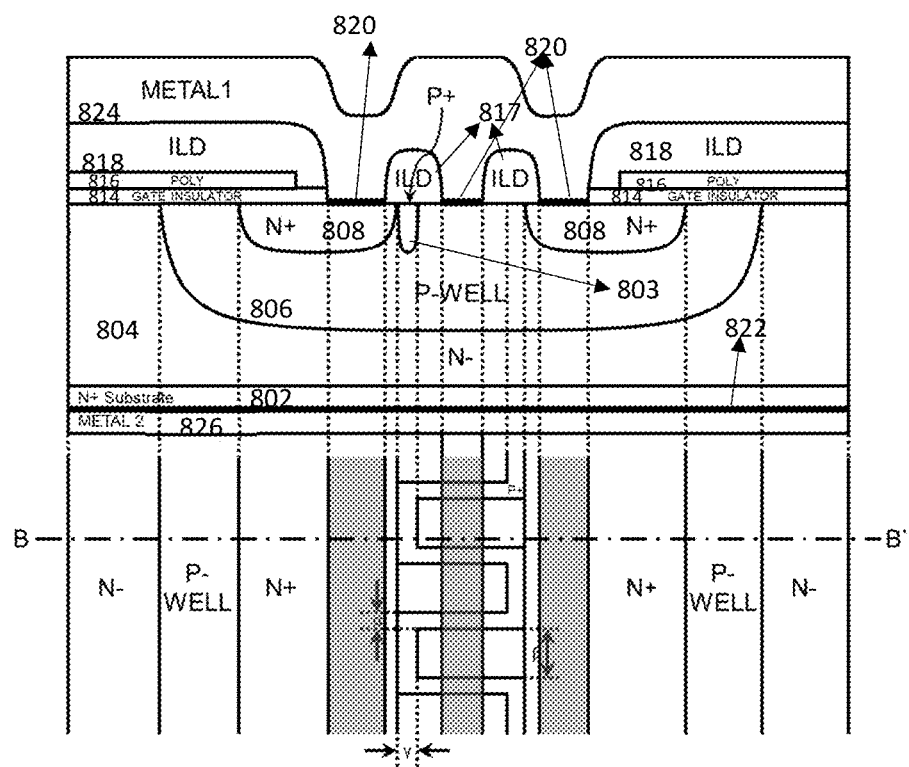
Figure 8C:
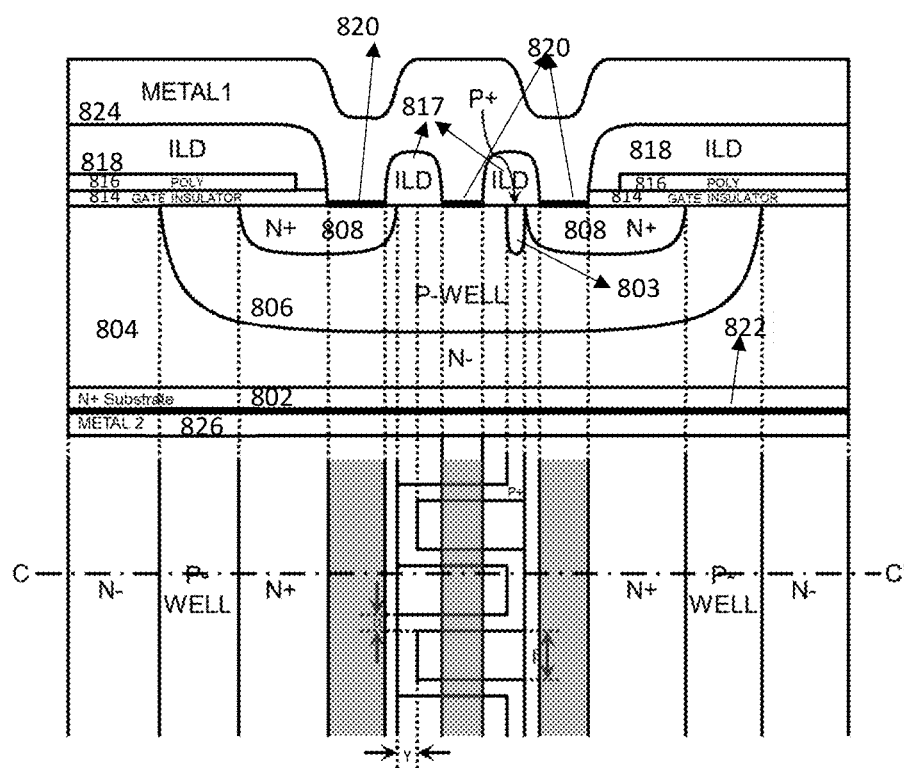

FIGS. 8a-8c illustrate an embodiment of cross-sectional structures of a unit cell of a DMOSFET comprising a second conductivity type well contact region that meanders at three different locations respectively. The DMOSFET shown in FIGS. 8a, 8b and 8c is a n-type planar gate SiC DMOSFET. In an embodiment, the DMOSFET is a p-type planar gate DMOSFET. In another embodiment, the DMOSFET is a n-type trench gate DMOSFET. In yet another embodiment, the DMOSFET is a p-type trench gate DMOSFET. The DMOSFET (shown in FIGS. 8a, 8b and 8c) comprises a Silicon Carbide (SiC) substrate. The SiC substrate comprises a N+ substrate 802 and a N– drift layer 804. The DMOSFET also comprises a P-well region 806, a N+ source region 808 and a P+ region 803 (i.e. the second conductivity type well contact region). The N+ source region 808 (i.e. a first conductivity type source region) is formed within the P-well region 806. The P+ region 803 is meandering within the P-well region 806 by performing a p-type implantation at respective locations. The P+ region 803 comprise a periodic spacing with the successive P+ region 803 (i.e. non-contiguous). Further the lateral extent of the P+ region 803 varies with a non-zero value in a direction orthogonal to the unit cell. The meandering P+ region 803 periodically forms ohmic contacts to a first pad metal 824 (e.g. a source metal) via a first silicide layer 820 between two interlayer dielectric (ILD) bumps 817 located between metal oxide semiconductor gate stack and the first pad metal 824. The meandering P+ region 803 follows Zigzag path, where corners of the zigzag path is right angled. The Zigzag path of the meandering P+ region 803 comprises dimensions α, β, and γ. The meandering P+ region 803 comprise a target size and are a target spacing between adjacent junction points located between the meandering P+ region 803. Contact resistance to the first pad metal 824 (e.g. the source metal) varies when the P+ region 803 under the ILD bumps 817 do not have direct contact with the first pad metal 824 and when the P+ region 803 have direct contact with the first pad metal 824 through the first silicide layer 820. The portions of the meandering P+ region 803 which are directly under the ILD bumps 817 functions as networks of distributed ballast resistors and provides an additional source resistance to the source contact resistance. The additional contact resistance provided directly impacts the differential on-resistance of one or more body diode regions of the DMOSFET. The impacted differential-on resistance of the body diode regions suppresses increase of forward conduction current of the one or more body diode regions. The limited forward conduction current mitigates basal plane dislocation (BPD). Since the source contact resistance is dependent on the sizing, the spacing between adjacent junction points located between the meandering P+ region 803, and the silicide region between the adjacent ILD bumps 817, the source contact resistance is tuned by sizing the P+ region 803 to a target size and controlling the spacing to a target spacing. In an embodiment, the target size ranges from 10 nm to 10 μm. In another embodiment, the target spacing ranges from 10 nm to 10 μm. Say for a first instance, when width (a) of the meandering P+ region 803 is reduced, the resistance of each ballast resistor network is increased which degrades the differential on-resistance of the one or more body diode regions. The reduction of the width (a), also shrinks the area where the Ohmic contacts are formed, degrades the differential on-resistance of the one or more body diode regions. Say for a second instance, when the periodic spacing (γ) between the meandering P+ region 803 is increased, the resistance of each ballast resistor network is increased which degrades the differential on-resistance of the one or more body diode regions. Say for a third instance, when spacing ((3) between two adjacent junction points between the meandering featured P+ region 803, and the straight silicide region between two adjacent ILD bumps 817 is increased, the resistance of each ballast resistor network is increased which degrades the differential on-resistance of the one or more body diode regions.

Figure 8D:
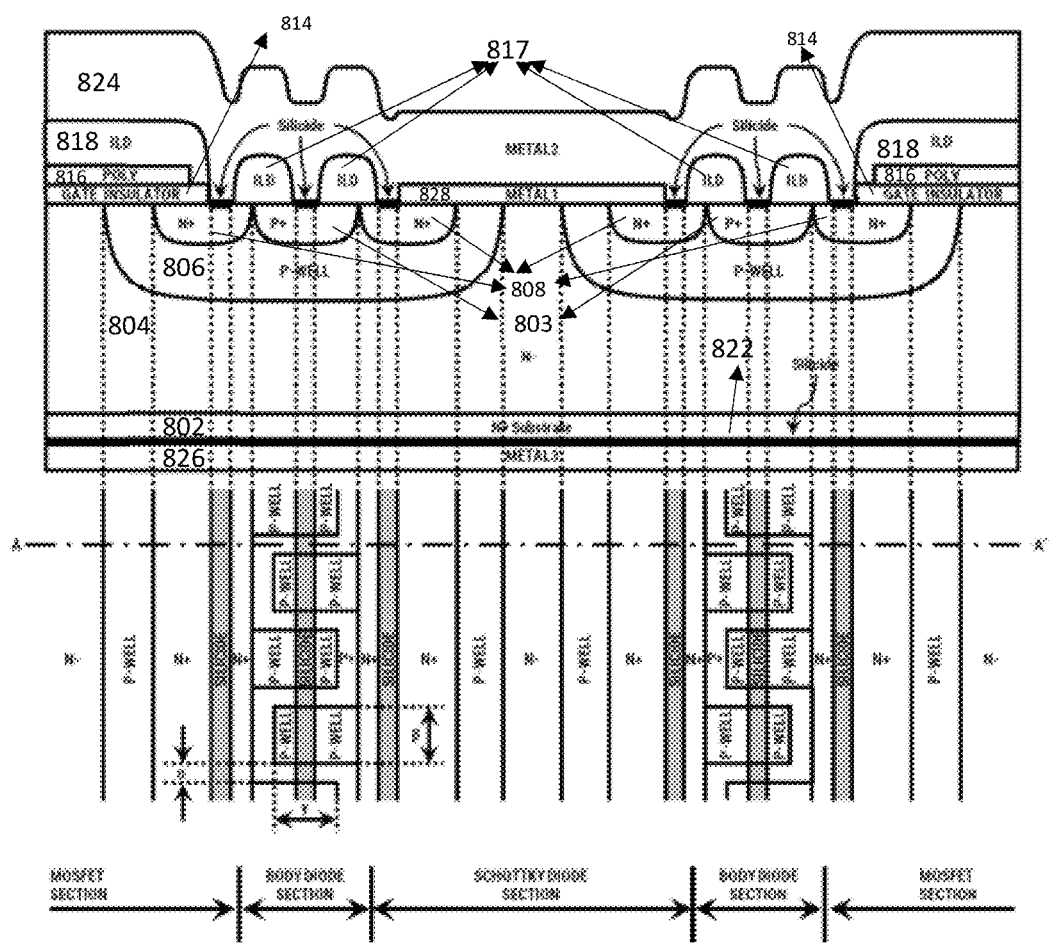
FIGS. 8d-8f illustrates an embodiment of cross-sectional structures of one or more unit cells of a diode integrated DMOSFET, each DMOSFET unit cell comprising the second conductivity type well contact region that meanders at three different locations respectively.
Figure 8E:
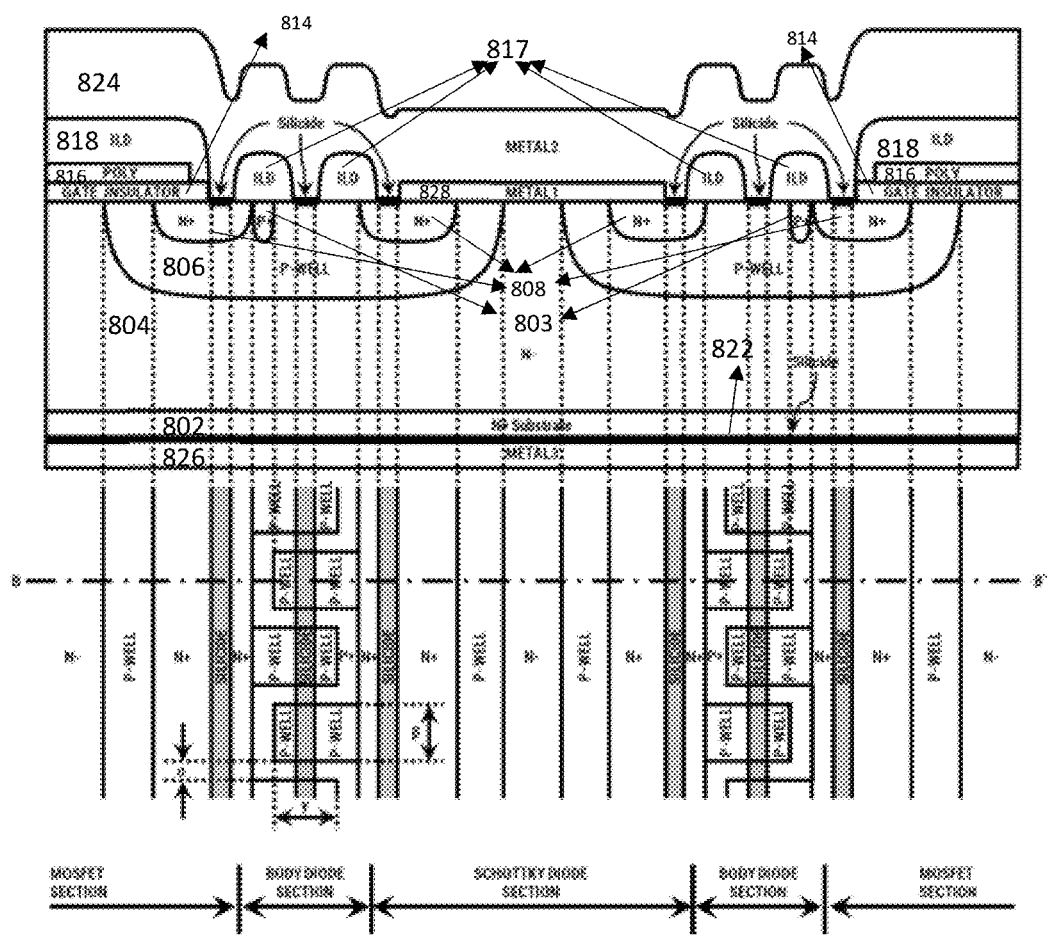
Figure 8F:
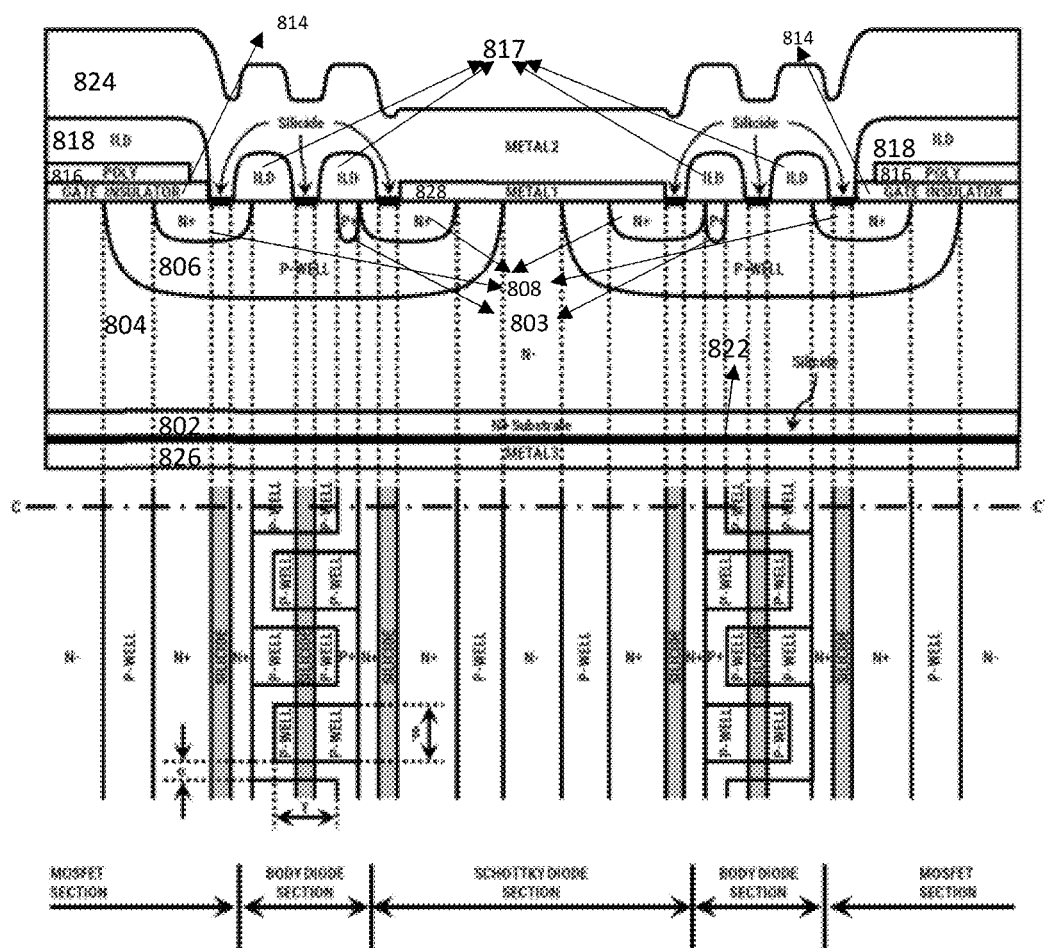

FIGS. 8d-8f illustrate an embodiment of cross-sectional structures of one or more unit cells of a diode integrated DMOSFET, each DMOSFET unit cell comprising the second conductivity type well contact region that meanders at three different locations respectively. The DMOSFET (shown in FIGS. 8d, 8e & 8f) is a n-type planar gate SiC DMOSFET. The DMOSFET shown in FIGS. 8d, 8e & 8f operates in a similar way to FIGS. 8a, 8b & 8c. In addition to FIGS. 8a, 8b & 8c, the DMOSFET (shown in FIGS. 8d, 8e & 8f) comprises a metal region (i.e. a Schottky metal region 828) in direct contact with the N– drift layer 804 and bridges adjacent P-well regions 806 of the one or more P-well regions 806 (i.e. bridges the adjacent unit cells). The DMOSFET comprises the P+ region 803 that meanders within each P-well region 806.

Figure 9A:
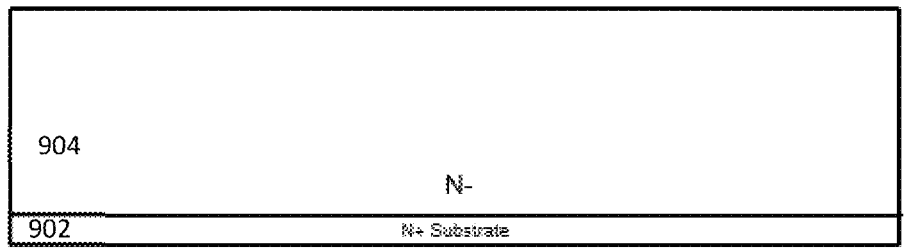
Figure 9B:
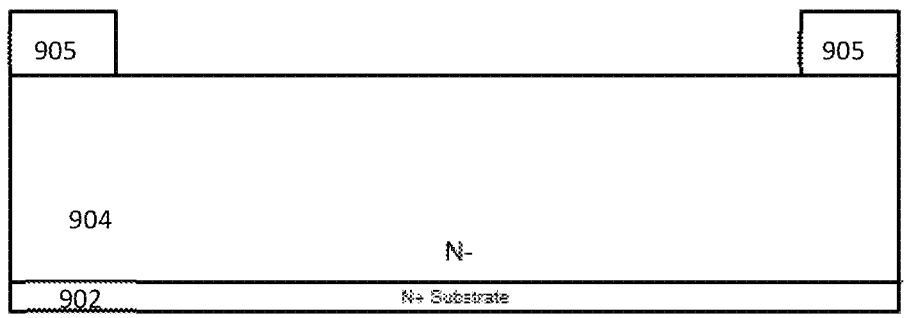
Figure 9C:
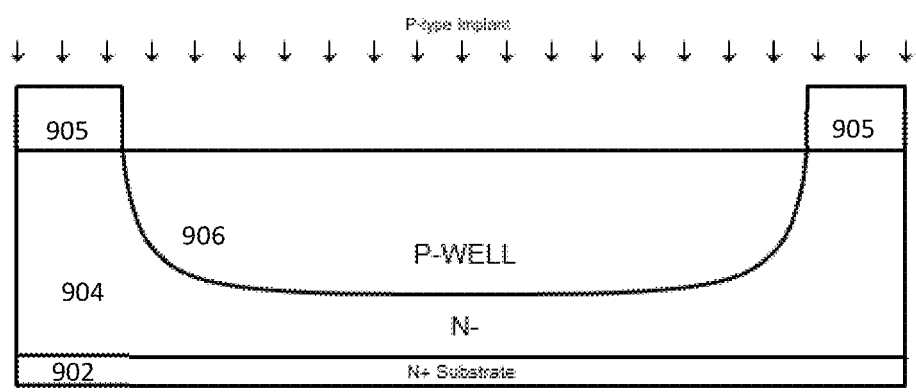
Figure 9D:
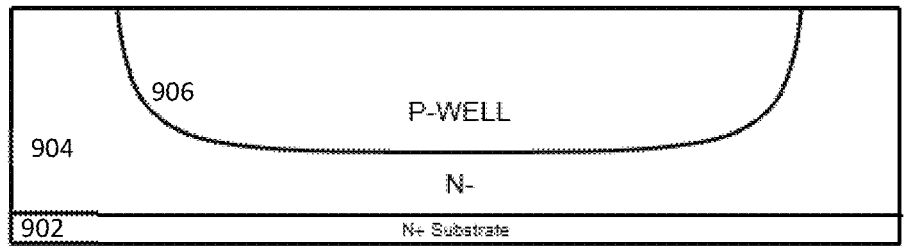
Figure 9E:
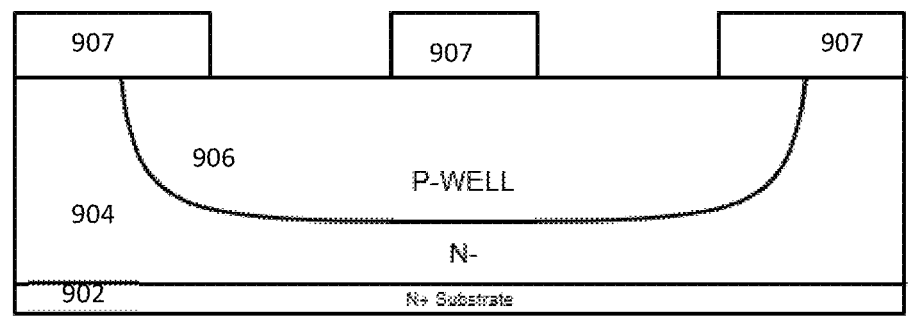
Figure 9F:
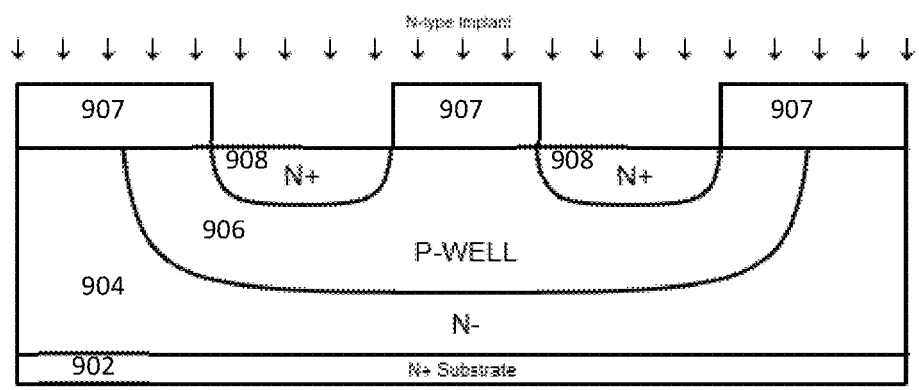
Figure 9G:
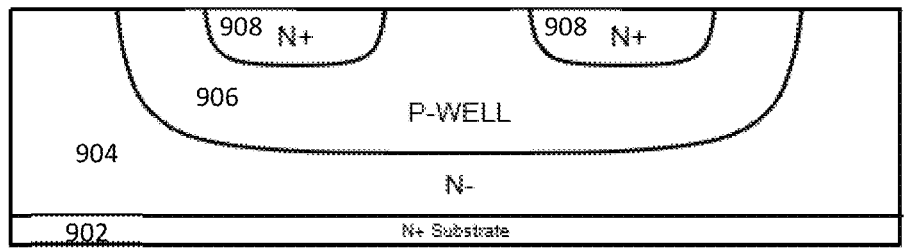
Figure 9H:
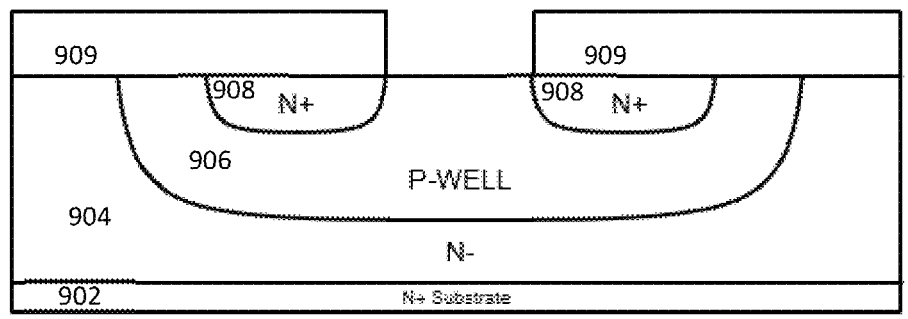
Figure 9I:
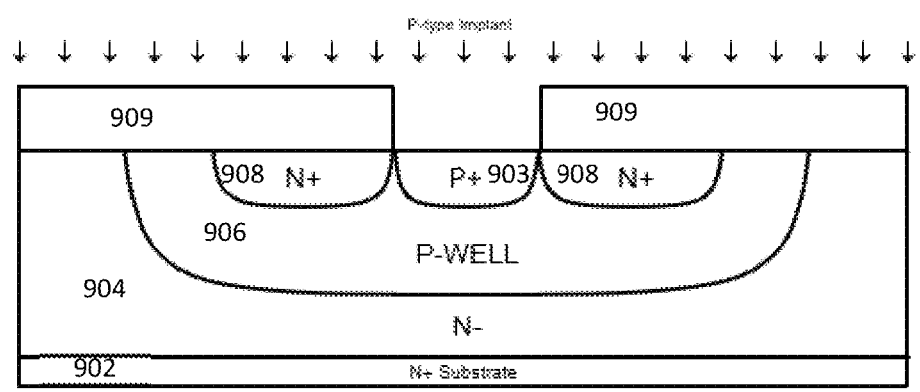
Figure 9J:
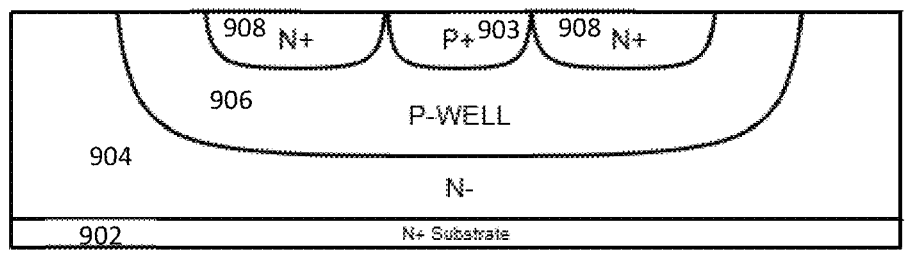
Figure 9K:
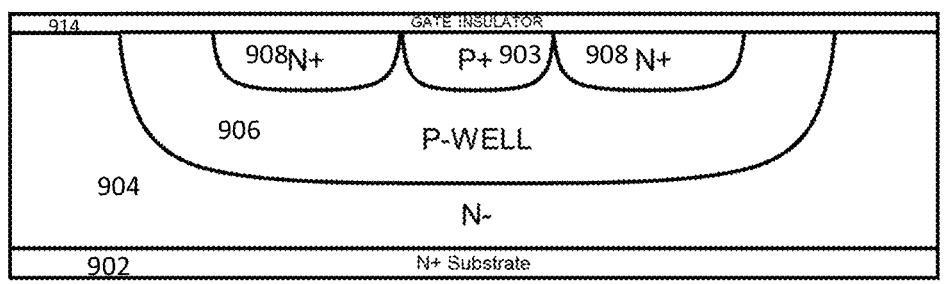
Figure 9L:
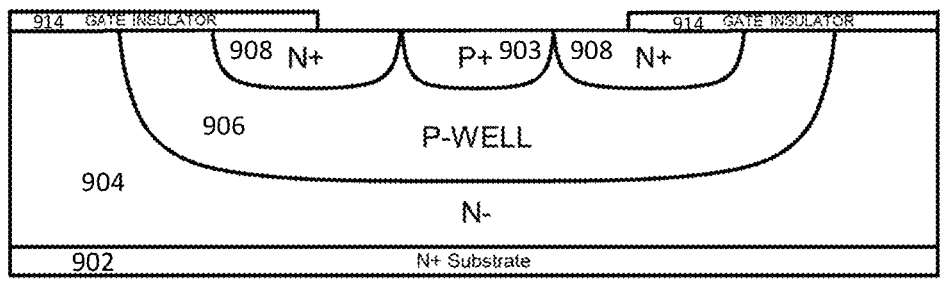
Figure 9M:
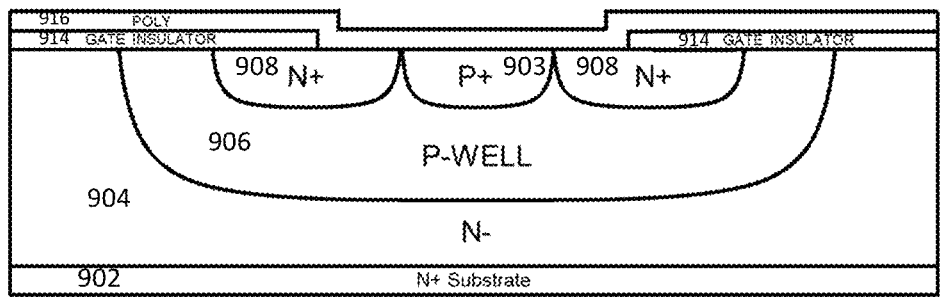
Figure 9N:
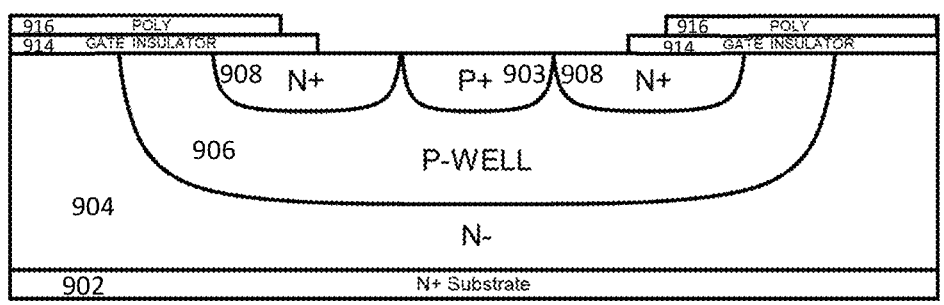
Figure 9O:
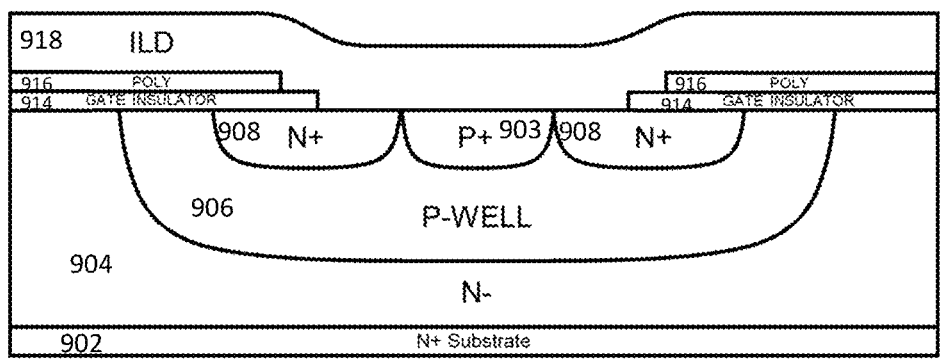
Figure 9P:
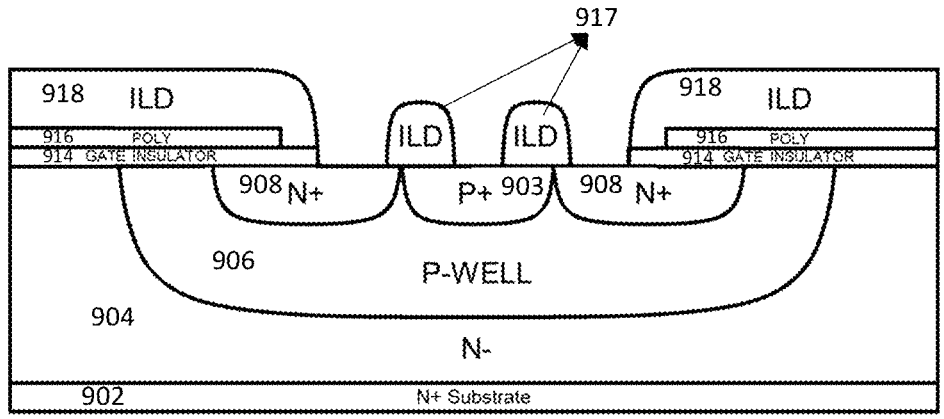
Figure 9Q:
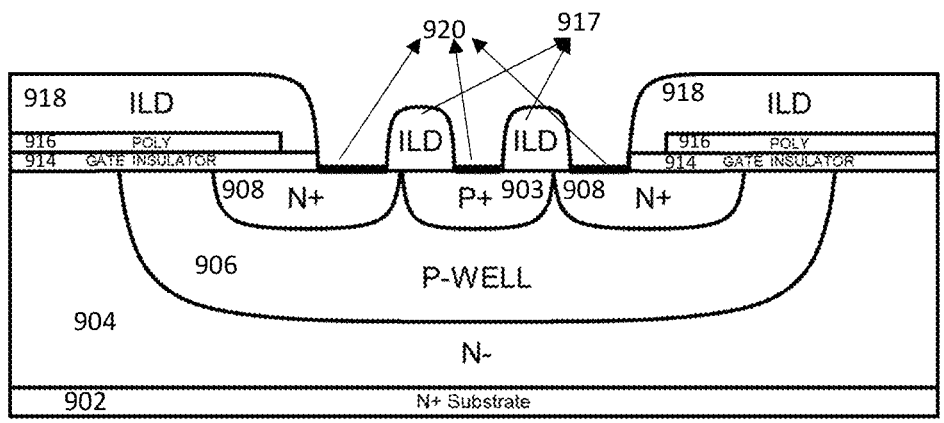
Figure 9R:
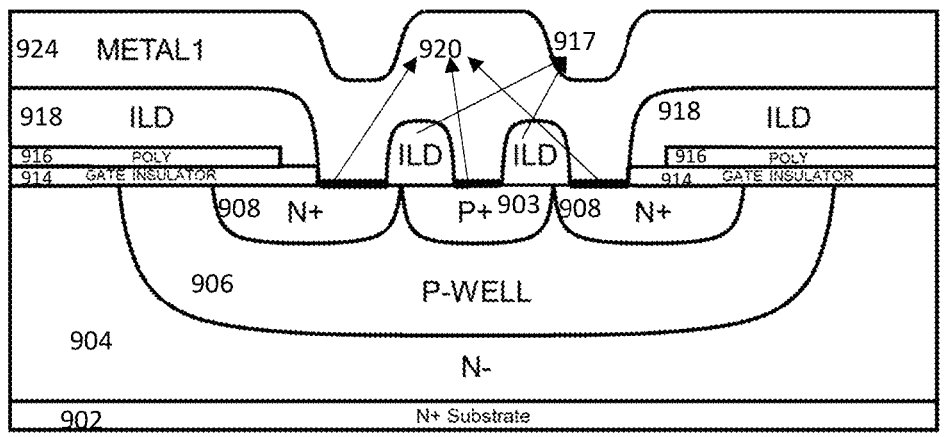
Figure 9S:
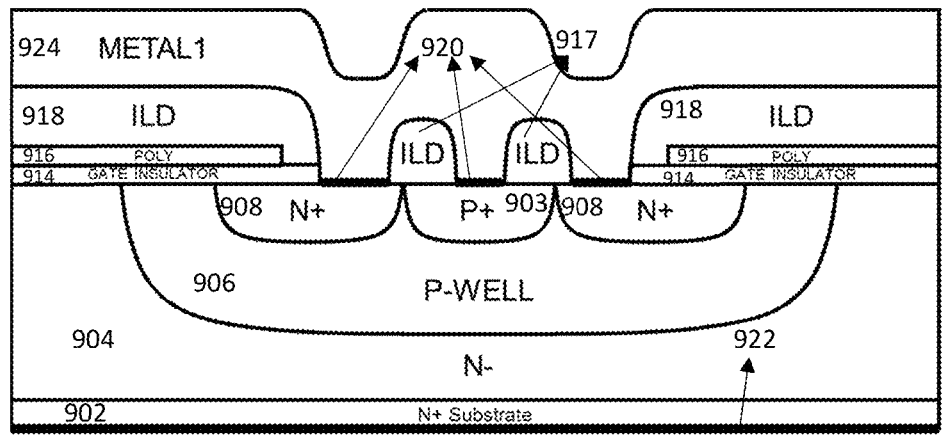
Figure 9T:
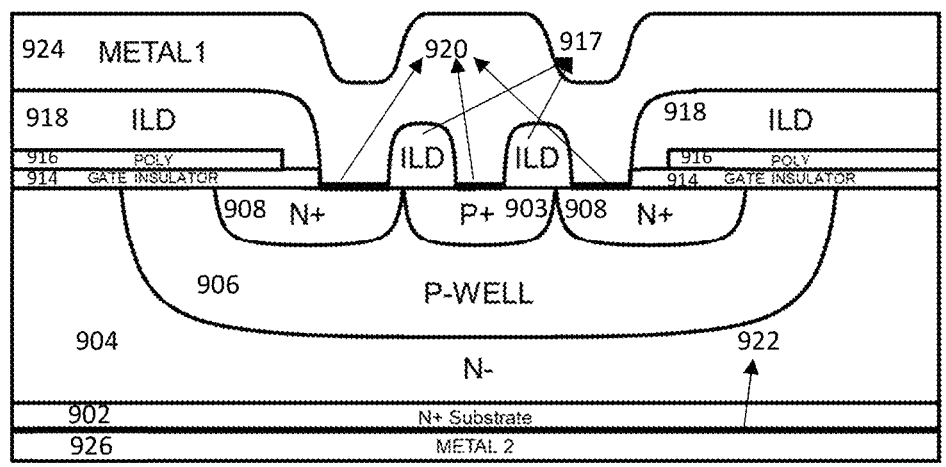

FIGS. 9a-9t illustrate an embodiment of a process of manufacturing the DMOSFET structure shown in FIG. 8a. The process of manufacturing the DMOSFET structure (shown in FIG. 9a) comprises preparing a Silicon Carbide (SiC) substrate having a N+ substrate 902 and a N– drift layer 904 as shown in FIG. 9a. The N– drift layer 904 of the SiC substrate is epi-grown and prepared such that a doping concentration and a thickness of the N– drift layer 904 are selected primarily based on blocking voltage and forward conduction loss. The N+ substrate 902 is highly conductive when compared to the N– drift layer 904 and the N+ substrate 902 is directly located under the N-drift layer 904. A first patterned hard mask layer 905 is formed on top of the SiC substrate as shown in FIG. 9b. The first patterned hard mask layer 905 is thick enough for completely blocking high energy impurities during implantation. In an embodiment, the first patterned hard mask layer 905 is a hard mask of at least one of oxide, nitride and a polysilicon layer.

A first p-type ion implantation is formed in FIG. 9c through the first patterned hard mask layer 905 to form a p-well region 906. In an embodiment, the first p-type ion implantation is performed with one or more p-type impurities (e.g. aluminum, boron, etc.). In another embodiment, first p-type ion implantation may comprise a screen oxide layer. The first patterned hard mask layer 905 is then removed, after the first p-type ion implantation, by at least one of dry etching process and wet etching process as shown in FIG. 9*d*. A second patterned hard mask layer 907 is then formed on the top of the SiC substrate as shown in FIG. 9*e* for subsequent ion implantation. The second patterned hard mask layer 907 is a photoresist based material and thick enough for preventing any unwanted high energy impurities particles penetrating the second patterned hard mask layer 907. A first n-type ion implantation is formed through the second patterned hard mask layer 907 to form a N+ source region 908 within the p-well region 906 as shown in FIG. 9*f*. In an embodiment, the first n-type ion implantation is performed with one or more n-type impurities (e.g. nitrogen, phosphorous etc.). The second patterned hard mask layer 907 is then removed after the first n-type ion implantation by at least one of dry etching and wet etching process as shown in FIG. 9*g*.

A third patterned hard mask layer 909 is then formed on top of the SiC substrate as shown in FIG. 9*h*. A second p-type implantation is performed through the third patterned hard mask layer 909 to form a P+ region 903, at a first location within the p-well region 906 as shown in FIG. 9*i*.

The third patterned hard mask layer 909 is then removed as shown in FIG. 9*j* by at least one of a dry etching and a wet etching process once the P+ region 903 is formed. The SiC substrate undergoes thermal activation annealing with a carbon-based protection coating at a predefined temperature. In an embodiment, the predefined temperature for performing the thermal activation annealing is 1700-degree Celsius. The SiC substrate then may undergo an additional ion implantation for forming a current spreading layer to improve on-state resistance. Ion implantations (e.g. the first p-type implantation, the first n-type impanation, the second p-type implantation, edge termination implantation, current spreading layer implantation etc.) undergone by the SiC substrate is performed prior to the thermal activation annealing step. The carbon-based protection coating is then removed from the SiC substrate. The SiC substrate then undergoes a sacrificial oxide growth and subsequently the sacrificial oxide removal. An active region of the SiC DMOSFET is then patterned by forming and patterning field oxide layer on the SiC substrate.

A gate insulator 914 is then formed on top of the SiC substrate as shown in FIG. 9*k*. The gate insulator 914 is then patterned as shown in FIG. 9*l*. A polysilicon layer 916 is then formed on top of the SiC substrate as shown in FIG. 9*m*. The polysilicon layer 916 is then patterned as shown in FIG. 9*n*. Contacts for the polysilicon layer is kept open for pad metal deposition for forming a gate pad region and one or more gate bus regions. An interlayer dielectric (ILD) 918 is then formed on top of the SiC substrate as shown in FIG. 9*o*. The interlayer dielectric (ILD) 918 is then patterned for exposing the portions of the SiC substrate via the openings of the ILD 918 and leaving one or more ILD bumps 917 as shown in FIG. 9*p*. A first silicide layer 920 is then formed between the one or more ILD bumps 917 on the exposed portions of top of the SiC substrate for forming a first Ohmic contact as shown in FIG. 9*q*. In an embodiment, the first silicide layer 920 is a nickel-based silicide layer. In another embodiment, the nickel-based silicide is formed by Nickel deposition on the top of the SiC substrate, thermal activation annealing of the deposited Nickel for silicide formation, and removal of any un-reacted Nickel from the SiC substrate. A first pad metal 924 is formed on top of the SiC substrate as shown in FIG. 9*r*. The P+ region 903, formed at the first location, covers both portions of the first silicide layer 920 between the adjacent ILD bumps 917 and the portions under the ILD bumps 917.

A second silicide layer 922 is then formed on bottom of the SiC substrate for forming a second Ohmic contact as shown in FIG. 9*s*. In an embodiment, the second silicide layer 922 is then formed on back of the SiC substrate for forming the second Ohmic contact. In an embodiment, the second silicide layer 922 is also the nickel-based silicide layer. A second pad metal 926 is then formed on bottom of the second silicide layer 922 of the SiC substrate as shown in FIG. 9*t*. In an embodiment, the second pad metal formation is performed by at least one of e-beam and sputtering.

A fourth patterned hard mask layer 911 is then formed on the SiC substrate once the first Ohmic contact and the second Ohmic contact are formed on topside and bottom side/back side of the SiC substrate respectively. The fourth patterned hard mask layer 911 is formed for selectively removing the exposed portions of the ILD layer 918 and depositing a metal region (i.e. a Schottky metal region 928) (shown in FIGS. 8*d*, 8*e* & 8*f*) on top of the SiC substrate. The fourth patterned hard mask layer 911 is used for both etching the portion of the ILD layer 918 and lifting off the Schottky metal region 928 when Schottky metal is deposited. The Schottky metal region 928 is in direct contact with the N− drift layer 904 and bridge two adjacent P-well regions 906 (i.e. bridges the adjacent unit cells). The Schottky metal region 928 is then annealed with a predefined thermal budget for forming a Schottky metal contact between the Schottky metal region 928 and the portion of the N− drift layer 904 exposed at the top surface of the SiC substrate. In an embodiment, the predefined thermal budget ranges from 55° C. to 1100° C. In FIGS. 8*d*, 8*e* & 8*f*, the first pad metal and the second pad metal formation are performed once the Schottky metal region 928 formation is completed.

Figure 10A:
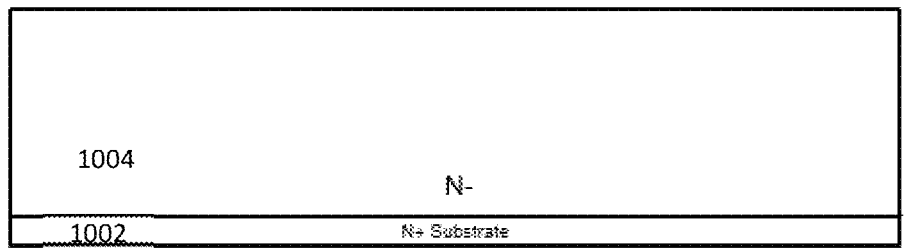
FIGS. 10a-10t illustrate an embodiment of a process of manufacturing the DMOSFET structure shown in FIG. 8b.
Figure 10B:
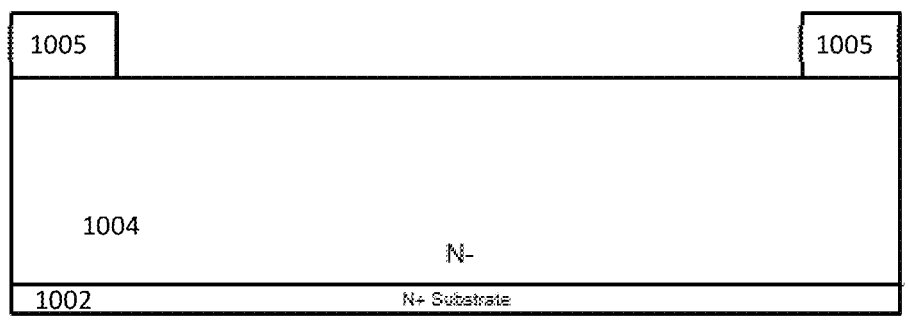
Figure 10C:
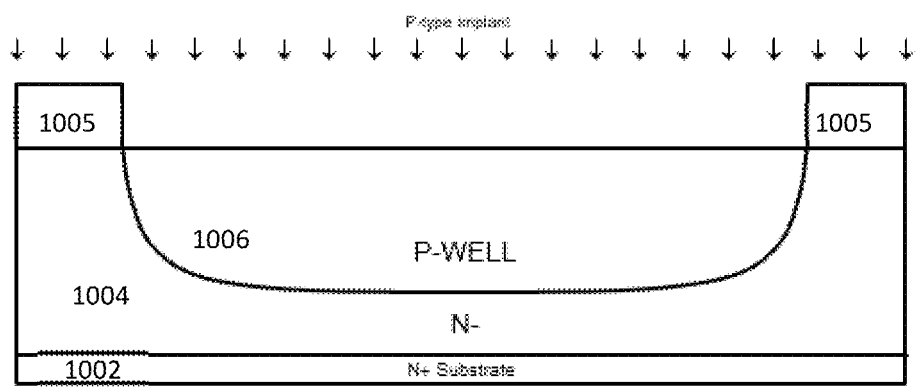
Figure 10D:
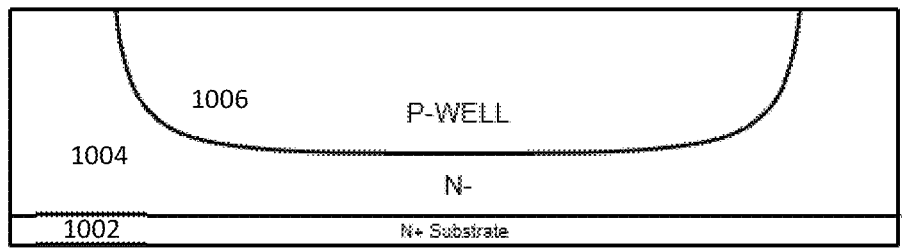
Figure 10E:
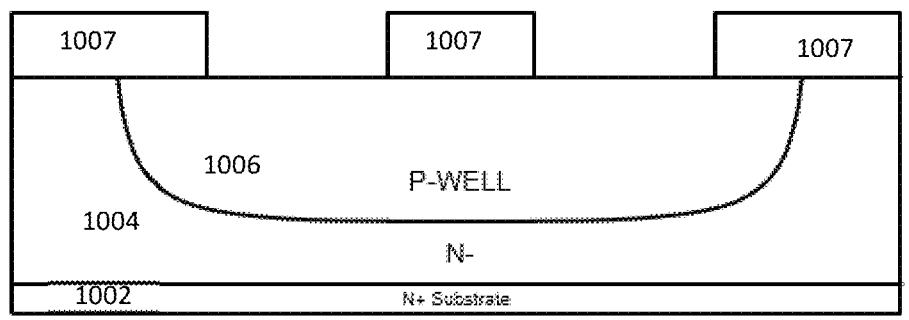
Figure 10F:
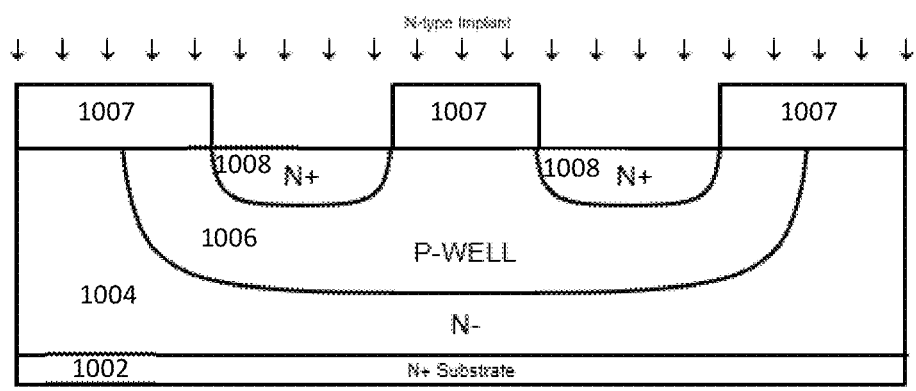
Figure 10G:
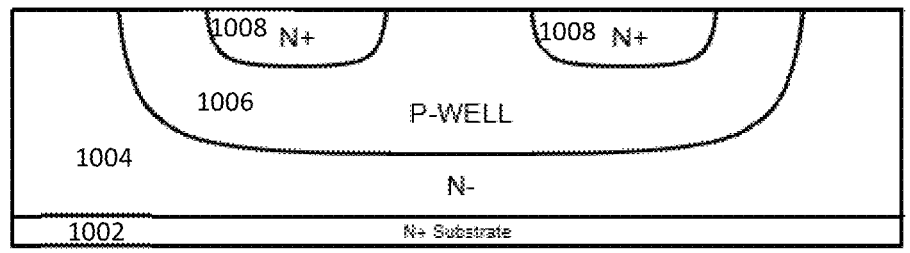
Figure 10H:
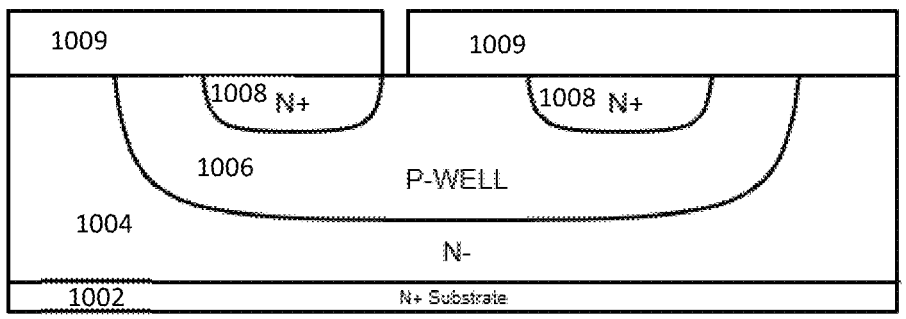
Figure 10I:
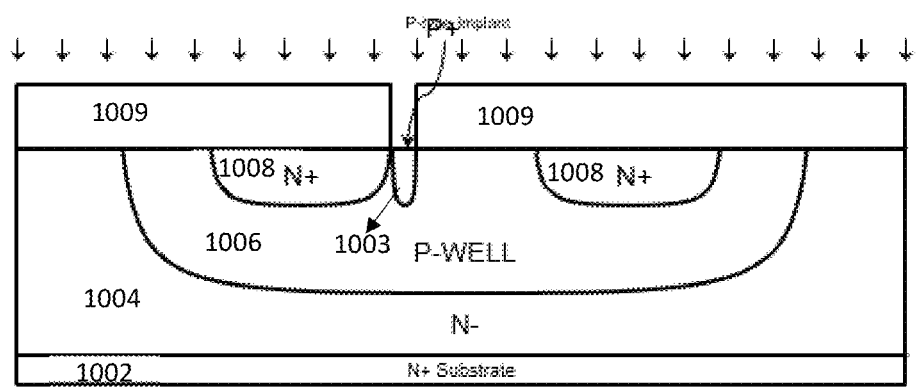
Figure 10J:
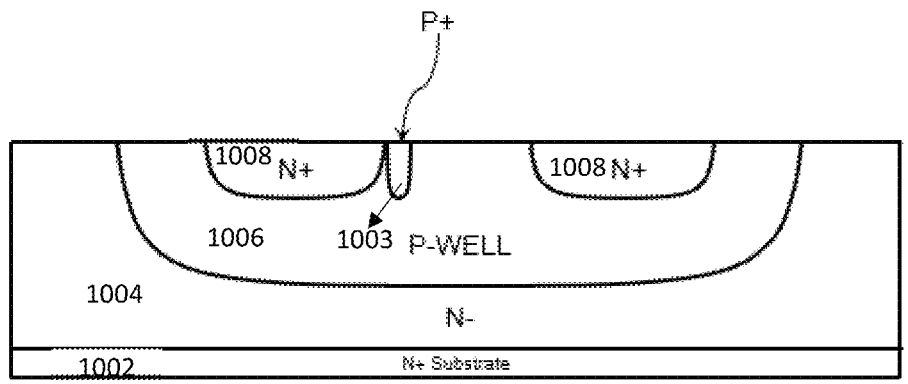
Figure 10K:
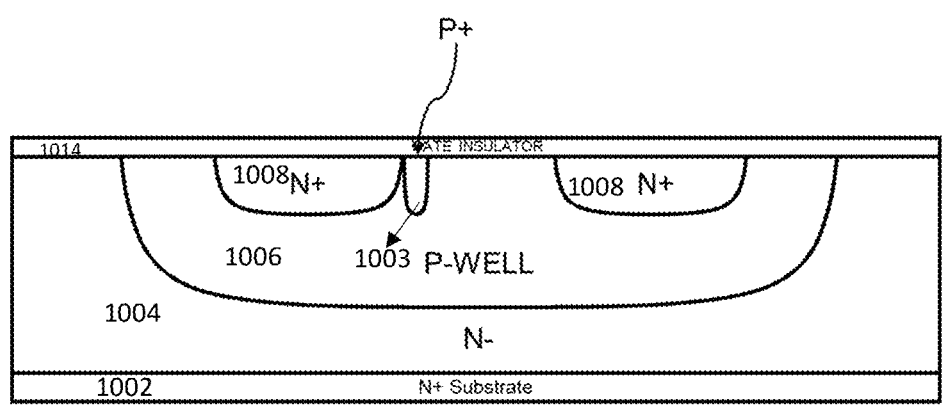
Figure 10L:
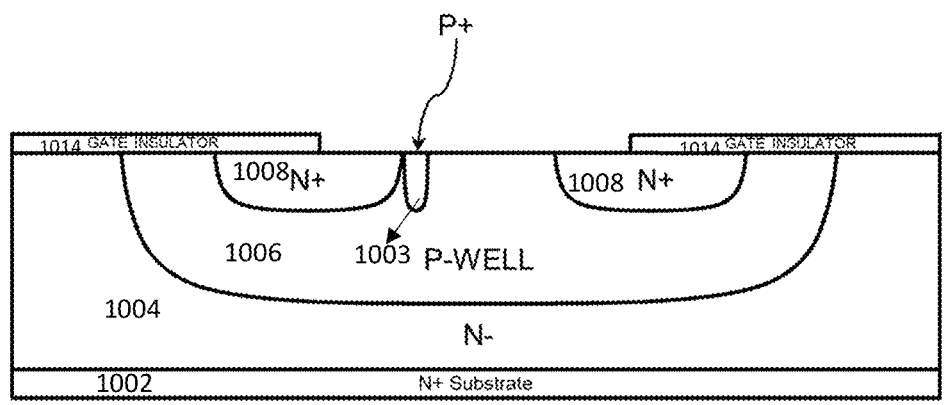
Figure 10M:
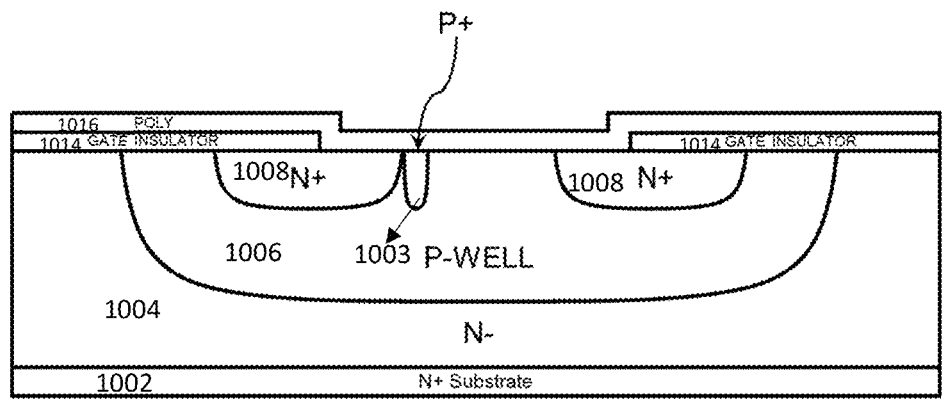
Figure 10N:
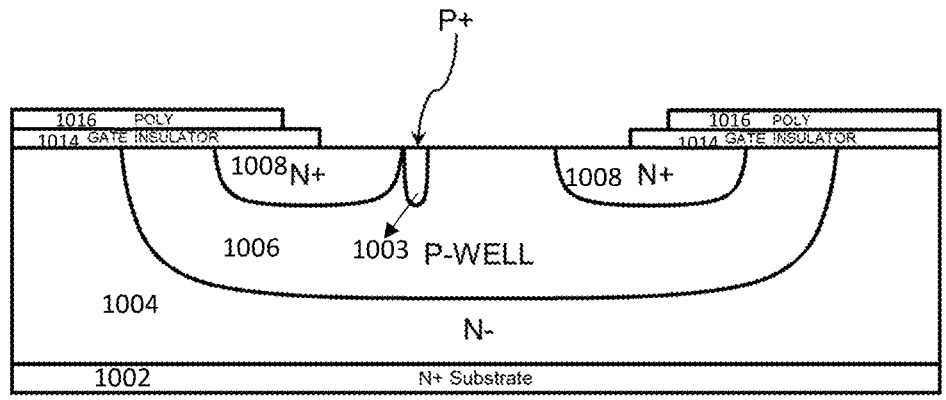
Figure 10O:
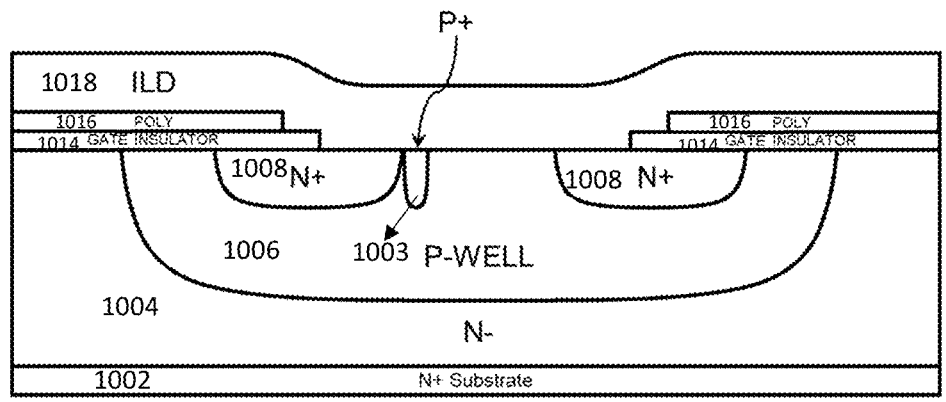
Figure 10P:
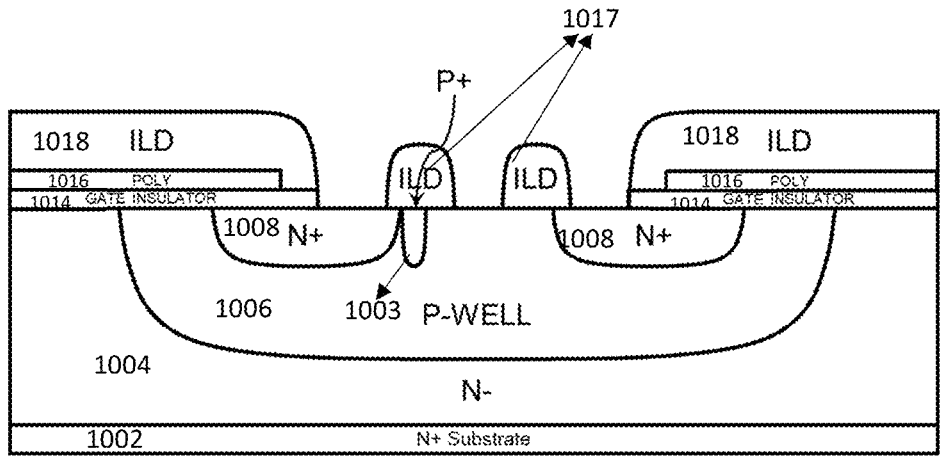
Figure 10Q:
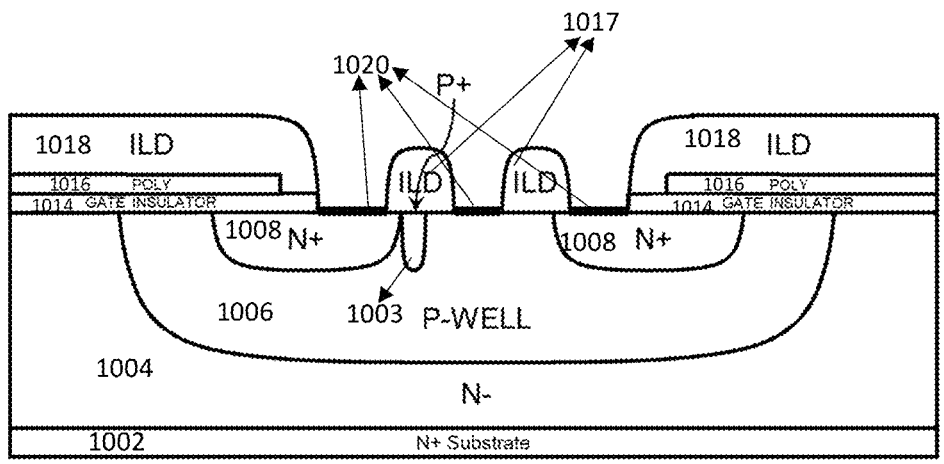
Figure 10R:
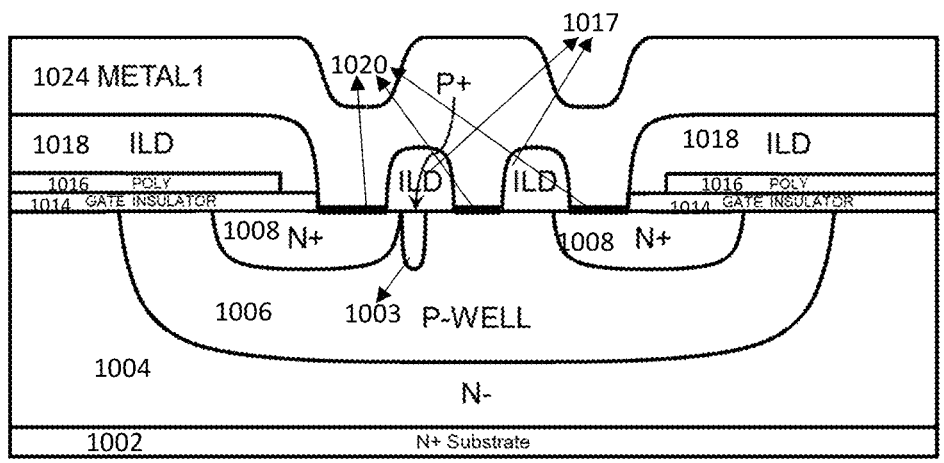
Figure 10S:
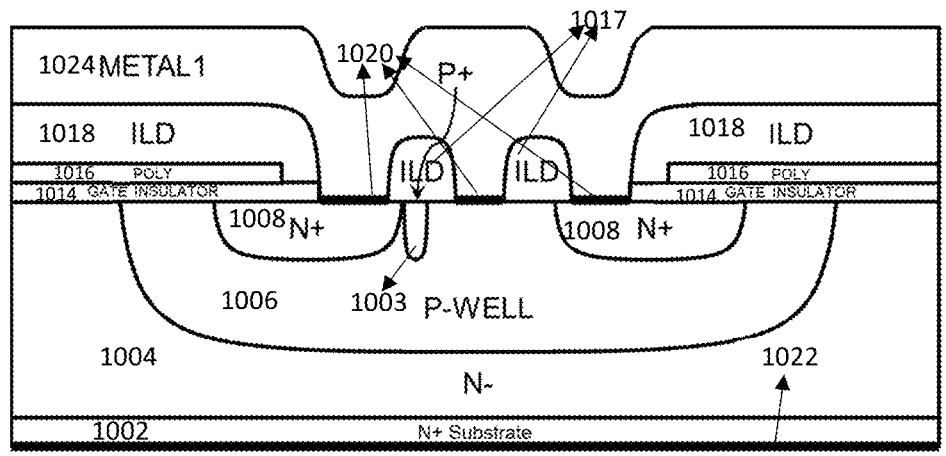
Figure 10T:
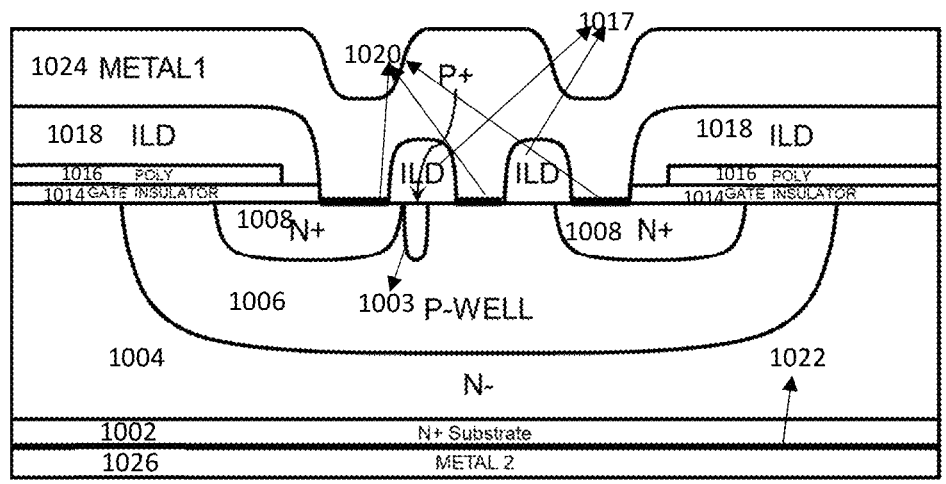

FIGS. 10*a*-10*t* illustrate an embodiment of a process of manufacturing the DMOSFET structure shown in FIG. 8*b*. The process of manufacturing the DMOSFET structure (shown in FIG. 10*a*) comprises preparing a silicon carbide (SiC) substrate having a N+ substrate 1002 and a N-drift layer 1004 as shown in FIG. 10*a*. The N− drift layer 1004 of the SiC substrate is epi-grown and prepared such that a doping concentration and a thickness of the N− drift layer 1004 are selected primarily based on blocking voltage and forward conduction loss. The N+ substrate 1002 is highly conductive when compared to the N− drift layer 1004 and the N+ substrate 1002 is in direct contact with the N− drift layer 1004. A first patterned hard mask layer 1005 is formed on top of the SiC substrate as shown in FIG. 10*b*. The first patterned hard mask layer 1005 is thick enough for completely blocking high energy impurities during implantation. In an embodiment, the first patterned hard mask layer 1005 is a hard mask of at least one of oxide, nitride and a polysilicon layer.

A first p-type ion implantation is formed in FIG. 10*c* through the first patterned hard mask layer 1005 to form a p-well region 1006. In an embodiment, the first p-type ion implantation is performed with one or more p-type impurities (e.g. aluminum, boron, etc.). In another embodiment, first p-type ion implantation may comprise a screen oxide layer. The first patterned hard mask layer 1005 is then removed, after the first p-type ion implantation, by at least one of dry etching process and wet etching process as shown in FIG. 10*d*. A second patterned hard mask layer 1007 is then formed on the top of the SiC substrate as shown in FIG. 10*e* for subsequent ion implantation. The second patterned hard mask layer 1007 is a photoresist based material and thick enough for preventing any unwanted high energy impurities particles penetrating the second patterned hard mask layer 1007. A first n-type ion implantation is formed through the second patterned hard mask layer 1007 to form a N+ source region 1008 within the p-well region 1006 as shown in FIG. 10*f*. In an embodiment, the first n-type ion implantation is performed with one or more n-type impurities (e.g. nitrogen, phosphorous etc.). The second patterned hard mask layer 1007 is then removed after the first n-type ion implantation by at least one of dry etching and wet etching process as shown in FIG. 10*g*.

A third patterned hard mask layer 1009 is then formed on top of the SiC substrate as shown in FIG. 10*h*. A second p-type implantation is performed through the third patterned hard mask layer 1009 to form a P+ region 1003, at a second location, within the p-well region 1006 as shown in FIG. 10*i*.

The third patterned hard mask layer 1009 is then removed as shown in FIG. 10*j* by at least one of a dry etching and a wet etching process once the P+ region 1003 is formed at the second location. The SiC substrate undergoes thermal activation annealing with a carbon-based protection coating at a predefined temperature. In an embodiment, the predefined temperature for performing the thermal activation annealing is 1700-degree Celsius. The SiC substrate then may undergo an additional ion implantation for forming a current spreading layer to improve on-state resistance. Ion implantations (e.g. the first p-type implantation, the first n-type impanation, the second p-type implantation, edge termination implantation, current spreading layer implantation etc.) undergone by the SiC substrate is performed prior to the thermal activation annealing step. The carbon-based protection coating is then removed from the SiC substrate. The SiC substrate then undergoes a sacrificial oxide growth and subsequently the sacrificial oxide removal. An active region of the SiC DMOSFET is then patterned by forming and patterning field oxide layer on the SiC substrate.

A gate insulator 1014 is then formed on top of the SiC substrate as shown in FIG. 10*k*. The gate insulator 1014 is then patterned as shown in FIG. 10*l*. A polysilicon layer 1016 is then formed on top of the SiC substrate as shown in FIG. 10*m*. The polysilicon layer 1016 is then patterned as shown in FIG. 10*n*. Contacts for the polysilicon layer is kept open for pad metal deposition for forming a gate pad region and one or more gate bus regions. An interlayer dielectric (ILD) 1018 is then formed on top of the SiC substrate as shown in FIG. 10*o*. The interlayer dielectric (ILD) 1018 is then patterned for exposing the portions of the SiC substrate via the openings of the ILD 1018 and leaving one or more ILD bumps 1017 on top of the SiC substrate as shown in FIG. 10*p*. A first silicide layer 1020 is then formed between the one or more ILD bumps 1017 on the exposed portions of top of the SiC substrate for forming a first Ohmic contact as shown in FIG. 10*q*. In an embodiment, the first silicide layer 1020 is a nickel-based silicide layer. In another embodiment, the nickel-based silicide is formed by Nickel deposition on the top of the SiC substrate, thermal activation annealing of the deposited Nickel for silicide formation, and removal of any un-reacted Nickel from the SiC substrate. A first pad metal 1024 is formed on top of the SiC substrate as shown in FIG. 10*r*. The P+ region 1003, formed at the second location, is under the one or more ILD bumps 1017 and do not form any direct contact with the first silicide layer 1020.

A second silicide layer 1022 is then formed on bottom of the SiC substrate for forming a second Ohmic contact as shown in FIG. 10*s*. In an embodiment, the second silicide layer 1022 is then formed on back of the SiC substrate for forming the second Ohmic contact. In an embodiment, the second silicide layer 1022 is also the nickel-based silicide layer. A second pad metal 1026 is then formed on bottom of the second silicide layer 1022 of the SiC substrate as shown in FIG. 10*t*. In an embodiment, the second pad metal formation is performed by at least one of e-beam and sputtering.

A fourth patterned hard mask layer 1011 is then formed on the SiC substrate once the first Ohmic contact and the second Ohmic contact are formed on topside and bottom side/back side of the SiC substrate respectively. The fourth patterned hard mask layer 1011 is formed for selectively removing the exposed portions of the ILD layer 1018 and depositing a metal region 1028 (e.g. a Schottky metal region 1028) (shown in FIGS. 8*d*, 8*e* & 8*f*) on top of the SiC substrate. The fourth patterned hard mask layer 1011 is used for both etching the portion of the ILD layer 1018 and lifting off the Schottky metal region 1028 when Schottky metal is deposited. The Schottky metal region 1028 is in direct contact with the N− drift layer 1004 and bridge two adjacent P-well regions 1006 (i.e. bridges the adjacent unit cells). The Schottky metal region 1028 is then annealed with a predefined thermal budget for forming a Schottky metal contact between the Schottky metal region 1028 and the portion of the N− drift layer 1004 exposed at the top surface of the SiC substrate. In an embodiment, the predefined thermal budget ranges from 55° C. to 1100° C. In FIGS. 8*d*, 8*e* & 8*f*, the first pad metal and the second pad metal formation are performed once the Schottky metal region 1028 formation is completed.

Figure 11A:
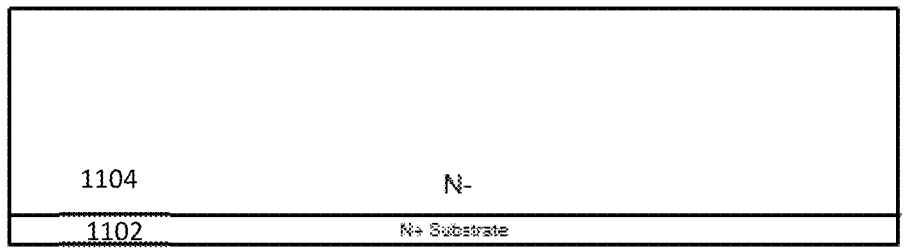
FIG. 11a-11t illustrate an embodiment of a process of manufacturing the DMOSFET structure shown in FIG. 8c.
Figure 11B:
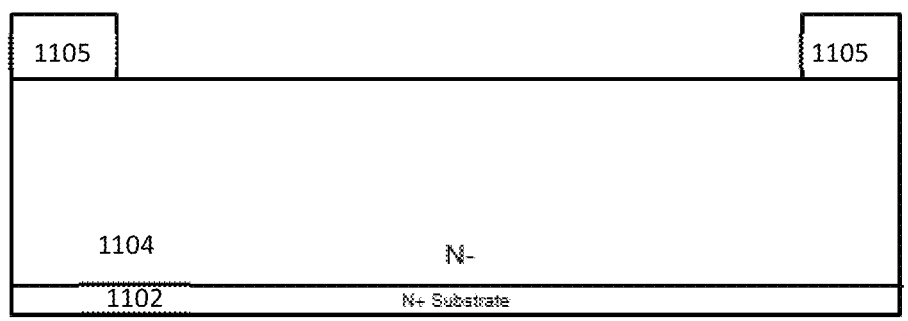
Figure 11C:
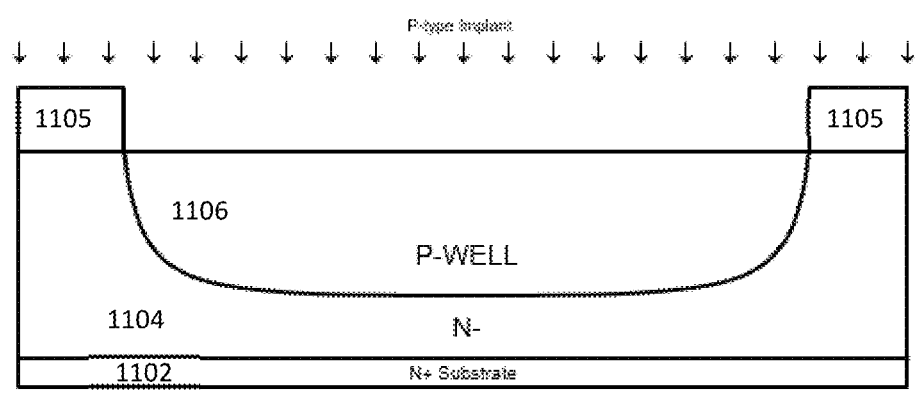
Figure 11D:
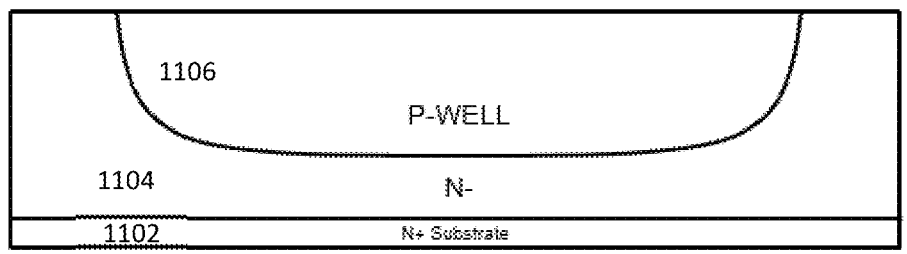
Figure 11E:
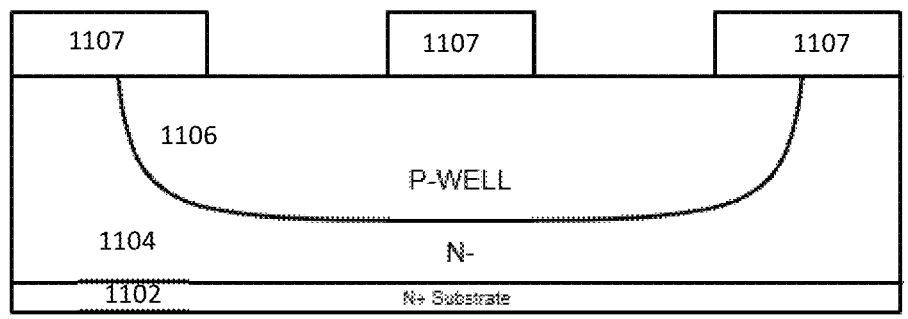
Figure 11F:
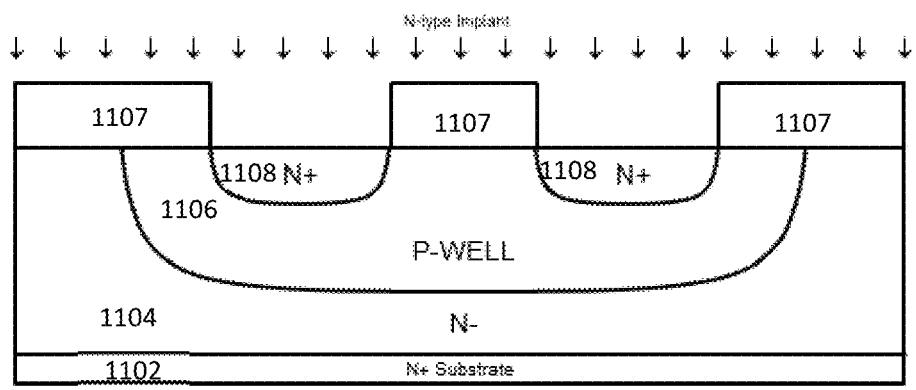
Figure 11G:
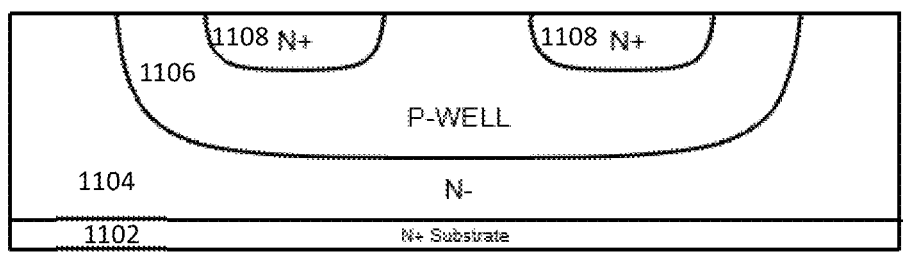
Figure 11H:
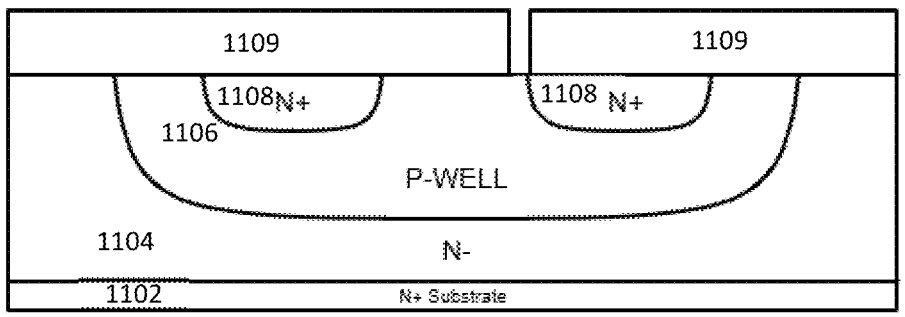
Figure 11I:
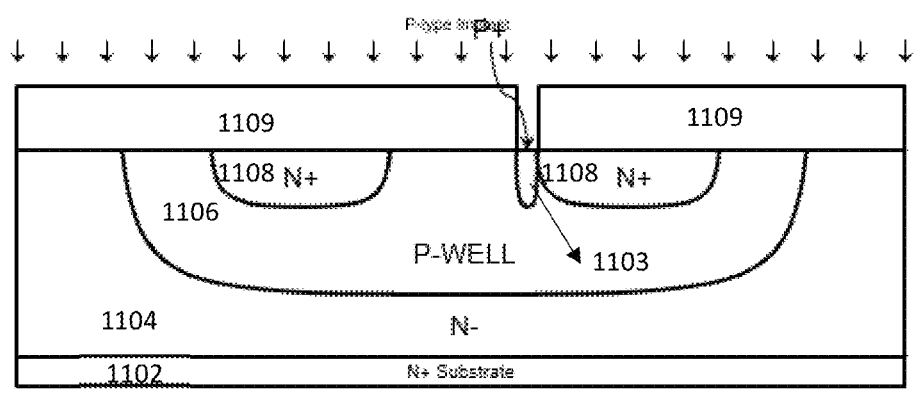
Figure 11J:
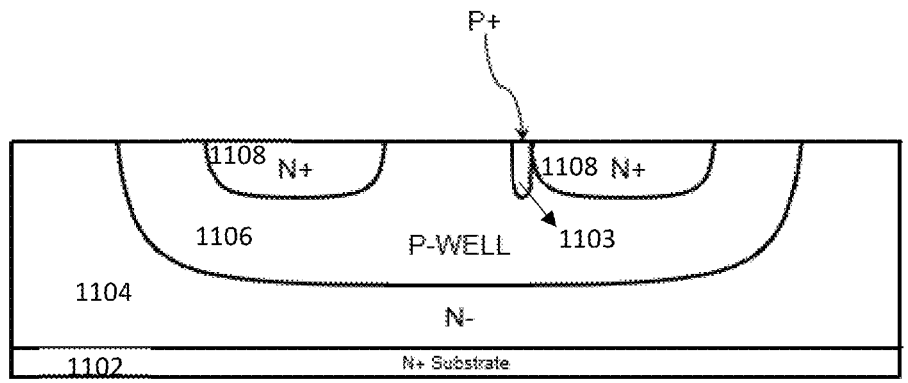
Figure 11K:
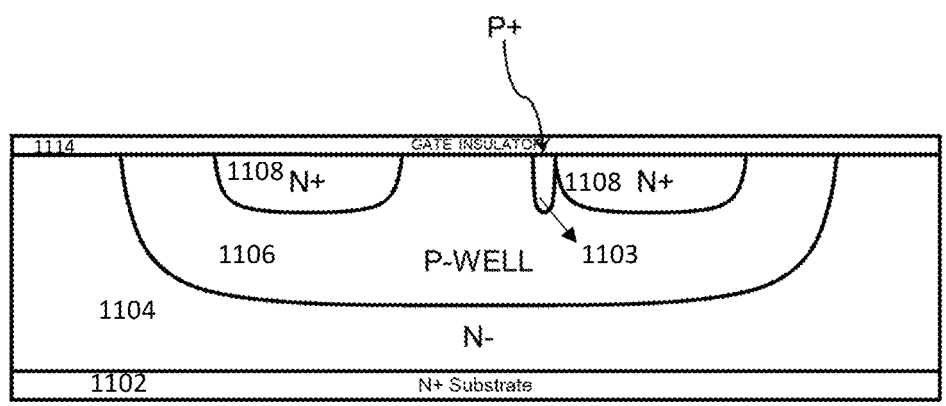
Figure 11L:
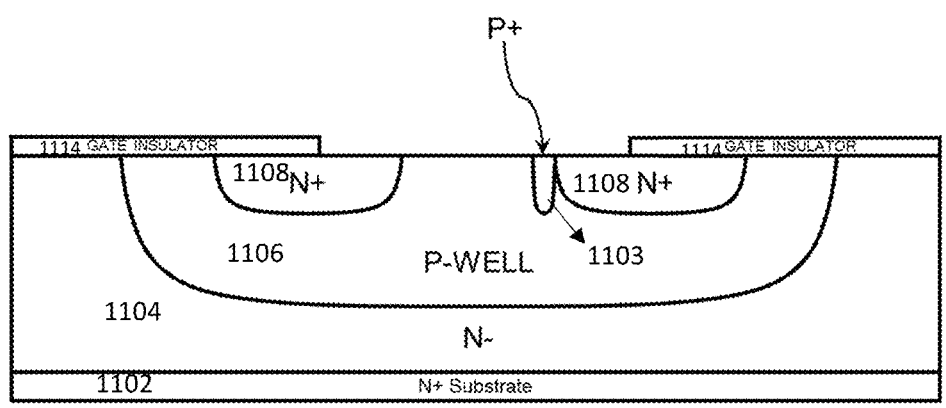
Figure 11M:
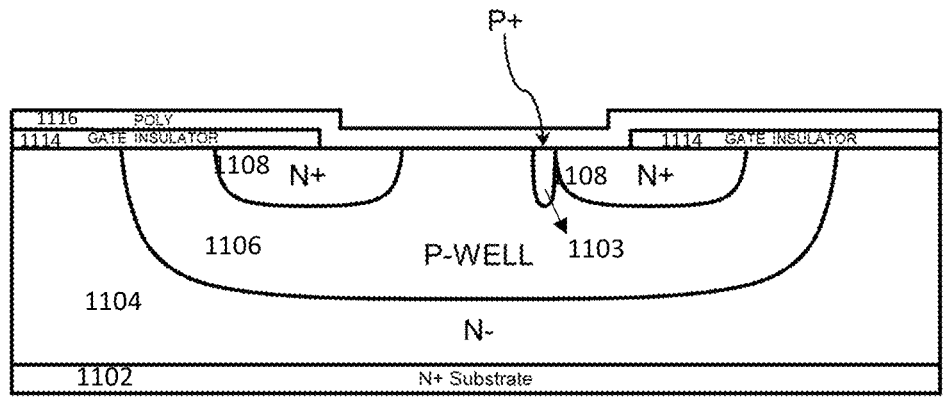
Figure 11N:
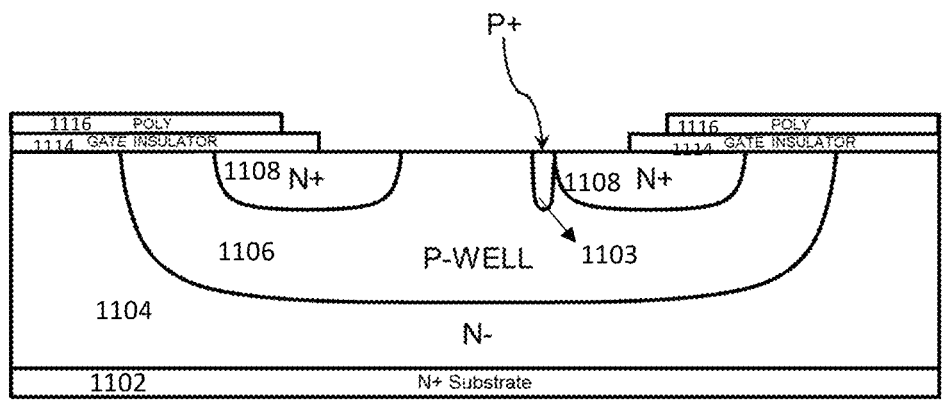
Figure 11O:
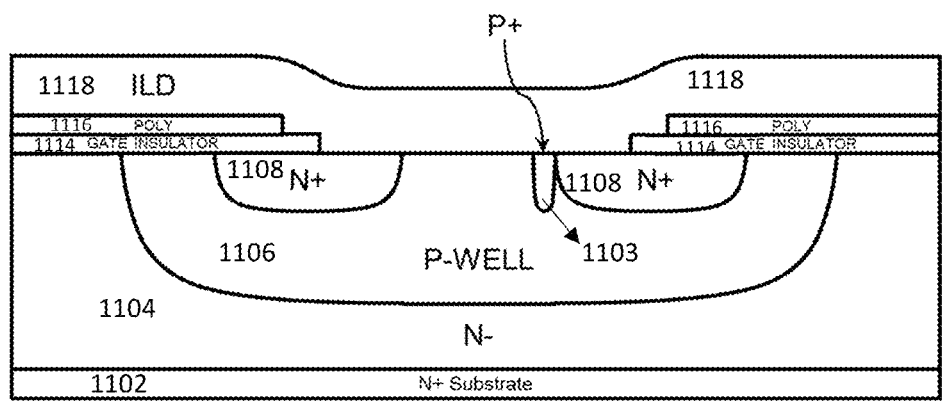
Figure 11P:
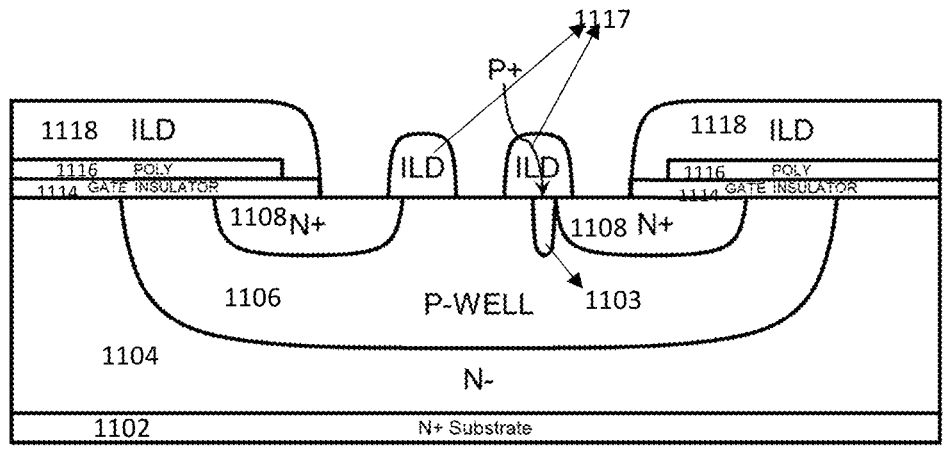
Figure 11Q:
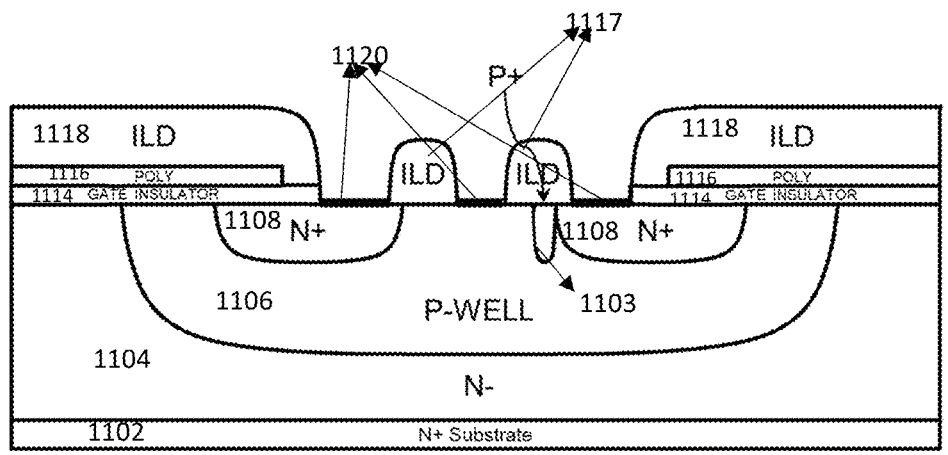
Figure 11R:
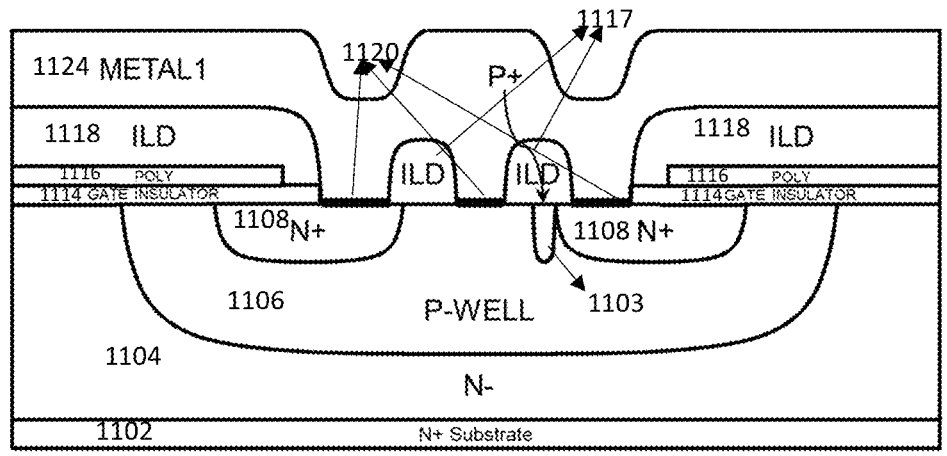
Figure 11S:
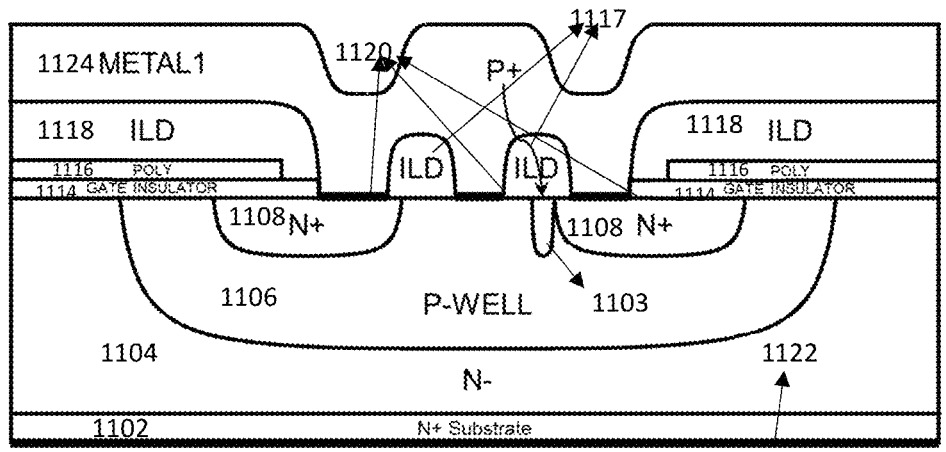
Figure 11T:
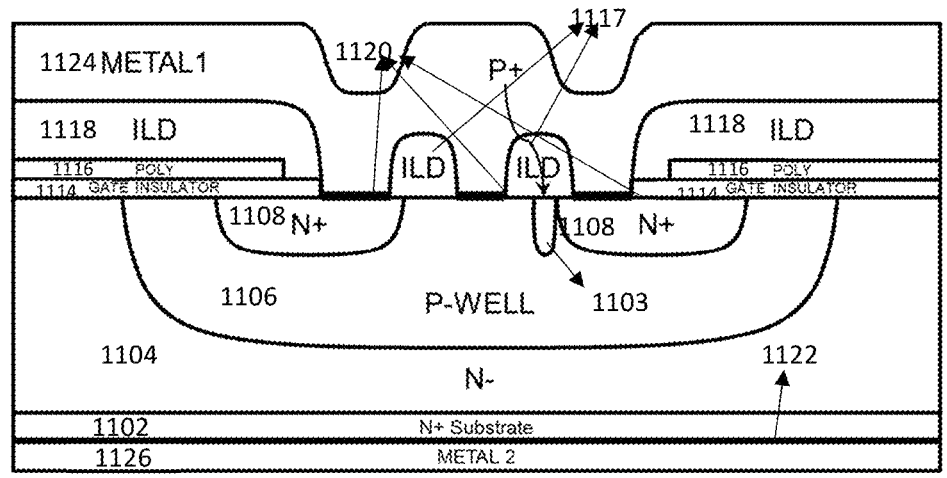

FIG. 11*a*-11*t* illustrate an embodiment of a process of manufacturing the DMOSFET structure shown in FIG. 8*c*. The process of manufacturing the DMOSFET structure (shown in FIG. 11*a*) comprises preparing a silicon carbide (SiC) substrate having a N+ substrate 1102 and a N-drift layer 1104 as shown in FIG. 11*a*. The N− drift layer 1104 of the SiC substrate is epi-grown and prepared such that a doping concentration and a thickness of the N− drift layer 1104 are selected primarily based on blocking voltage and forward conduction loss. The N+ substrate 1102 is highly conductive when compared to the N− drift layer 1104 and the N+ substrate 1102 is in direct contact with the N− drift layer 1104. A first patterned hard mask layer 1105 is formed on top of the SiC substrate as shown in FIG. 11*b*. The first patterned hard mask layer 1105 is thick enough for completely blocking high energy impurities during implantation. In an embodiment, the first patterned hard mask layer 1105 is a hard mask of at least one of oxide, nitride and a polysilicon layer.

A first p-type ion implantation is formed in FIG. 11*c* through the first patterned hard mask layer 1105 to form a p-well region 1106. In an embodiment, the first p-type ion implantation is performed with one or more p-type impurities (e.g. aluminum, boron, etc.). In another embodiment, first p-type ion implantation may comprise a screen oxide layer. The first patterned hard mask layer 1105 is then removed, after the first p-type ion implantation, by at least one of dry etching process and wet etching process as shown in FIG. 11*d*. A second patterned hard mask layer 1107 is then formed on the top of the SiC substrate as shown in FIG. 11*e* for subsequent ion implantation. The second patterned hard mask layer 1107 is a photoresist based material and thick enough for preventing any unwanted high energy impurities particles penetrating the second patterned hard mask layer 1107. A first n-type ion implantation is formed through the second patterned hard mask layer 1107 to form a first N+ source region 1108 within the p-well region 1106 as shown in FIG. 11*f*. In an embodiment, the first n-type ion implantation is performed with one or more n-type impurities (e.g. nitrogen, phosphorous etc.). The second patterned hard mask layer 1107 is then removed after the first n-type ion implantation by at least one of dry etching and wet etching process as shown in FIG. 11g.

A third patterned hard mask layer 1109 is then formed on top of the SiC substrate as shown in FIG. 11h. A second p-type implantation is performed through the third patterned hard mask layer 1109 to form a P+ region 1103, at a third location, within the p-well region 1106 as shown in FIG. 11i.

The third patterned hard mask layer 1109 is then removed as shown in FIG. 11j by at least one of a dry etching and a wet etching process once the P+ region 1103 is formed at the second location. The SiC substrate undergoes thermal activation annealing with a carbon-based protection coating at a predefined temperature. In an embodiment, the predefined temperature for performing the thermal activation annealing is 1700-degree Celsius. The SiC substrate then may undergo an additional ion implantation for forming a current spreading layer to improve on-state resistance. Ion implantations (e.g. the first p-type implantation, the first n-type impanation, the second p-type implantation, edge termination implantation, current spreading layer implantation etc.) undergone by the SiC substrate is performed prior to the thermal activation annealing step. The carbon-based protection coating is then removed from the SiC substrate. The SiC substrate then undergoes a sacrificial oxide growth and subsequently the sacrificial oxide removal. An active region of the SiC DMOSFET is then patterned by forming and patterning field oxide layer on the SiC substrate.

A gate insulator 1114 is then formed on top of the SiC substrate as shown in FIG. 11k. The gate insulator 1114 is then patterned as shown in FIG. 11l. A polysilicon layer 1116 is then formed on top of the SiC substrate as shown in FIG. 11m. The polysilicon layer 1116 is then patterned as shown in FIG. 11n. Contacts for the polysilicon layer is kept open for pad metal deposition for forming a gate pad region and one or more gate bus regions. An interlayer dielectric (ILD) 1118 is then formed on top of the SiC substrate as shown in FIG. 11o. The interlayer dielectric (ILD) 1118 is then patterned for exposing the portions of the SiC substrate via the openings of the ILD 1118 and leaving one or more ILD bumps 1117 on top of the SiC substrate as shown in FIG. 11p. A first silicide layer 1120 is then formed between the one or more ILD bumps 1117 on the exposed portions of top of the SiC substrate for forming one or more first Ohmic contacts as shown in FIG. 11q. In an embodiment, the first silicide layer 1120 is a nickel-based silicide layer. In another embodiment, the nickel-based silicide is formed by Nickel deposition on the top of the SiC substrate, thermal activation annealing of the deposited Nickel for silicide formation, and removal of any un-reacted Nickel from the SiC substrate. A first pad metal 1124 is formed on top of the SiC substrate as shown in FIG. 11r. The P+ region 1103, formed at the third location, is under the one or more ILD bumps 1117 and do not form any direct contact with the first silicide layer 1120.

A second silicide layer 1122 is then formed on bottom of the SiC substrate for forming a second Ohmic contact as shown in FIG. 11s. In an embodiment, the second silicide layer 1122 is then formed on back of the SiC substrate for forming the second Ohmic contact. In an embodiment, the second silicide layer 1122 is also the nickel-based silicide layer. A second pad metal 1126 is then formed on bottom of the second silicide layer 1122 of the SiC substrate. In an embodiment, the second pad metal formation is performed by at least one of e-beam and sputtering.

A fourth patterned hard mask layer 1111 is then formed on the SiC substrate once the first Ohmic contact and the second Ohmic contact are formed on topside and bottom side/back side of the SiC substrate respectively. The fourth patterned hard mask layer 1111 is formed for selectively removing the exposed portions of the ILD layer 1118 and depositing a metal region 1128 (i.e. a Schottky metal region 1128) shown in FIGS. 8d, 8e & 8f on top of the SiC substrate. The fourth patterned hard mask layer 1111 is used for both etching the portion of the ILD layer 1118 and lifting off the Schottky metal region 1128 when Schottky metal is deposited. The Schottky metal region 1128 is in direct contact with the top of the N– drift layer 1104 and bridge two adjacent P-well regions 1106 (i.e. bridges the adjacent unit cells). The Schottky metal region 1128 is then annealed with a predefined thermal budget for forming a Schottky metal contact between the Schottky metal region 1128 and the portion of the N– drift layer 1104 exposed at the top surface of the SiC substrate. In an embodiment, the predefined thermal budget ranges from 55° C. to 1100° C. In FIGS. 8d, 8e & 8f, the first pad metal and the second pad metal formation are performed once the Schottky metal region 1128 formation is completed.

Figure 12A:
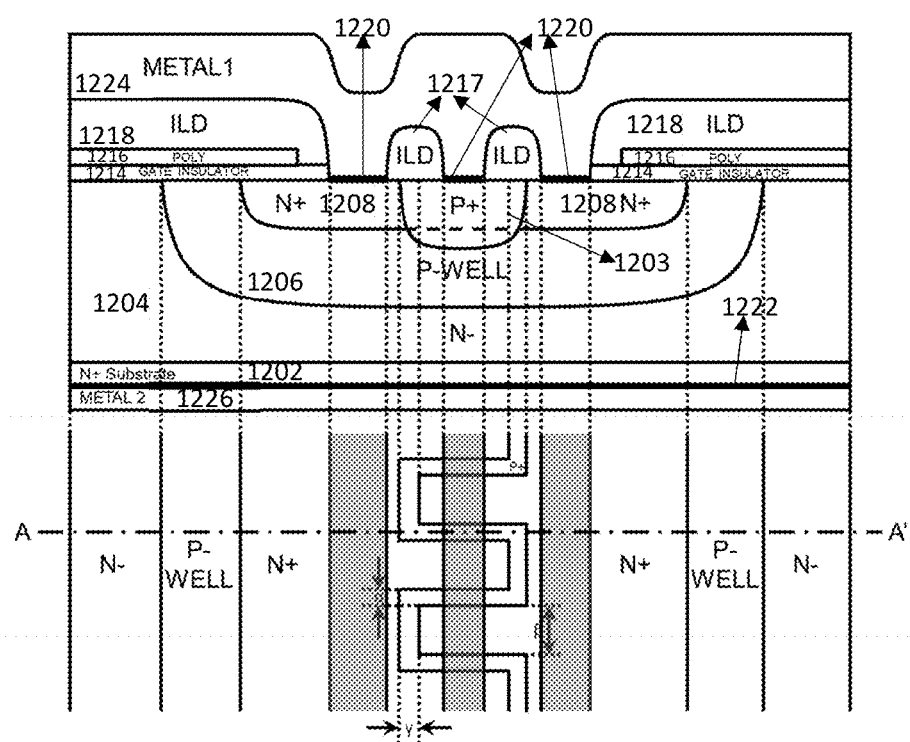
FIGS. 12a-12c illustrate an embodiment of cross sectional structures of a unit cell of a double-implantation metal oxide semiconductor field effect transistor (DMOSFET) comprising a second conductivity type well contact region that meanders at three different locations respectively, allowing a second conductivity type well region to be in contact with a source metal only through the second conductivity type well contact region.
Figure 12B:
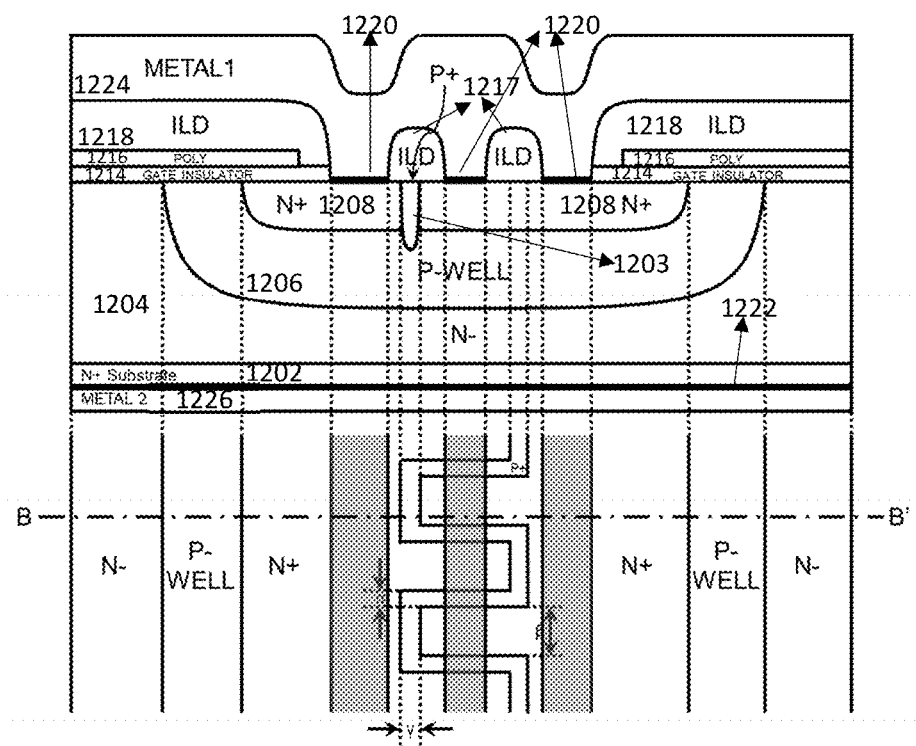
Figure 12C:
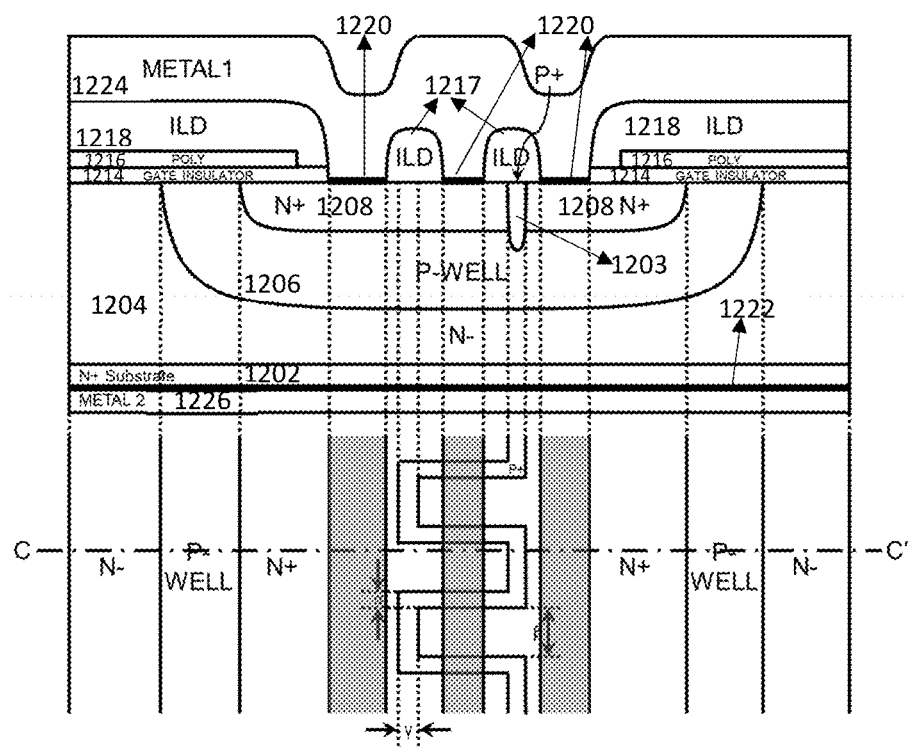

FIGS. 12a-12c illustrate an embodiment of cross sectional structures of a unit cell of a double-implantation metal oxide semiconductor field effect transistor (DMOSFET) comprising a second conductivity type well contact region that meanders at three different locations respectively, allowing a second conductivity type well region to be in contact with a source metal only through the second conductivity type well contact region. The DMOSFET shown in FIGS. 12a, 12b and 12c is a n-type planar gate SiC DMOSFET. In an embodiment, the DMOSFET is a p-type planar gate DMOSFET. The DMOSFET (shown in FIGS. 12a, 12b and 12c) comprises a Silicon Carbide (SiC) substrate. The SiC substrate comprises a N+ substrate 1202 and a N– drift layer 1204. The DMOSFET also comprises a P-well region 1206, a N+ source region 1208 and a P+ region 1203 (i.e. the second conductivity type well contact region). The N+ source regions 1208 is formed within the P-well region 1206. The P+ region 1203 is meandering within the P-well region 1206 by performing a p-type implantation. The P+ region 1203 comprise a periodic spacing with the successive P+ region 1203 (i.e. non-contiguous). Further the lateral extent of the P+ region 1203 varies with a non-zero value in a direction orthogonal to the unit cell. The meandering P+ region 1203 periodically forms ohmic contacts to a first pad metal 1224 (e.g. the source metal) via a first silicide layer 1220 between two interlayer dielectric (ILD) bumps 1217 located between metal oxide semiconductor gate stack and the first pad metal 1224. The P-well region 1206 contacts with the first pad metal 1224 (e.g. the source metal) only through the meandering P+ region 1203. The P-well region 1206 do not have a direct contact with the first pad metal 1224. The meandering P+ region 1203 follows Zigzag path, where corners of the zigzag path is right angled. The Zigzag path of the meandering P+ region 1203 comprises dimensions α, β, and γ. The meandering P+ region 1203 comprise a target size and a target spacing between adjacent junction points located between the meandering P+ region 803. Contact resistance to the first pad metal 1224 (e.g. the source metal) varies when the P+ region 1203 under the ILD bumps 1217 do not have direct contact with the first pad metal 1224 and when the P+ region 1203 have direct contact with the first pad metal 1224 through the first silicide layer 1220. The portions of the meandering P+ region 1203 which are directly under the ILD bumps 1217 functions as networks of distributed ballast resistors and provides an additional source resistance to the source contact resistance. The additional contact resistance provided directly impacts the differential on-resistance of one or more body diode regions of the DMOSFET. Since, the p-well region 1206 contacts the first pad metal 1224 only through the meandering P+ region 1203, flow of carriers is confined within the meandering P+ region 1203. The confined flow of carriers increases source contact resistance of each ballast resistor network and further impacts differential on-resistance of the one or more body diode regions of the DMOSFET. Since the source contact resistance is dependent on the sizing, the spacing between adjacent junction points located between the meandering P+ region 1203, and the silicide region between the adjacent ILD bumps 1217, the source contact resistance is tuned by sizing the P+ region 1203 to a target size and controlling the spacing to a target spacing. In an embodiment, the target size ranges from 10 nm to 10 μm. In another embodiment, the target spacing ranges from 10 nm to 10 μm. Say for a first instance, when width (a) of the meandering P+ region is reduced, the resistance of each ballast resistor network is increased which degrades the differential on-resistance of the body diode regions. The reduction of the width (a) also shrinks the area where the Ohmic contacts are formed so degrades the differential on-resistance of the body diode regions. Say for a second instance, when spacing (γ) between the meandering P+ region is increased, the resistance of each ballast resistor network is increased which degrades the differential on-resistance of the body diode regions. Say for a third instance, when spacing ((3) between two adjacent junction points between the meandering featured P+ region 1203, and the straight silicide region between two adjacent ILD bumps 1217 is increased, the resistance of each ballast resistor network is increased which degrades the differential on-resistance of the one or more body diode regions.

Figure 12D:
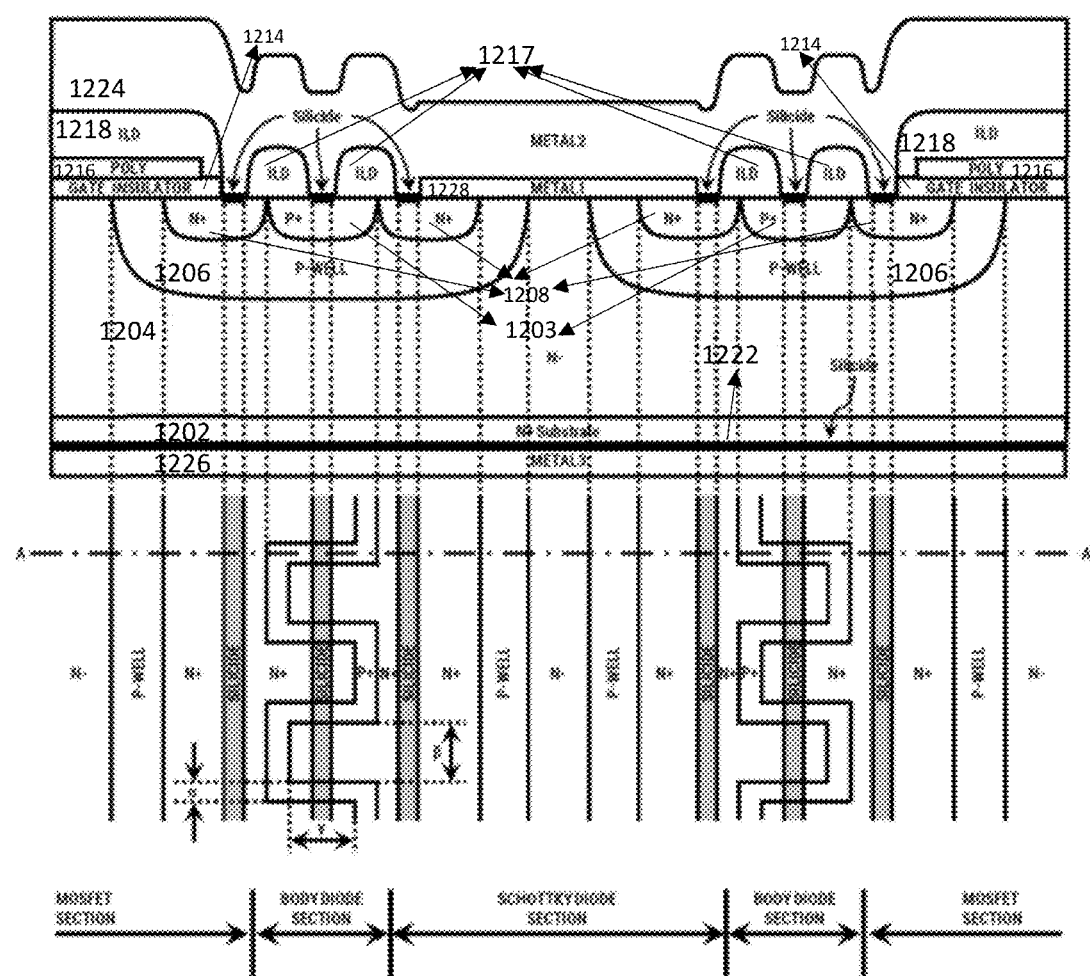
FIGS. 12d-12f illustrate an embodiment of cross sectional structures of one or more unit cells of a diode integrated DMOSFET, each DMOSFET unit cell comprising the second conductivity type well contact region that meanders at three different locations respectively, allowing the second conductivity type well region to be in contact with the source metal only through the second conductivity type well contact region.
Figure 12E:
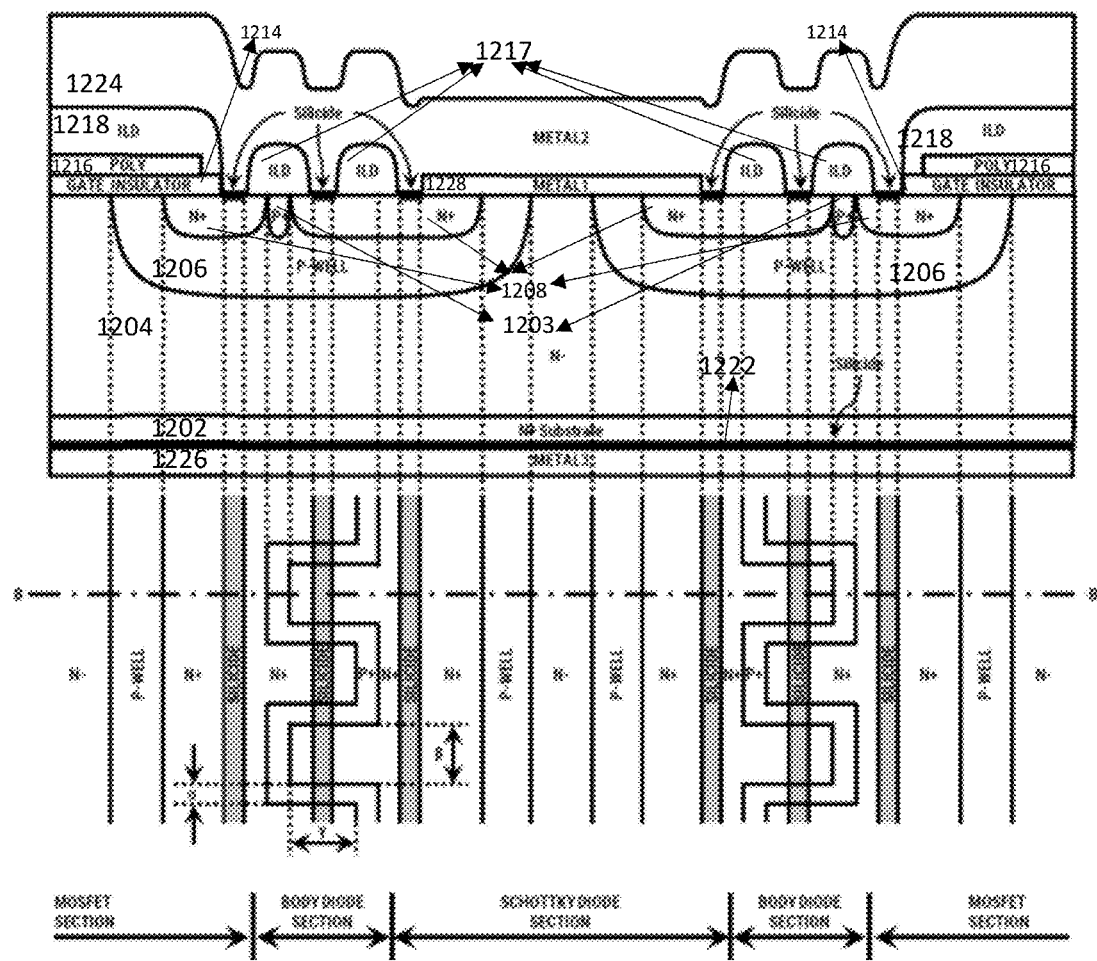
Figure 12F:
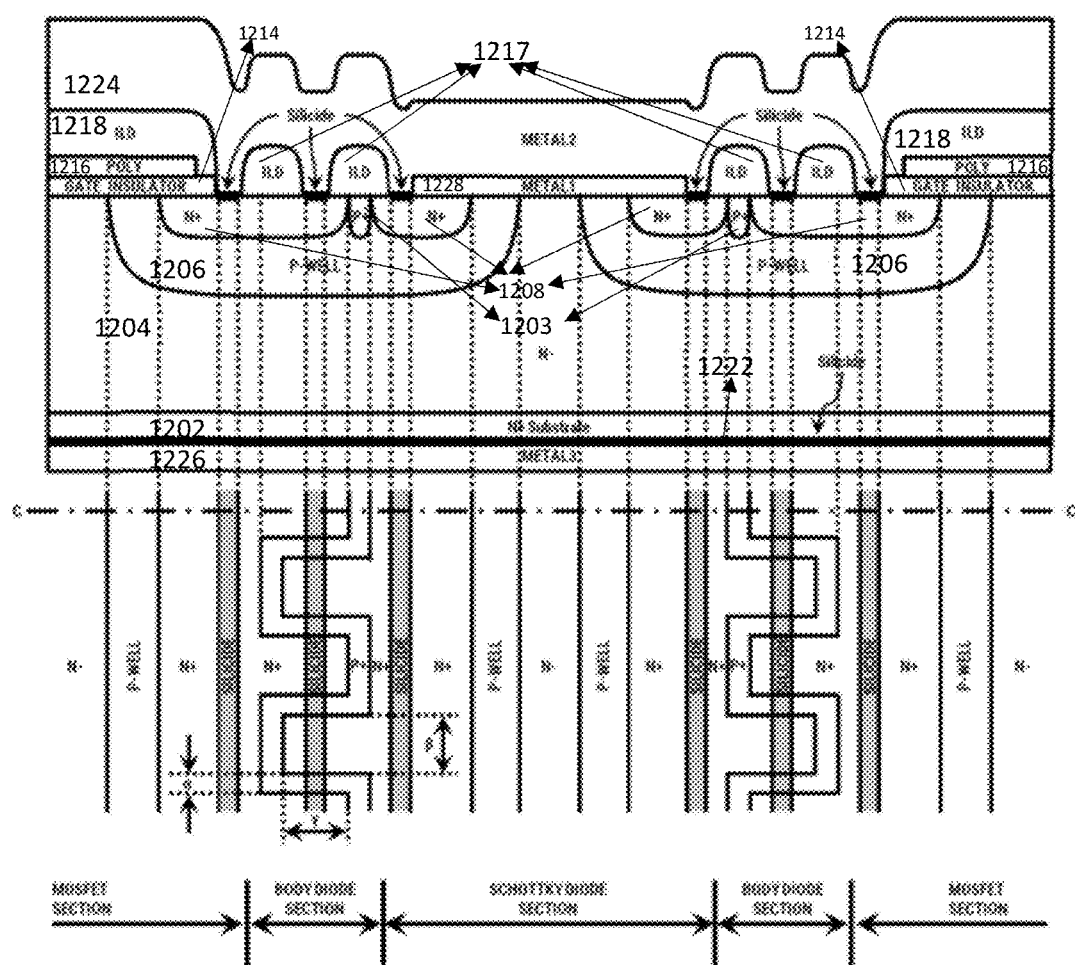

FIGS. 12d-12f illustrate an embodiment of cross sectional structures of one or more unit cells of a diode integrated DMOSFET, each DMOSFET unit cell comprising the second conductivity type well contact region that meanders at three different locations respectively, allowing the second conductivity type well region to be in contact with the source metal only through the second conductivity type well contact region. The DMOSFET (shown in FIGS. 12d, 12e & 12f) is a n-type planar gate SiC DMOSFET. The DMOSFET shown in FIGS. 12d, 12e & 12f operates in a similar way to FIGS. 12a, 12b & 12c. In addition to FIGS. 12a, 12b & 12c, the DMOSFET (shown in FIGS. 12d, 12e & 12f) comprises a metal region 1228 (e.g. a Schottky metal region 1228) in direct contact with the N– drift layer 1204 and bridges adjacent P-well regions 1206 of the one or more P-well regions 1206 (i.e. bridges the adjacent unit cells).

Figure 12G:
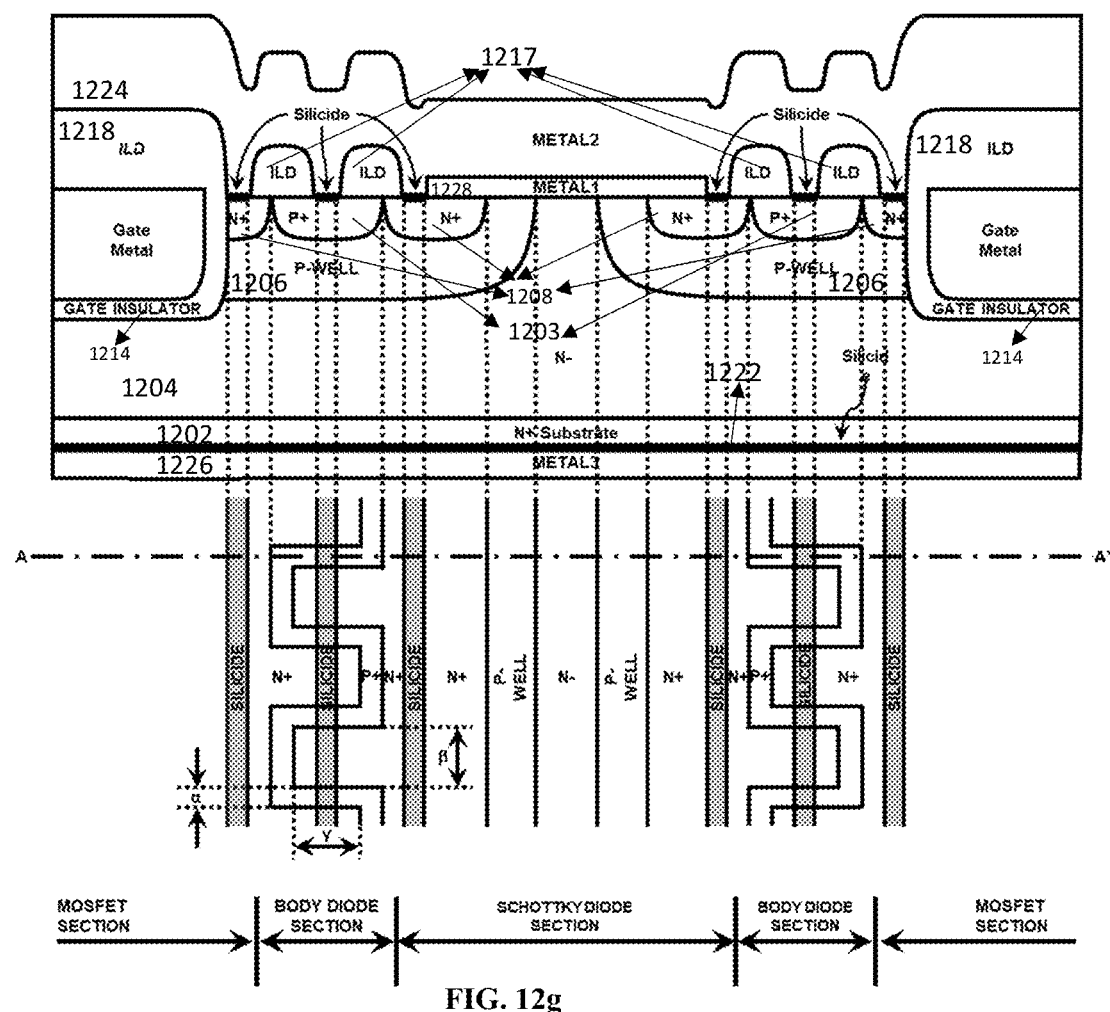
FIG. 12g illustrates an embodiment of a cross sectional structure of one or more unit cells of a diode integrated trench gate MOSFET, comprising one or more unit cells of an integrated Schottky diode, each MOSFET unit cell comprising the second conductivity type well contact region at the first location, allowing the second conductivity type well region to be in contact with the source metal only through the second conductivity type well contact region.

FIG. 12g illustrate an embodiment of a cross sectional structure of one or more unit cells of a diode integrated trench gate MOSFET, comprising one or more unit cells of an integrated Schottky diode, each MOSFET unit cell comprising the second conductivity type well contact region at the first location, allowing the second conductivity type well region to be in contact with the source metal only through the second conductivity type well contact region. The trench gate MOSFET shown in FIG. 12g is a n-type trench gate SiC MOSFET. In an embodiment, the trench gate MOSFET is a p-type trench gate SiC MOSFET. The trench gate MOSFET shown in FIG. 12g operates in a similar way to planar gate MOSFET shown in FIG. 12a and FIG. 12d. The main difference between the trench gate MOSFET and the planar gate DMOSFET is that the trench gate MOSFET comprises one or more trench gate structures instead of one or more planar gate structures. The one or more trench gate structures of the trench gate MOSFET comprises sidewalls that are exposing to the first N+ source region 1208 and the one or more P-well regions 1206. The bottom of the one or more trench gate structures is in vicinity of the bottom of the one or more P-well regions 1206. In an embodiment, the bottom of the one or more trench gate structures is adjusted appropriately depending on electrical properties of the MOSFET device. Each trench gate structure of the trench gate MOSFET comprises a gate insulator as liner along the sidewall and the bottom of the respective trench gate structure. The trench gate MOSFET also comprises the polysilicon layer that fills each gate-insulator lined trenches and serves as gate electrode. The trench gate MOSFET further comprises the interlayer dielectric (ILD) 1218 over each polysilicon layer to open short circuitry between the first pad metal 1224 (e.g. the source metal) and the gate electrode.

Figure 13A:
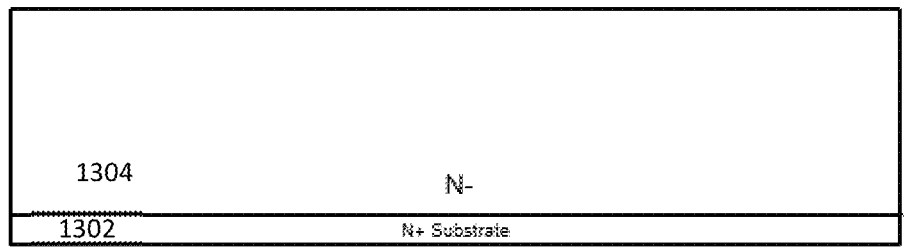
Figure 13B:
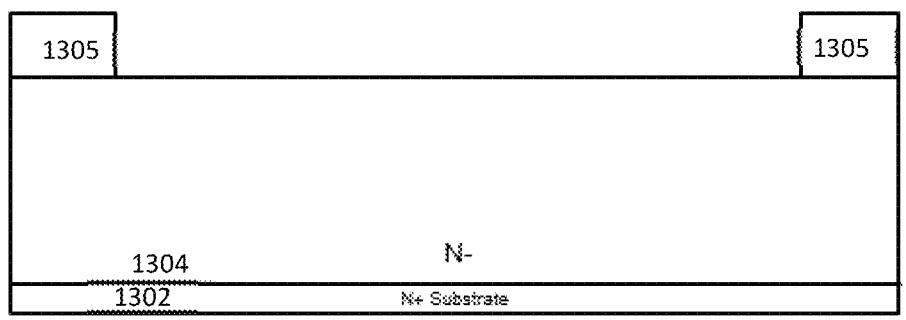
Figure 13C:
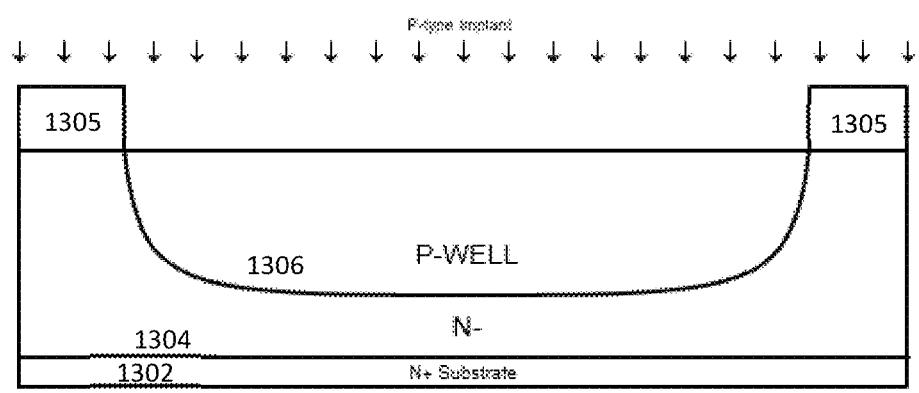
Figure 13D:
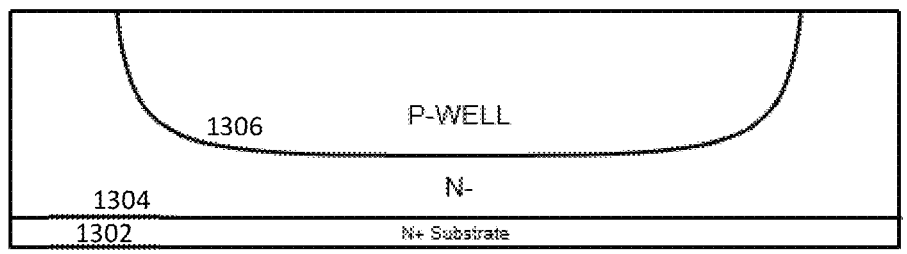
Figure 13E:
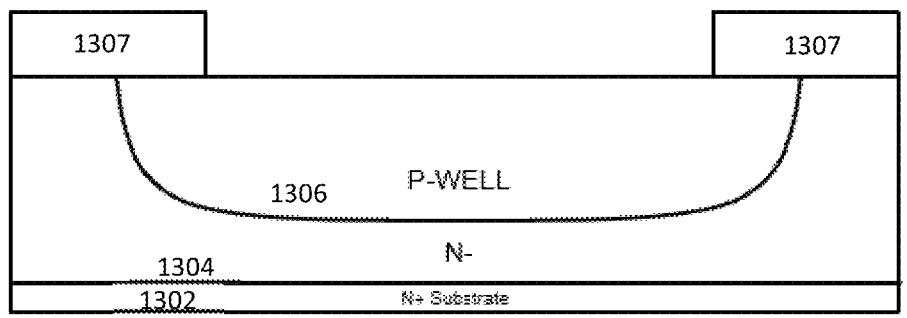
Figure 13F:
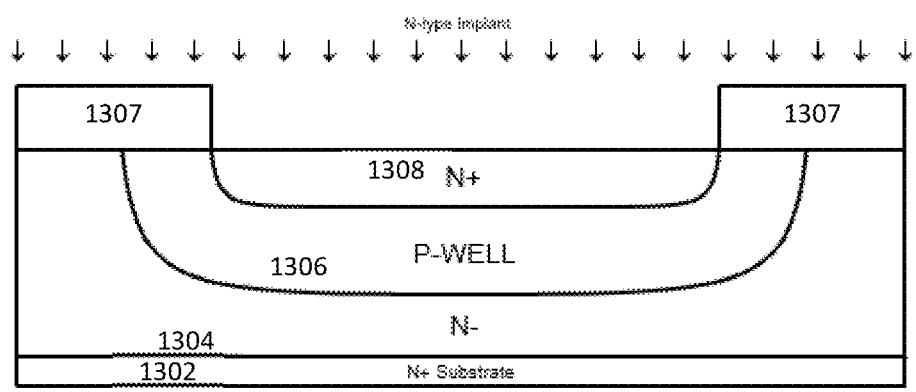
Figure 13G:
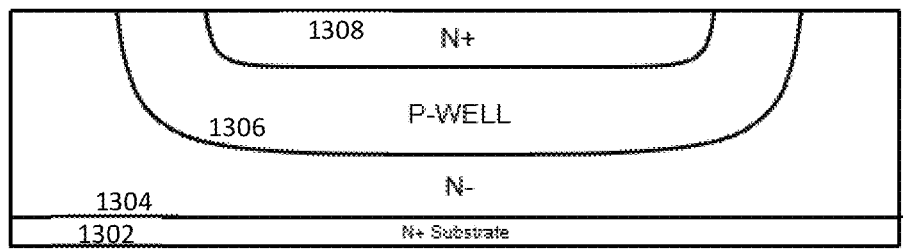
Figure 13H:
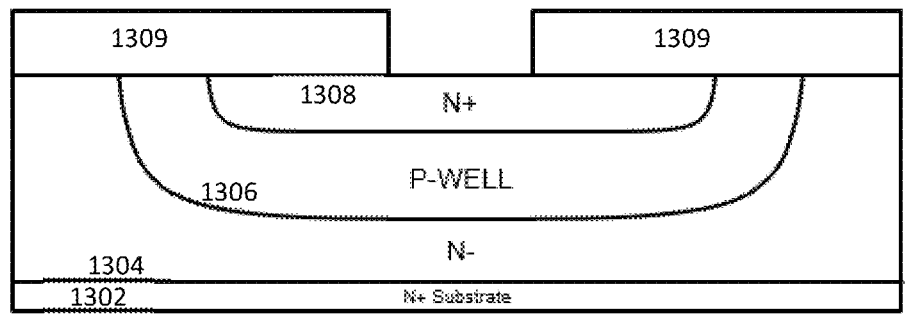
Figure 13I:
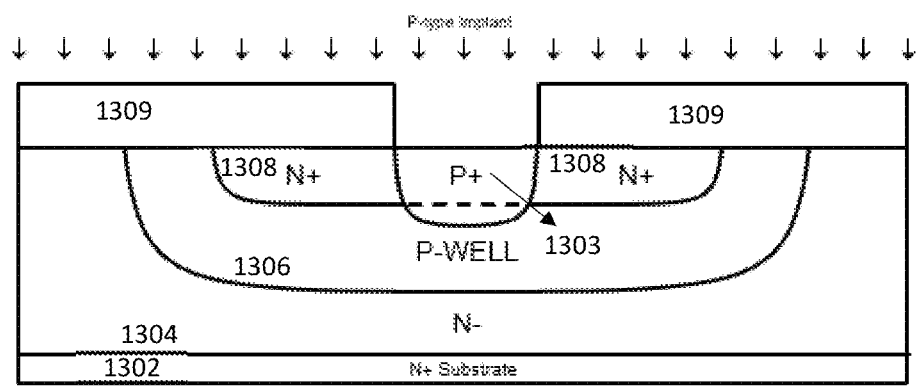
Figure 13J:
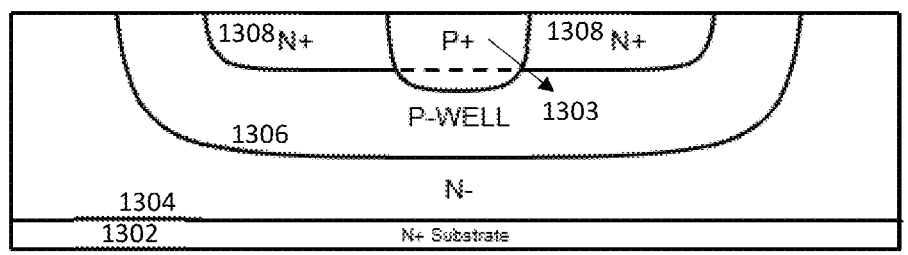
Figure 13K:
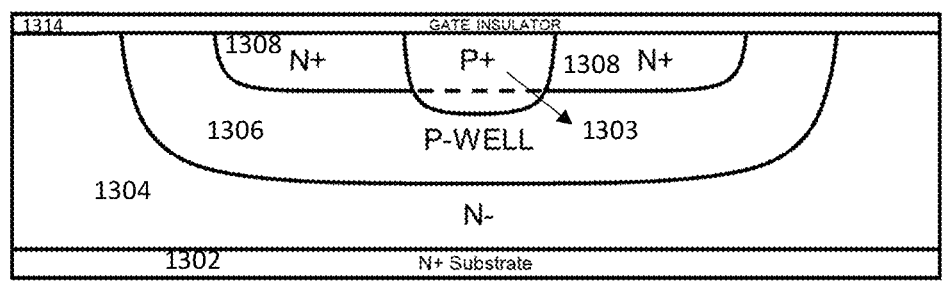
Figure 13L:
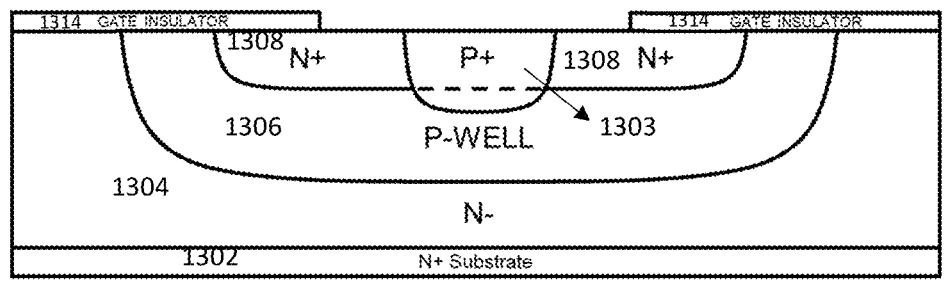
Figure 13M:
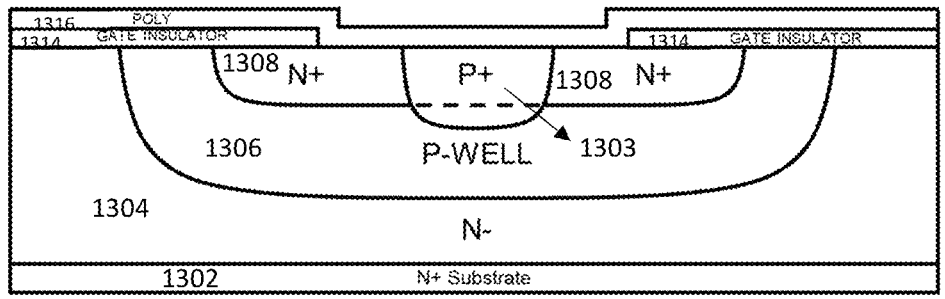
Figure 13N:
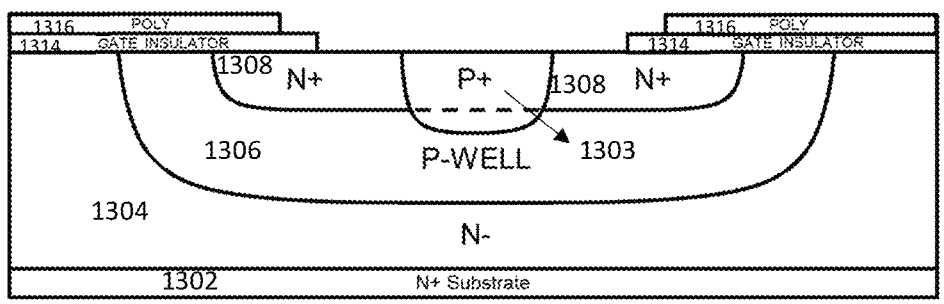
Figure 13O:
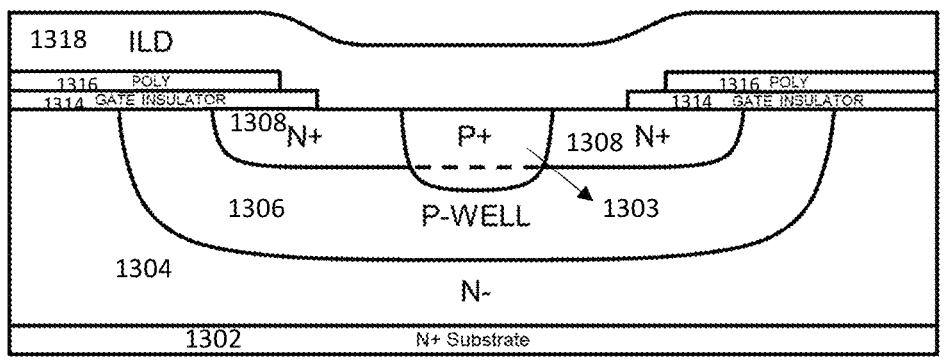
Figure 13P:
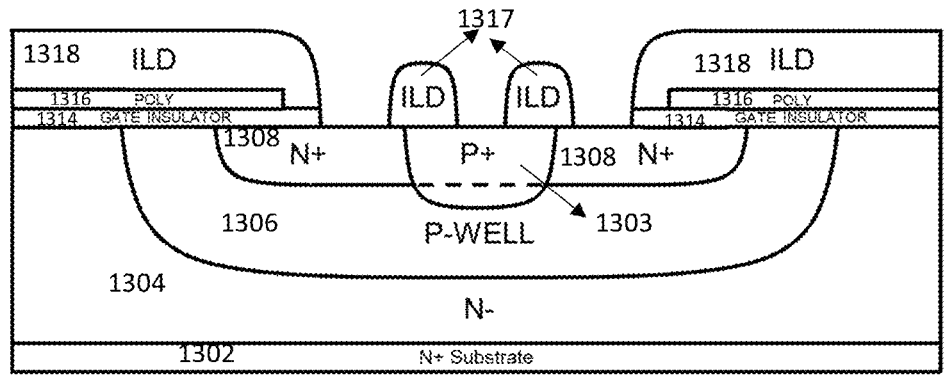
Figure 13Q:
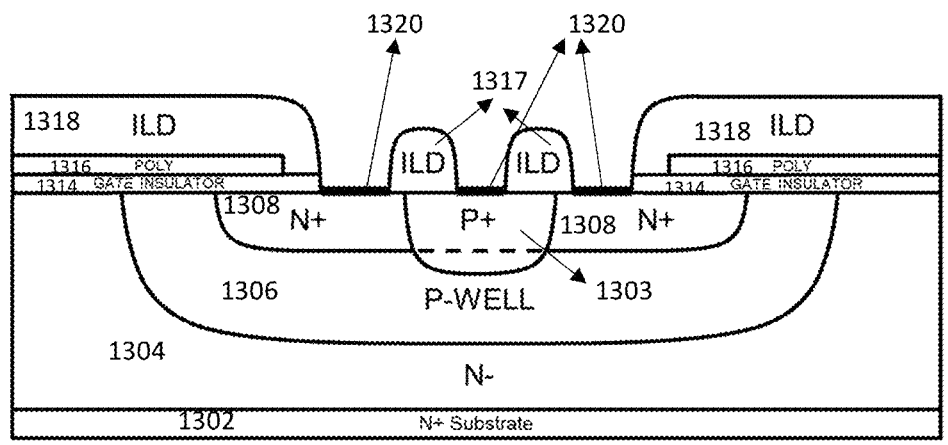
Figure 13R:
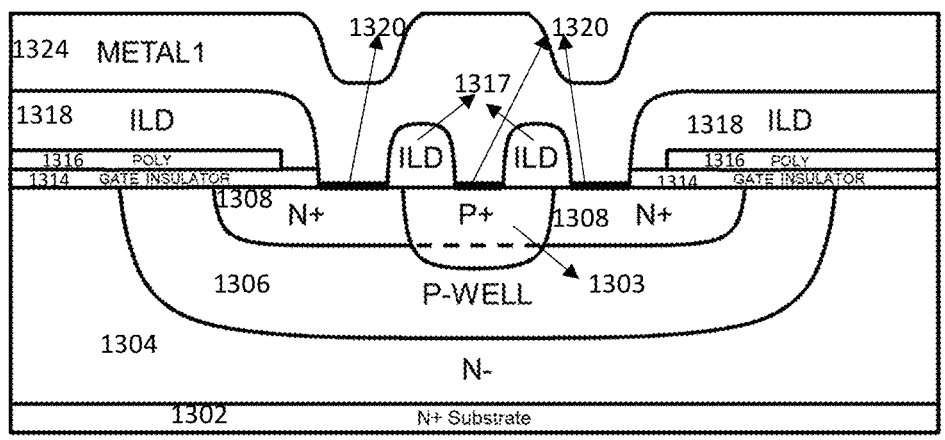
Figure 13S:
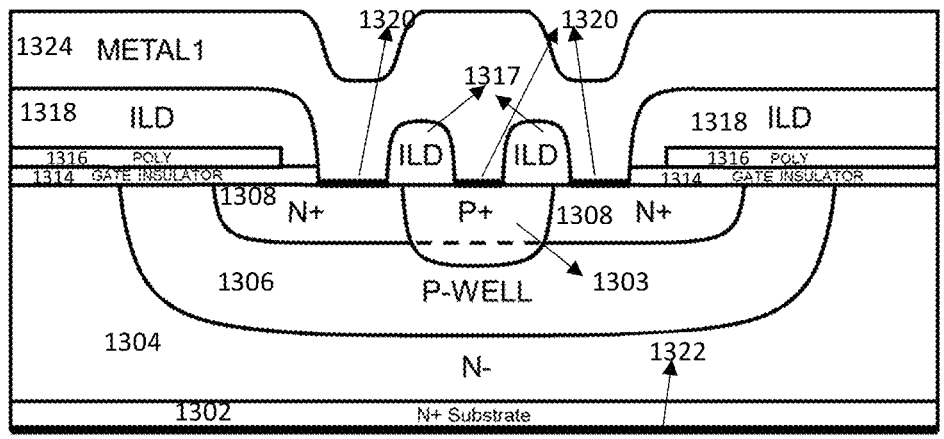
Figure 13T:
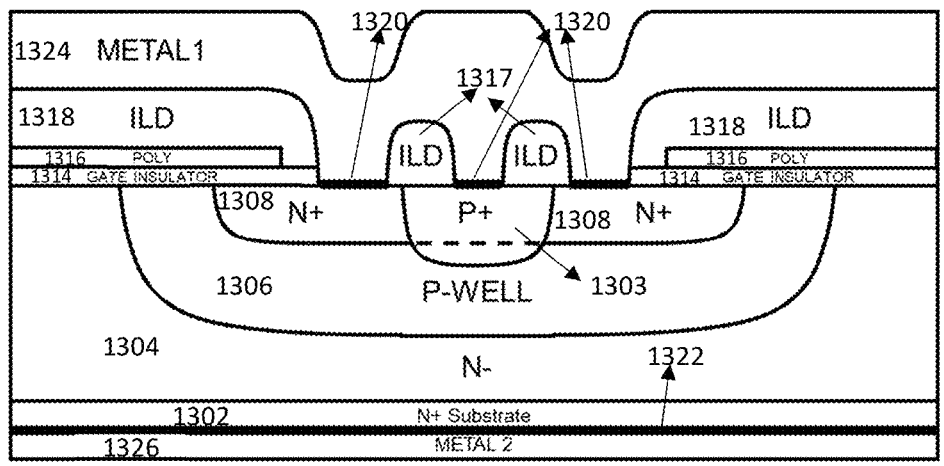

FIGS. 13a-13t illustrate an embodiment of a process of manufacturing the DMOSFET structure shown in FIG. 12a. The process of manufacturing the DMOSFET structure (shown in FIG. 13a) comprises preparing a silicon carbide (SiC) substrate having a N+ substrate 1302 and a N– drift layer 1304 as shown in FIG. 13a. The N– drift layer 1304 of the SiC substrate is epi-grown and prepared such that a doping concentration and a thickness of the N– drift layer 1304 are selected primarily based on blocking voltage and forward conduction loss. The N+ substrate 1302 is highly conductive when compared to the N– drift layer 1304 and the N+ substrate 1302 is directly located under the N– drift layer 1304. A first patterned hard mask layer 1305 is formed on top of the SiC substrate as shown in FIG. 13b. The first patterned hard mask layer 1305 is thick enough for completely blocking high energy impurities during implantation. In an embodiment, the first patterned hard mask layer 1305 is a hard mask of at least one of oxide, nitride and a polysilicon layer.

A first p-type ion implantation is formed in FIG. 13c through the first patterned hard mask layer 1305 to form a p-well region 1306. In an embodiment, the first p-type ion implantation is performed with one or more p-type impurities (e.g. aluminum, boron, etc.). In another embodiment, first p-type ion implantation may comprise a screen oxide layer. The first patterned hard mask layer 1305 is then removed, after the first p-type ion implantation, by at least one of dry etching process and wet etching process as shown in FIG. 13d. A second patterned hard mask layer 1307 is then formed on the top of the SiC substrate as shown in FIG. 13e for subsequent ion implantation. The second patterned hard mask layer 1307 is a photoresist based material and thick enough for preventing any unwanted high energy impurities particles penetrating the second patterned hard mask layer 1307. A first n-type ion implantation is formed through the second patterned hard mask layer 1307 to form a N+ source region 1308 within the p-well region 1306 as shown in FIG. 13f. In an embodiment, the first n-type ion implantation is performed with one or more n-type impurities (e.g. nitrogen, phosphorous etc.). The second patterned hard mask layer 1307 is then removed after the first n-type ion implantation by at least one of dry etching and wet etching process as shown in FIG. 13g.

A third patterned hard mask layer 1309 is then formed on top of the SiC substrate as shown in FIG. 13h. A second p-type implantation is performed through the third patterned hard mask layer 1309 to form a P+ region 1303, at a first location, within the p-well region 1306 as shown in FIG. 13i. The P+ region 1303 formed at the first location allows the P-well region 1306 to be in contact with a first pad metal 1324 (e.g. a source metal) only through the P+ region 1303 formed at the first location.

The third patterned hard mask layer 1309 is then removed as shown in FIG. 13j by at least one of a dry etching and a wet etching process once the P+ region 1303 is formed. The SiC substrate undergoes thermal activation annealing with a carbon-based protection coating at a predefined temperature. In an embodiment, the predefined temperature for performing the thermal activation annealing is 1700-degree Celsius. The SiC substrate then may undergo an additional ion implantation for forming a current spreading layer to improve on-state resistance. Ion implantations (e.g. the first p-type implantation, the first n-type impanation, the second p-type implantation, edge termination implantation, current spreading layer implantation etc.) undergone by the SiC substrate is performed prior to the thermal activation annealing step. The carbon-based protection coating is then removed from the SiC substrate. The SiC substrate then undergoes a sacrificial oxide growth and subsequently the sacrificial oxide removal. An active region of the SiC DMOSFET is then patterned by forming and patterning field oxide layer on the SiC substrate.

A gate insulator 1314 is then formed on top of the SiC substrate as shown in FIG. 13k. The gate insulator 1314 is then patterned as shown in FIG. 13l. A polysilicon layer 1316 is then formed on top of the SiC substrate as shown in FIG. 13m. The polysilicon layer 1316 is then patterned as shown in FIG. 13n. Contacts for the polysilicon layer 1316 is kept open for pad metal deposition for forming a gate pad region and one or more gate bus regions. An interlayer dielectric (ILD) 1318 is then formed on top of the SiC substrate as shown in FIG. 13o. The interlayer dielectric (ILD) 1318 is then patterned for exposing the portions of the SiC substrate via the openings of the ILD 1318 and leaving one or more ILD bumps 1317 as shown in FIG. 13p. A first silicide layer 1320 is then formed between the one or more ILD bumps 1317 on the exposed portions of top of the SiC substrate for forming a first Ohmic contact as shown in FIG. 13q. In an embodiment, the first silicide layer 1320 is a nickel-based silicide layer. In another embodiment, the nickel-based silicide is formed by Nickel deposition on the top of the SiC substrate, thermal activation annealing of the deposited Nickel for silicide formation, and removal of any un-reacted Nickel from the SiC substrate. The first pad metal 1324 is formed on top of the SiC substrate as shown in FIG. 13r. The P+ region 1303, formed at the first location, covers both portions of the first silicide layer 1320 between the adjacent ILD bumps 1317 and the portions under the ILD bumps 1317. The p-well region 1306 contacts with the first pad metal 1324 only through the P+ region 1303 formed at the first location.

A second silicide layer 1322 is then formed on bottom of the SiC substrate for forming a second Ohmic contact as shown in FIG. 13s. In an embodiment, the second silicide layer 1322 is then formed on back of the SiC substrate for forming the second Ohmic contact. In an embodiment, the second silicide layer 1322 is also the nickel-based silicide layer. A second pad metal 1326 is then formed on bottom of the second silicide layer 1322 of the SiC substrate as shown in FIG. 13t. In an embodiment, the second pad metal formation is performed by at least one of e-beam and sputtering.

A fourth patterned hard mask layer 1311 is then formed on the SiC substrate once the first Ohmic contact and the second Ohmic contact are formed on topside and bottom side/back side of the SiC substrate respectively. The fourth patterned hard mask layer 1311 is formed for selectively removing the exposed portions of the ILD layer 1318 and depositing a metal region (e.g. the Schottky metal region 1328) shown in FIGS. 13d, 13e & 13f on top of the SiC substrate. The fourth patterned hard mask layer 1311 is used for both etching the portion of the ILD layer 1318 and lifting off the Schottky metal region 1328 when Schottky metal is deposited. The Schottky metal region 1328 is in direct contact with the top of the N− drift layer 1304 and bridge two adjacent P-well regions 1306 (i.e. bridges the adjacent unit cells). The Schottky metal region 1328 is then annealed with a predefined thermal budget for forming a Schottky metal contact between the Schottky metal region 1328 and the portion of the N− drift layer 1304 exposed at the top surface of the SiC substrate. In an embodiment, the predefined thermal budget ranges from 55° C. to 1100° C. In FIGS. 12d, 12e & 12f, the first pad metal and the second pad metal formation are performed once the Schottky metal region 1328 formation is completed.

Figure 14A:
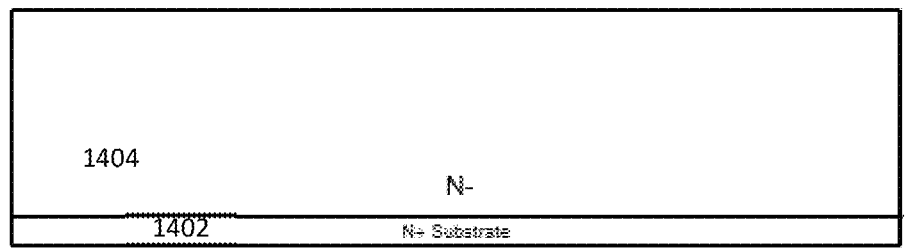
FIGS. 14a-14t illustrate an embodiment of a process of manufacturing the DMOSFET structure shown in FIG. 12b.
Figure 14B:
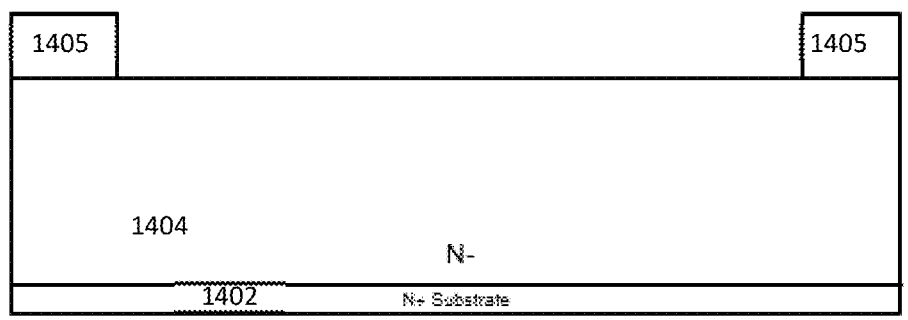
Figure 14C:
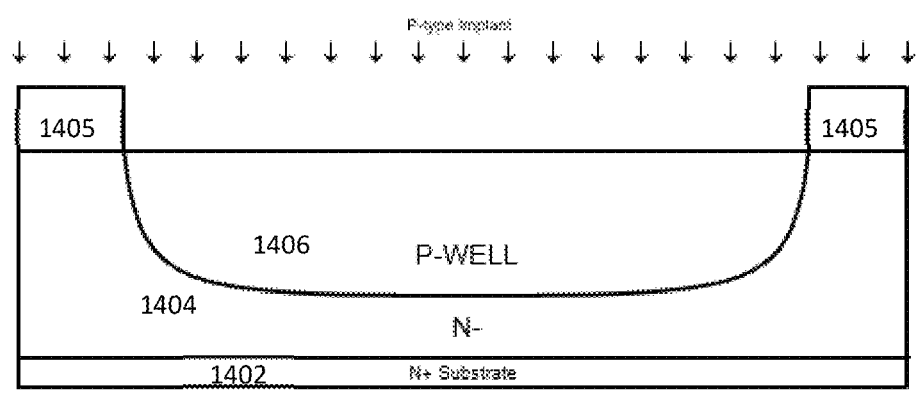
Figure 14D:
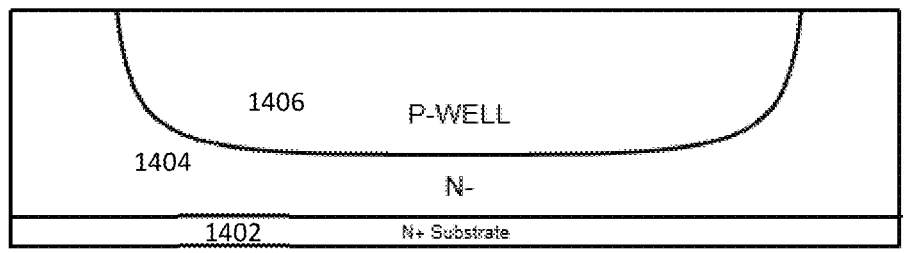
Figure 14E:
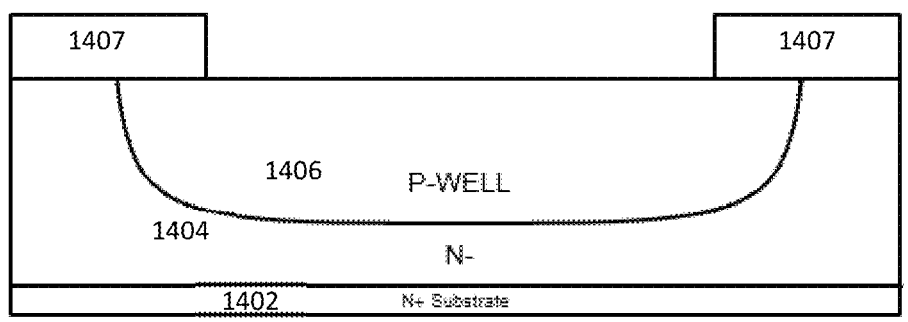
Figure 14F:
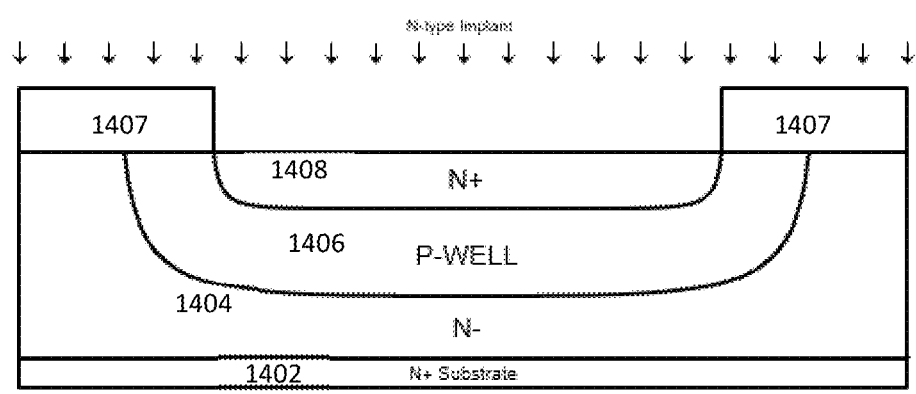
Figure 14G:
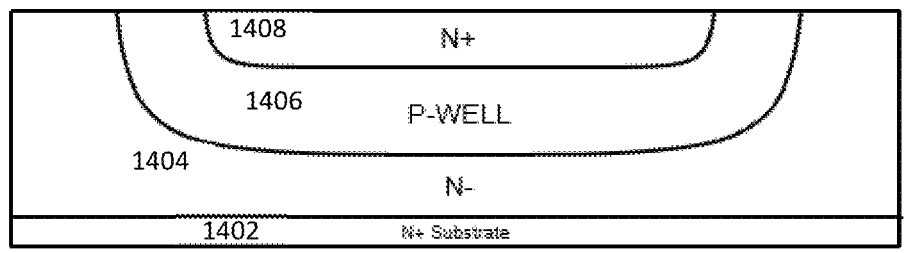
Figure 14H:
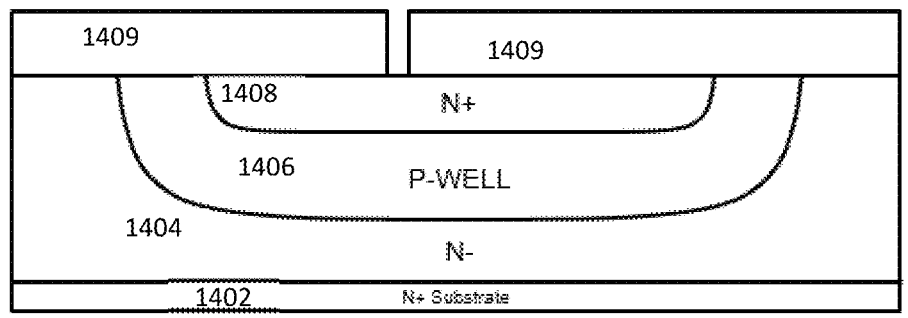
Figure 14I:
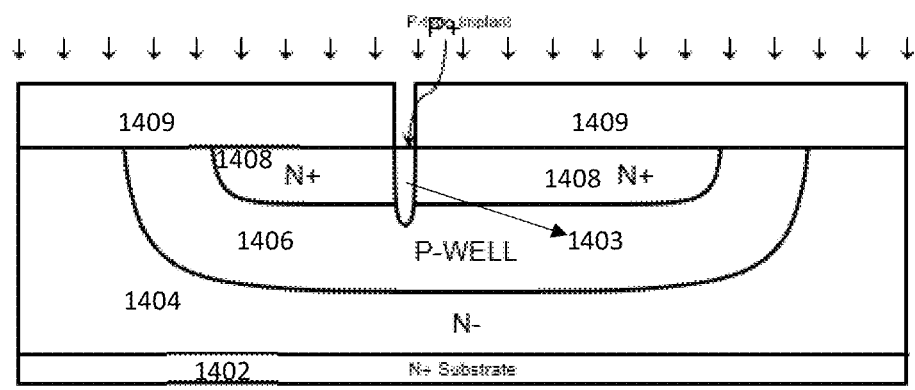
Figure 14J:
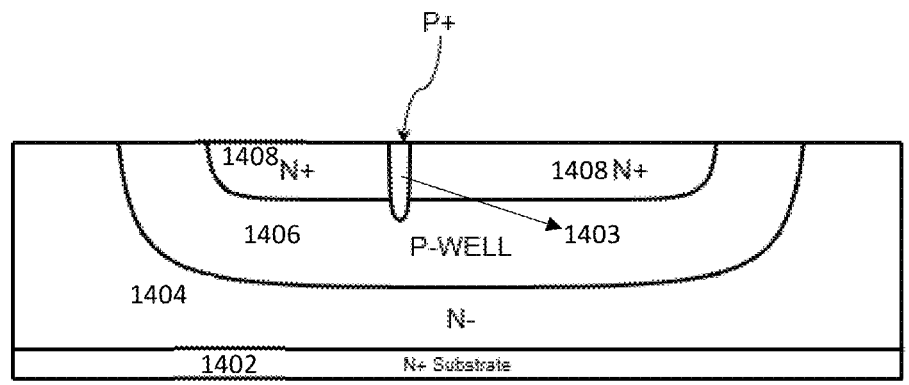
Figure 14K:
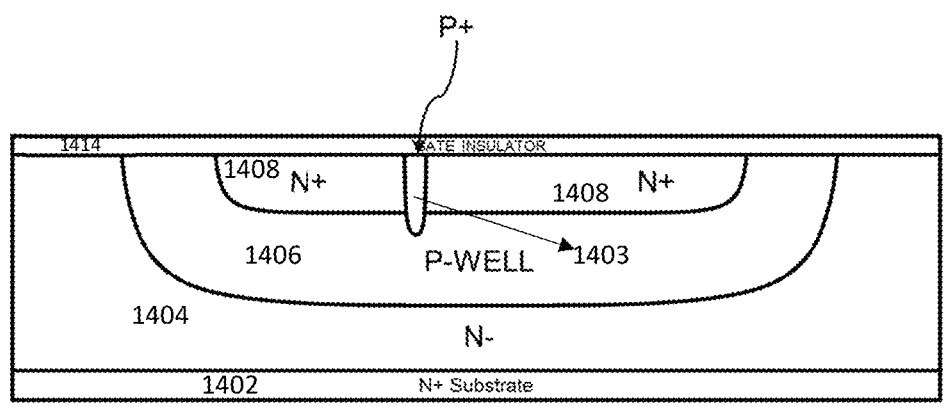
Figure 14L:
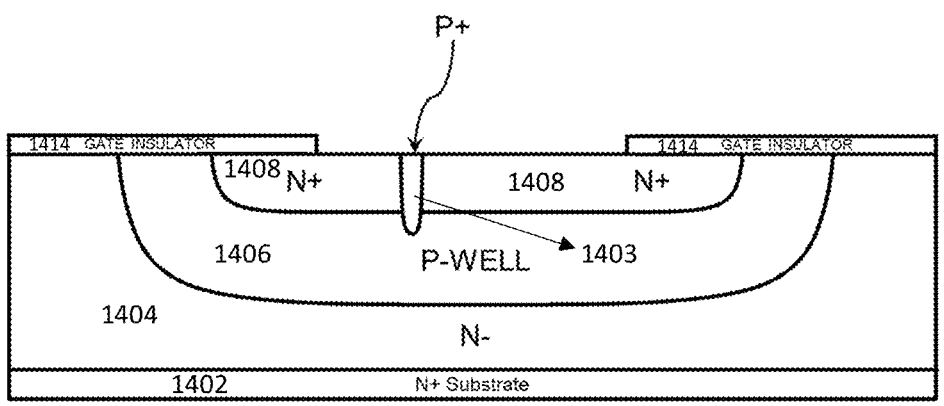
Figure 14M:
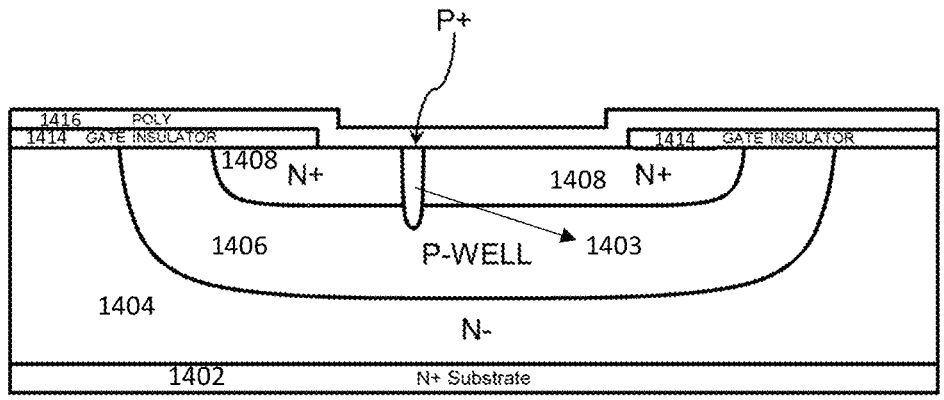
Figure 14N:
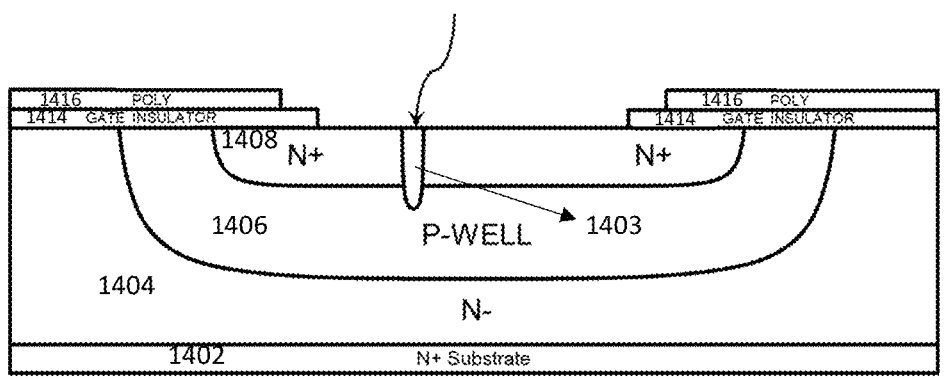
Figure 14O:
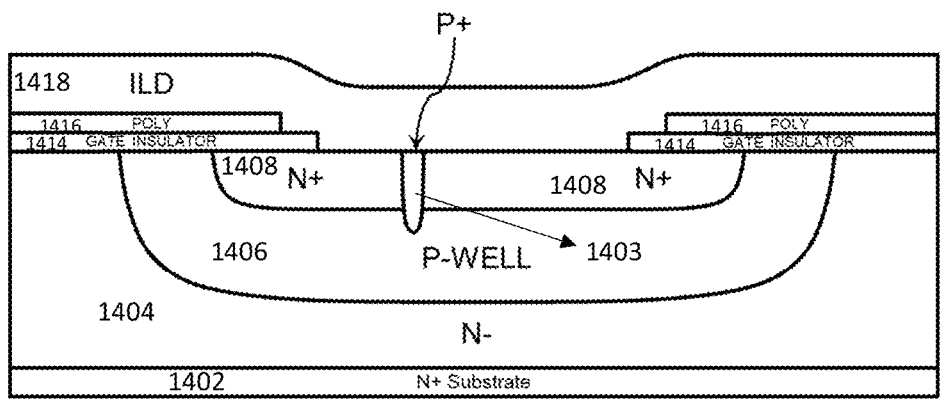
Figure 14P:
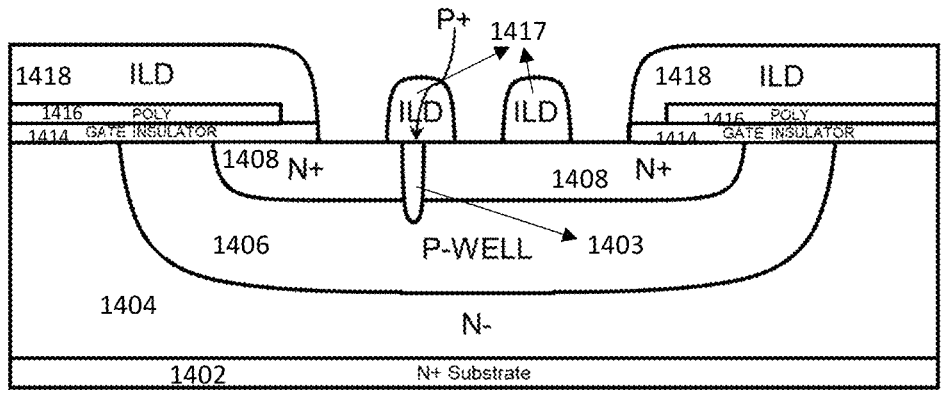
Figure 14Q:
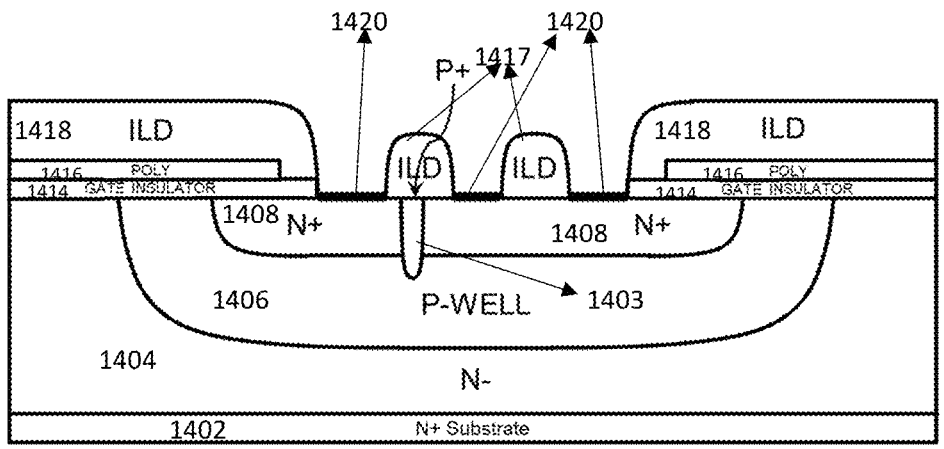
Figure 14R:
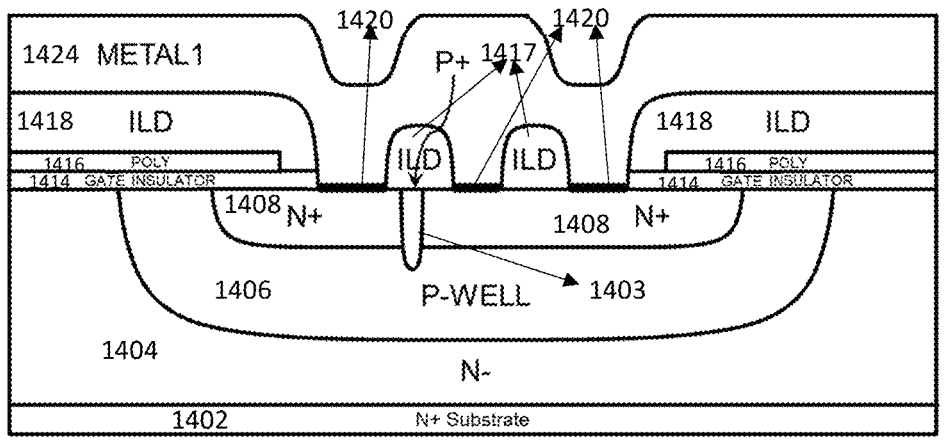
Figure 14S:
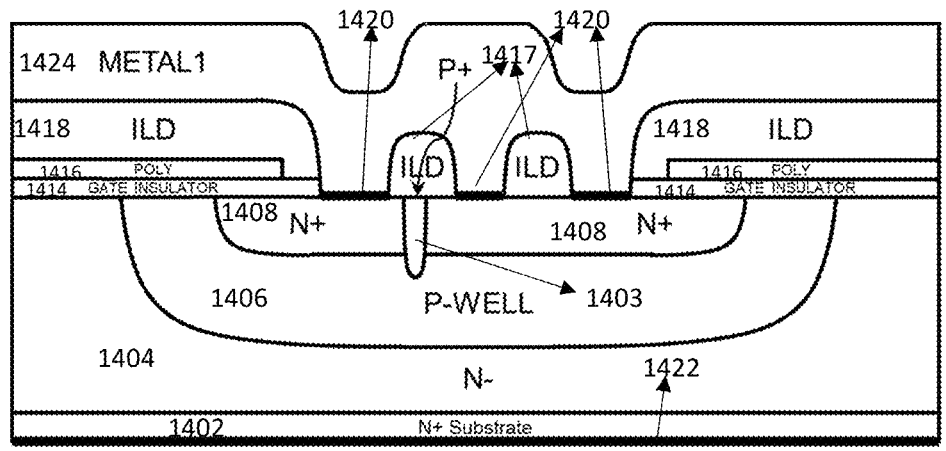
Figure 14T:
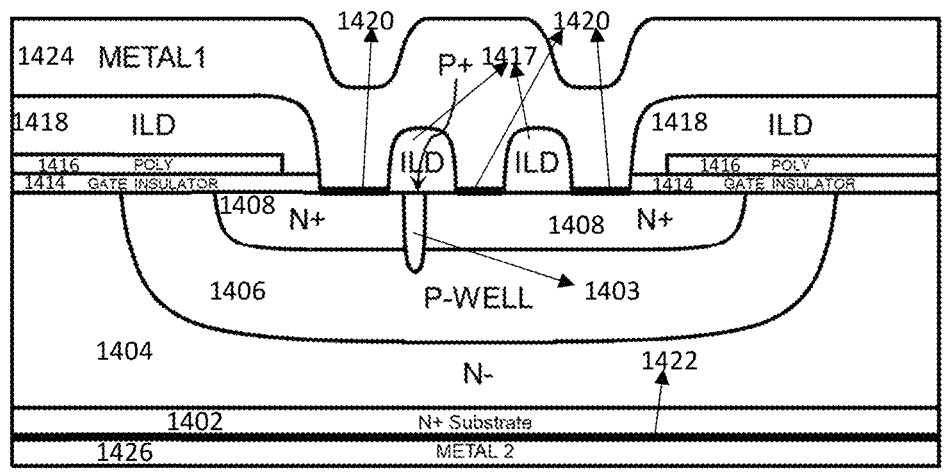

FIGS. 14a-14t illustrate an embodiment of a process of manufacturing the DMOSFET structure shown in FIG. 12b. The process of manufacturing the DMOSFET structure (shown in FIG. 14a) comprises preparing a silicon carbide (SiC) substrate having a N+ substrate 1402 and a N− drift layer 1404 as shown in FIG. 14a. The N− drift layer 1404 of the SiC substrate is epi-grown and prepared such that a doping concentration and a thickness of the N− drift layer 1404 are selected primarily based on blocking voltage and forward conduction loss. The N+ substrate 1402 is highly conductive when compared to the N− drift layer 1404 and the N+ substrate 1402 is directly located under the N− drift layer 1404. A first patterned hard mask layer 1405 is formed on top of the SiC substrate as shown in FIG. 14b. The first patterned hard mask layer 1405 is thick enough for completely blocking high energy impurities during implantation. In an embodiment, the first patterned hard mask layer 1405 is a hard mask of at least one of oxide, nitride and a polysilicon layer.

A first p-type ion implantation is formed in FIG. 14c through the first patterned hard mask layer 1405 to form a p-well region 1406. In an embodiment, the first p-type ion implantation is performed with one or more p-type impurities (e.g. aluminum, boron, etc.). In another embodiment, first p-type ion implantation may comprise a screen oxide layer. The first patterned hard mask layer 1405 is then removed, after the first p-type ion implantation, by at least one of dry etching process and wet etching process as shown in FIG. 14d. A second patterned hard mask layer 1407 is then formed on the top of the SiC substrate as shown in FIG. 14e for subsequent ion implantation. The second patterned hard mask layer 1407 is a photoresist based material and thick enough for preventing any unwanted high energy impurities particles penetrating the second patterned hard mask layer 1407. A first n-type ion implantation is formed through the second patterned hard mask layer 1407 to form a N+ source region 1408 within the p-well region 1406 as shown in FIG. 14f. In an embodiment, the first n-type ion implantation is performed with one or more n-type impurities (e.g. nitrogen, phosphorous etc.). The second patterned hard mask layer 1407 is then removed after the first n-type ion implantation by at least one of dry etching and wet etching process as shown in FIG. 14g.

A third patterned hard mask layer 1409 is then formed on top of the SiC substrate as shown in FIG. 14h. A second p-type implantation is performed through the third patterned hard mask layer 1409 to form a P+ region 1403, at a second location, within the p-well region 1406 as shown in FIG. 14i.

The third patterned hard mask layer 1409 is then removed as shown in FIG. 14j by at least one of a dry etching and a wet etching process once the P+ region 1403 is formed at the second location. The SiC substrate undergoes thermal activation annealing with a carbon-based protection coating at a predefined temperature. In an embodiment, the predefined temperature for performing the thermal activation annealing is 1700-degree Celsius. The SiC substrate then may undergo an additional ion implantation for forming a current spreading layer to improve on-state resistance. Ion implantations (e.g. the first p-type implantation, the first n-type impanation, the second p-type implantation, edge termination implantation, current spreading layer implantation etc.) undergone by the SiC substrate is performed prior to the thermal activation annealing step. The carbon-based protection coating is then removed from the SiC substrate. The SiC substrate then undergoes a sacrificial oxide growth and subsequently the sacrificial oxide removal. An active region of the SiC DMOSFET is then patterned by forming and patterning field oxide layer on the SiC substrate.

A gate insulator 1414 is then formed on top of the SiC substrate as shown in FIG. 14k. The gate insulator 1414 is then patterned as shown in FIG. 14l. A polysilicon layer 1416 is then formed on top of the SiC substrate as shown in FIG. 14m. The polysilicon layer 1416 is then patterned as shown in FIG. 14n. Contacts for the polysilicon layer is kept open for pad metal deposition for forming a gate pad region and one or more gate bus regions. An interlayer dielectric (ILD) 1418 is then formed on top of the SiC substrate as shown in FIG. 14o. The interlayer dielectric (ILD) 1418 is then patterned for exposing the portions of the SiC substrate via the openings of the ILD 1418 and leaving one or more ILD bumps 1417 on top of the SiC substrate as shown in FIG. 14p. A first silicide layer 1420 is then formed between the one or more ILD bumps 1417 on the exposed portions of top of the SiC substrate for forming a first Ohmic contacts as shown in FIG. 14q. In an embodiment, the first silicide layer 1420 is a nickel-based silicide layer. In another embodiment, the nickel-based silicide is formed by Nickel deposition on the top of the SiC substrate, thermal activation annealing of the deposited Nickel for silicide formation, and removal of any un-reacted Nickel from the SiC substrate. A first pad metal 1424 is formed on top of the SiC substrate as shown in FIG. 14r. The P+ region 1403, formed at the second location, is under the one or more ILD bumps 1417 and do not form any direct contact with the first silicide layer 1420.

A second silicide layer 1422 is then formed on bottom of the SiC substrate for forming a second Ohmic contact as shown in FIG. 14s. In an embodiment, the second silicide layer 1422 is then formed on back of the SiC substrate for forming the second Ohmic contact. In an embodiment, the second silicide layer 1422 is also the nickel-based silicide layer. A second pad metal is then formed on bottom of the second silicide layer 1422 of the SiC substrate as shown in FIG. 14t. In an embodiment, the second pad metal formation is performed by at least one of e-beam and sputtering.

A fourth patterned hard mask layer 1411 is then formed on the SiC substrate once the first Ohmic contact and the second Ohmic contact are formed on topside and bottom side/back side of the SiC substrate respectively. The fourth patterned hard mask layer 1411 is formed for selectively removing the exposed portions of the ILD layer 1418 and depositing a metal region (i.e. a Schottky metal region 1428) shown in FIGS. 12d, 12e & 12f on top of the SiC substrate. The fourth patterned hard mask layer 1411 is used for both etching the portion of the ILD layer 1418 and lifting off the Schottky metal region 1428 when Schottky metal is deposited. The Schottky metal region 1428 is in direct contact with the N− drift layer 1404 and bridge two adjacent P-well regions 1406 (i.e. bridges the adjacent unit cells). The Schottky metal region 1428 is then annealed with a predefined thermal budget for forming a Schottky metal contact between the Schottky metal region 1428 and the portion of the N− drift layer 1404 exposed at the top surface of the SiC substrate. In an embodiment, the predefined thermal budget ranges from 55° C. to 1100° C. In FIGS. 12d, 12e & 12f, the first pad metal and the second pad metal formation are performed once the Schottky metal region 1428 formation is completed.

Figure 15A:
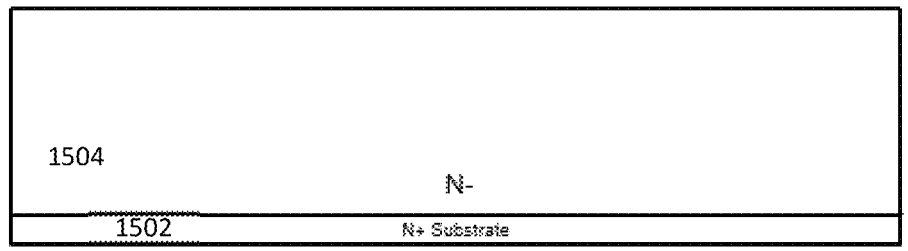
FIGS. 15a-15t illustrate an embodiment of a process of manufacturing the DMOSFET structure shown in FIG. 12c.
Figure 15B:
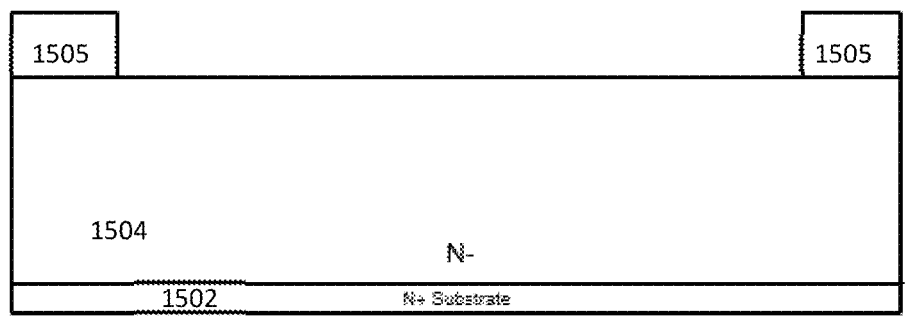
Figure 15C:
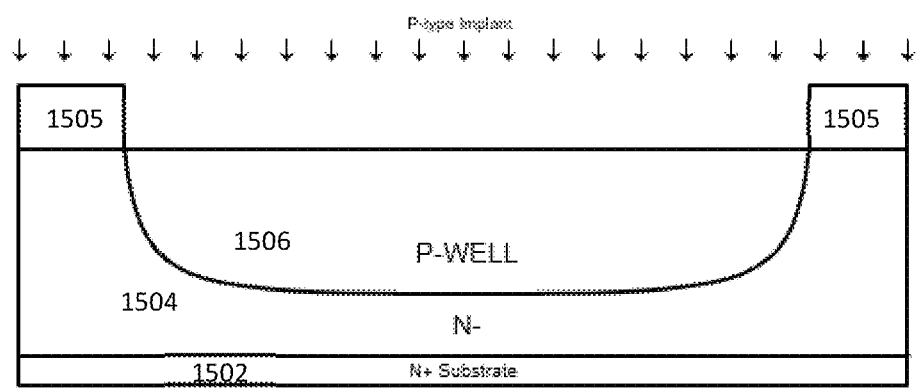
Figure 15D:
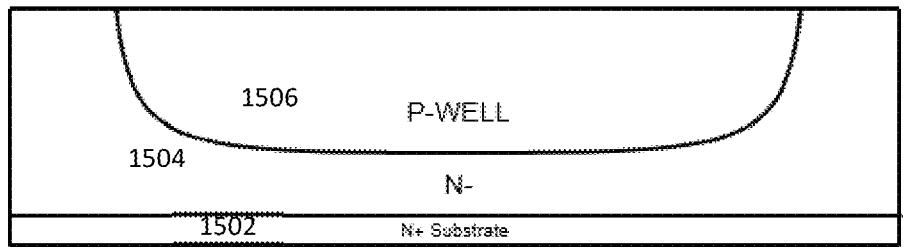
Figure 15E:
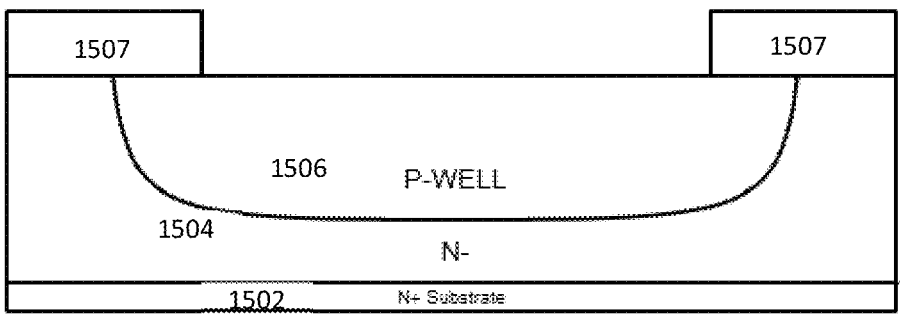
Figure 15F:
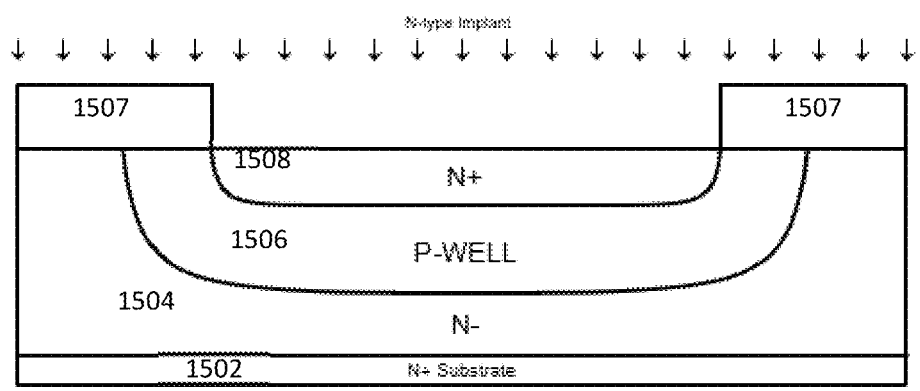
Figure 15G:
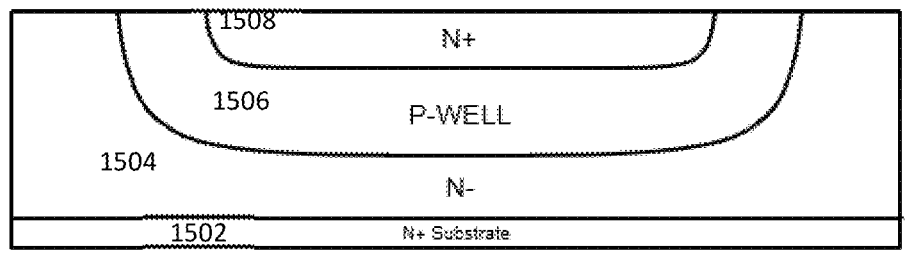
Figure 15H:
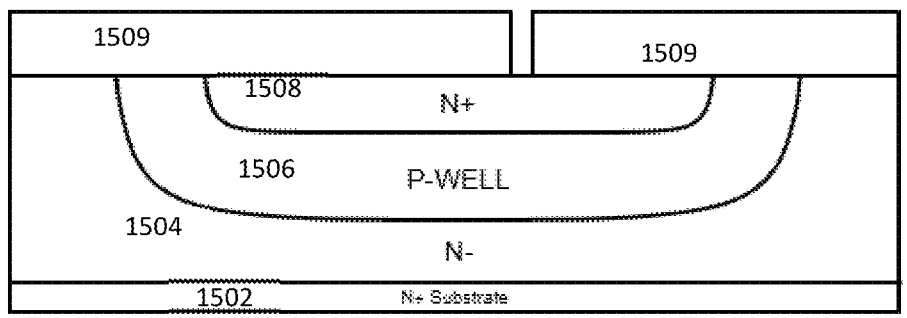
Figure 15I:
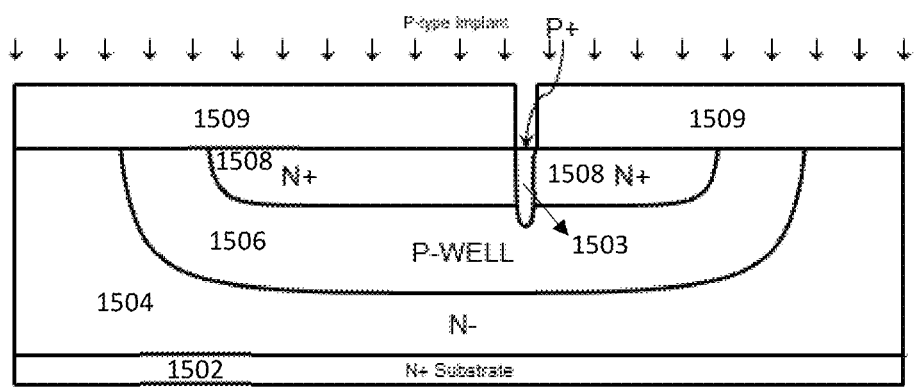
Figure 15J:
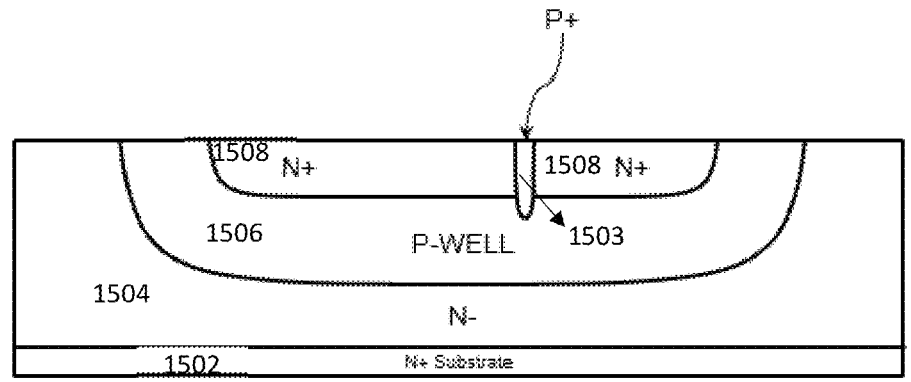
Figure 15K:
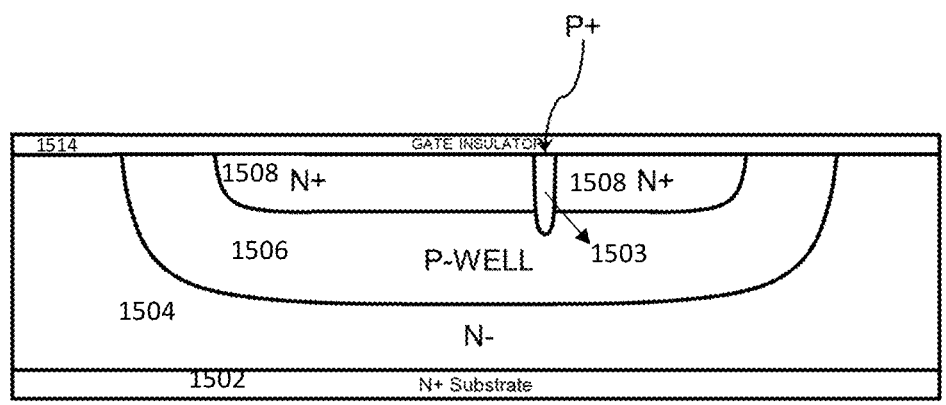
Figure 15L:
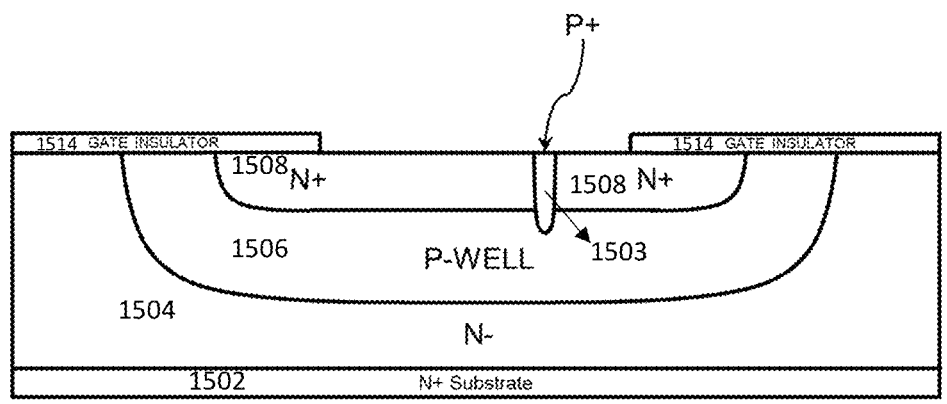
Figure 15M:
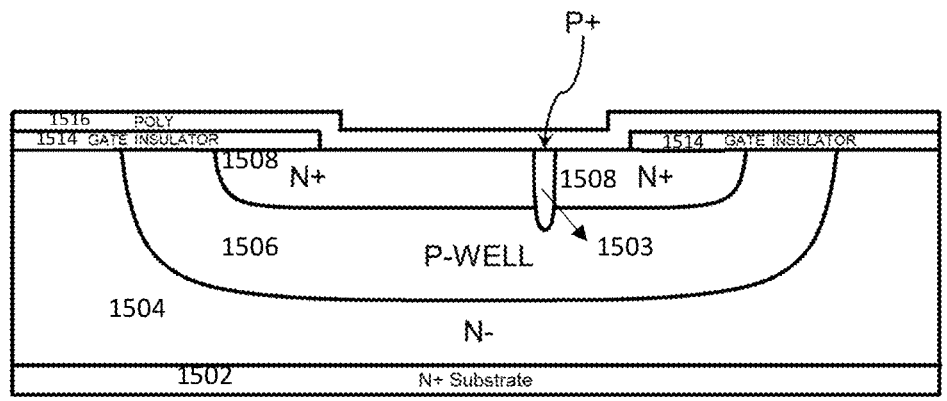
Figure 15N:
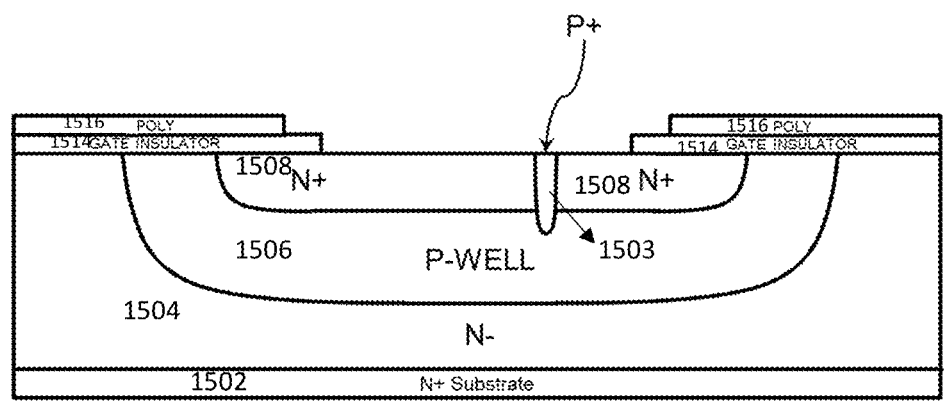
Figure 15O:
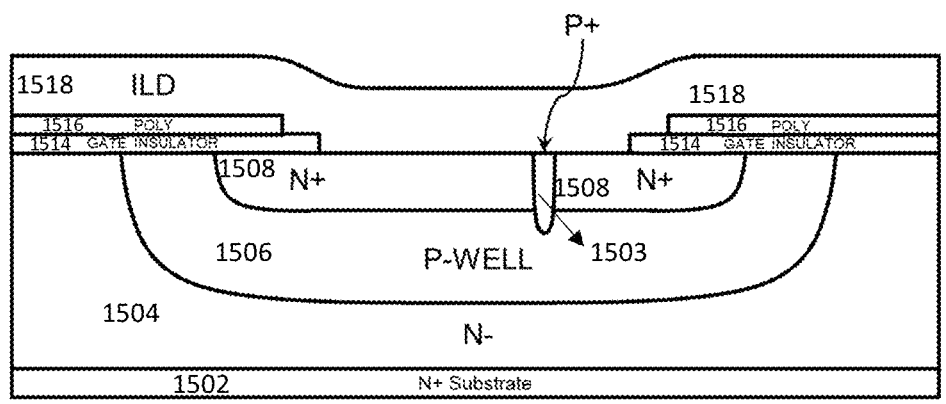
Figure 15P:
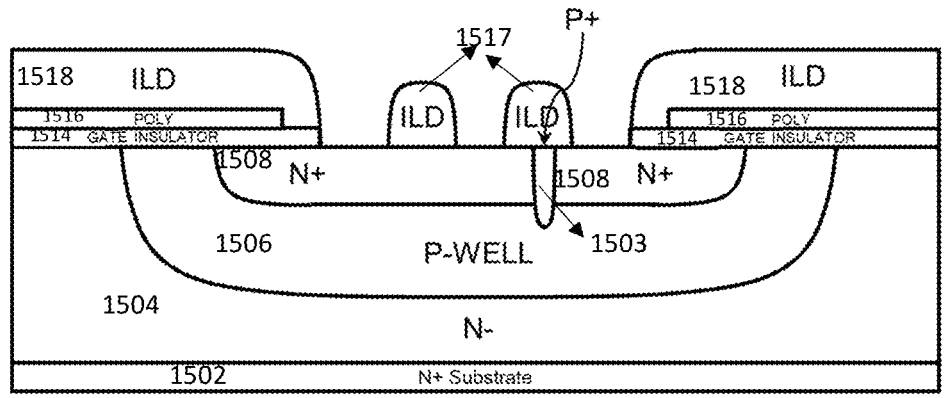
Figure 15Q:
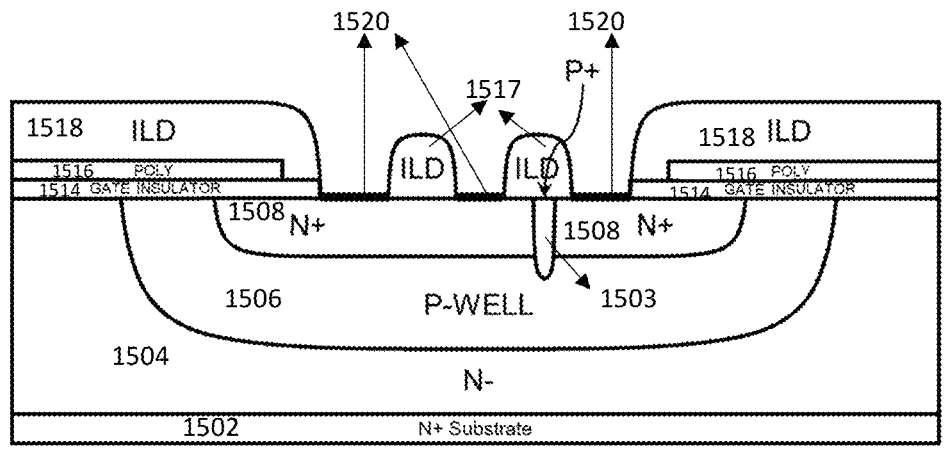
Figure 15R:
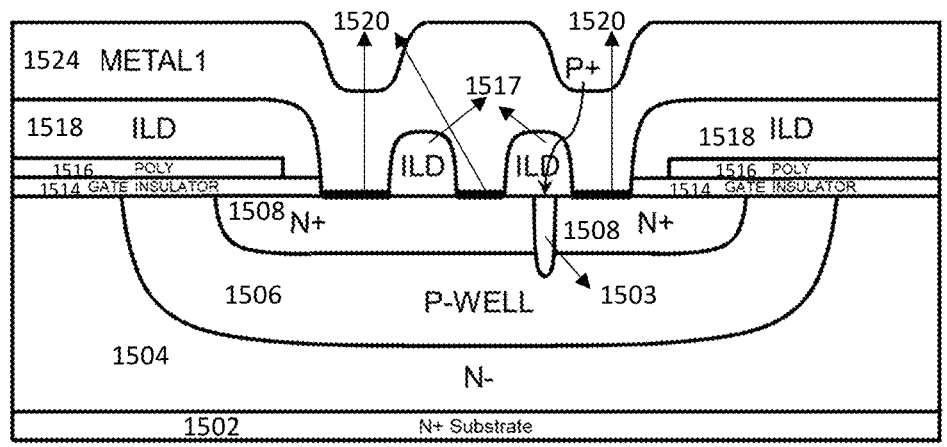
Figure 15S:
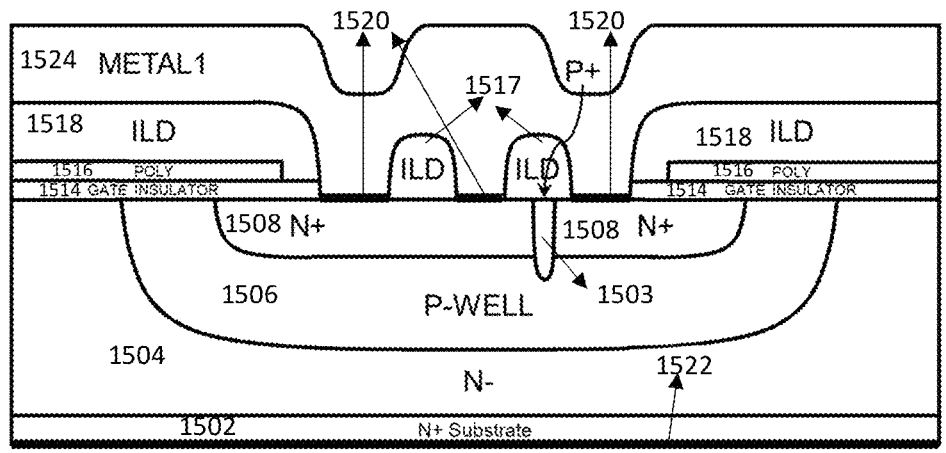
Figure 15T:
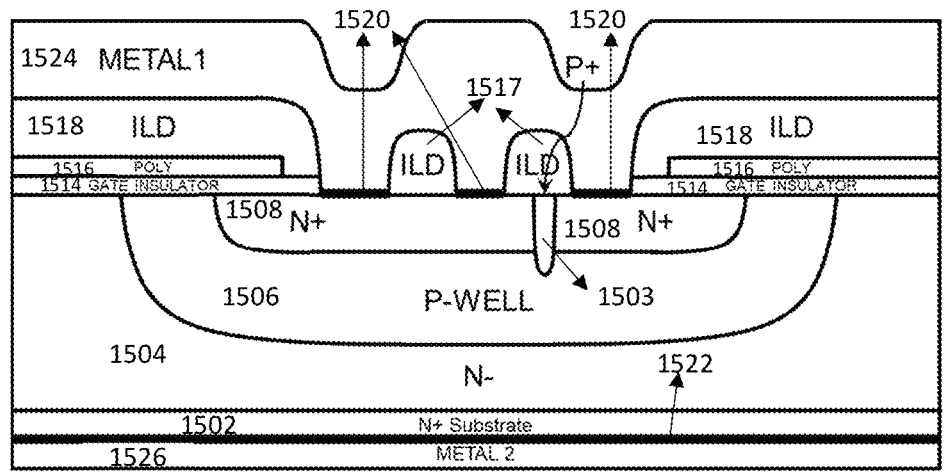

FIGS. 15a-15t illustrate an embodiment of a process of manufacturing the DMOSFET structure shown in FIG. 12c. The process of manufacturing the DMOSFET structure (shown in FIG. 15a) comprises preparing a silicon carbide (SiC) substrate having a N+ substrate 1502 and a N− drift layer 1504 as shown in FIG. 15a. The N− drift layer 1504 of the SiC substrate is epi-grown and prepared such that a doping concentration and a thickness of the N− drift layer 1504 are selected primarily based on blocking voltage and forward conduction loss. The N+ substrate 1502 is highly conductive when compared to the N− drift layer 1504 and the N+ substrate 1502 is directly located under the N− drift layer 1504. A first patterned hard mask layer 1505 is formed on top of the SiC substrate as shown in FIG. 15b. The first patterned hard mask layer 1505 is thick enough for completely blocking high energy impurities during implantation. In an embodiment, the first patterned hard mask layer 1505 is a hard mask of at least one of oxide, nitride and a polysilicon layer.

A first p-type ion implantation is formed in FIG. 15c through the first patterned hard mask layer 1505 to form a p-well region 1506. In an embodiment, the first p-type ion implantation is performed with one or more p-type impurities (e.g. aluminum, boron, etc.). In another embodiment, first p-type ion implantation may comprise a screen oxide layer. The first patterned hard mask layer 1505 is then removed, after the first p-type ion implantation, by at least one of dry etching process and wet etching process as shown in FIG. 15d. A second patterned hard mask layer 1507 is then formed on the top of the SiC substrate as shown in FIG. 15e for subsequent ion implantation. The second patterned hard mask layer 1507 is a photoresist based material and thick enough for preventing any unwanted high energy impurities particles penetrating the second patterned hard mask layer 1507. A first n-type ion implantation is formed through the second patterned hard mask layer 1507 to form a N+ source region 1508 within the p-well region 1506 as shown in FIG. 15f. In an embodiment, the first n-type ion implantation is performed with one or more n-type impurities (e.g. nitrogen, phosphorous etc.). The second patterned hard mask layer 1507 is then removed after the first n-type ion implantation by at least one of dry etching and wet etching process as shown in FIG. 15g.

A third patterned hard mask layer 1509 is then formed on top of the SiC substrate as shown in FIG. 15h. A second p-type implantation is performed through the third patterned hard mask layer 1509 to form a P+ region 1503, at a third location, within the p-well region 1506 as shown in FIG. 15i.

The third patterned hard mask layer 1509 is then removed as shown in FIG. 15j by at least one of a dry etching and a wet etching process once the P+ region 1503 is formed at the second location. The SiC substrate undergoes thermal activation annealing with a carbon-based protection coating at a predefined temperature. In an embodiment, the predefined temperature for performing the thermal activation annealing is 1700-degree Celsius. The SiC substrate then may undergo an additional ion implantation for forming a current spreading layer to improve on-state resistance. Ion implantations (e.g. the first p-type implantation, the first n-type impanation, the second p-type implantation, edge termination implantation, current spreading layer implantation etc.) undergone by the SiC substrate is performed prior to the thermal activation annealing step. The carbon-based protection coating is then removed from the SiC substrate. The SiC substrate then undergoes a sacrificial oxide growth and subsequently the sacrificial oxide removal. An active region of the SiC DMOSFET is then patterned by forming and patterning field oxide layer on the SiC substrate.

A gate insulator 1514 is then formed on top of the SiC substrate as shown in FIG. 15*k*. The gate insulator 1514 is then patterned as shown in FIG. 15*l*. A polysilicon layer 1516 is then formed on top of the SiC substrate as shown in FIG. 15*m*. The polysilicon layer 1516 is then patterned as shown in FIG. 15*n*. Contacts for the polysilicon layer is kept open for pad metal deposition for forming a gate pad region and one or more gate bus regions. An interlayer dielectric (ILD) 1518 is then formed on top of the SiC substrate as shown in FIG. 15*o*. The interlayer dielectric (ILD) 1518 is then patterned for exposing the portions of the SiC substrate via the openings of the ILD 1518 and leaving one or more ILD bumps 1517 on top of the SiC substrate as shown in FIG. 15*p*. A first silicide layer 1520 is then formed between the one or more ILD bumps 1517 on the exposed portions on top of the SiC substrate for forming a first Ohmic contact as shown in FIG. 15*q*. In an embodiment, the first silicide layer 1520 is a nickel-based silicide layer. In another embodiment, the nickel-based silicide is formed by Nickel deposition on the top of the SiC substrate, thermal activation annealing of the deposited Nickel for silicide formation, and removal of any un-reacted Nickel from the SiC substrate. A first pad metal 1524 is formed on top of the SiC substrate as shown in FIG. 15*r*. The P+ region 1503, formed at the third location, is under the one or more ILD bumps 1517 and do not form any direct contact with the first silicide layer 1520.

A second silicide layer 1522 is then formed on bottom of the SiC substrate for forming a second Ohmic contact as shown in FIG. 15*s*. In an embodiment, the second silicide layer 1522 is then formed on back of the SiC substrate for forming the second Ohmic contact. In an embodiment, the second silicide layer 1522 is also the nickel-based silicide layer. A second pad metal 1526 is then formed on bottom of the second silicide layer 1522 of the SiC substrate as shown in FIG. 15*t*. In an embodiment, the second pad metal formation is performed by at least one of e-beam and sputtering.

A fourth patterned hard mask layer 1511 is then formed on the SiC substrate once the first Ohmic contact and the second Ohmic contact are formed on topside and bottom side/back side of the SiC substrate respectively. The fourth patterned hard mask layer 1511 is formed for selectively removing the exposed portions of the ILD layer 1518 and depositing a metal region (e.g. a Schottky metal region 1528) shown in FIGS. 12*d*, 12*e* & 12*f* on top of the SiC substrate. The fourth patterned hard mask layer 1511 is used for both etching the portion of the ILD layer 1518 and lifting off the Schottky metal region 1528 when Schottky metal is deposited. The Schottky metal region 1528 is in direct contact with the N− drift layer 1504 and bridge two adjacent P-well regions 1506 (i.e. bridges the adjacent unit cells). The Schottky metal region 1528 is then annealed with a predefined thermal budget for forming a Schottky metal contact between the Schottky metal region 1528 and the portion of the N− drift layer 1504 exposed at the top surface of the SiC substrate. In an embodiment, the predefined thermal budget ranges from 55° C. to 1100° C. In FIGS. 12*d*, 12*e* & 12*f*, the first pad metal and the second pad metal formation are performed once the Schottky metal region 1528 formation is completed.

The present disclosure may be embodied in other specific forms without departing from its spirit or characteristics. The described embodiments are to be considered in all respects only as illustrative and not restrictive. The scope is, therefore, indicated by the appended claims rather than by the foregoing description. All changes which come within the meaning and range of equivalency of the claims are to be embraced within their scope.

Other embodiments are also within the scope of the following claims.

Although, various embodiments which incorporate the teachings described in detail herein, those skilled in the art can readily devise many other varied embodiments that still incorporate these teachings. For example, a complementary SiC DMOSFET device with a P+ substrate, P− drift layer and P+ source can be created in a N-well region. The embodiments described are all applicable to the complementary DMOSFET as well.

All documents (patents, patent publications or other publications) mentioned in the specification are incorporated herein in their entirety by reference.

INCORPORATION BY REFERENCE

All publications, patents, and patent applications cited in this Specification are hereby incorporated by reference in their entirety, including:
WO2011013042A1 entitled "Germanium n-MOSFET Devices and production methods";
EP0899791B1 entitled "Trench-gated MOSFET with bidirectional voltage clamping";
JP2008541459A entitled "Silicon carbide junction barrier Schottky diode with suppressed minority carrier injection";
U.S. Pat. No. 9,875,332 entitled "Contact Resistance Mitigation";
U.S. Pat. No. 5,731,605A entitled "Turn-off power semiconductor component with a particular ballast resistor structure";
U.S. Pat. No. 5,461,250 entitled "SiGe thin film or SOI MOSFET and method for making the same";
U.S. Pat. No. 9,899,512B2 entitled "Silicon Carbide device and method of making thereof";
U.S. Pat. No. 9,876,104B2 entitled "High voltage semiconductor devices and methods of making the devices";
US20190013312A1 entitled "MOSFET device of silicon carbide having an integrated diode and manufacturing process thereof";
U.S. Pat. No. 9,318,597B2 entitled "Layout configurations for integrating Schottky contacts into a power transistor device"; and
U.S. Pat. No. 8,436,367B1 entitled "SiC power vertical DMOS with increased safe operating area".

What is claimed is:

1. A device comprising a unit cell on a Silicon Carbide (SiC) substrate, the unit cell comprising: a first conductivity type source region on the SiC substrate; a second conductivity type well region that contains the first conductivity type source region; a second conductivity type well contact region located within the second conductivity type well region; and a silicide layer on the SiC substrate, wherein the device comprises a vertical Silicon Carbide double-implantation metal oxide semiconductor field-effect transistor (DMOSFET) comprising a drain terminal and a source terminal on the SiC substrate, wherein the second conductivity type well contact region meanders within the second conductivity type well region to form a contact region in a periodic contact with a source metal region, wherein the second conductivity type well contact region is located adjacent and contiguous between the first conductivity type source region in a lateral direction, wherein the second conductivity type well region contacts with the source metal region through the second conductivity type well contact region, and wherein the source metal region in contact with the silicide layer.

2. The device of claim 1, wherein the second conductivity type well contact region comprises the periodic contact with the source metal region via the silicide layer between an adjacent interlayer dielectric (ILD) region, wherein the ILD region is on the SiC substrate.

3. The device of claim 2, wherein the second conductivity type well contact region comprises a target size, a target spacing between adjacent junction points located between the second conductivity type well contact region, and the silicide layer between the adjacent ILD region.

4. The device of claim 3, wherein the target size ranges from 10 nm to 10 μm and the target spacing ranges from 10 nm to 10 μm.

5. The device of claim 1, wherein a vertical extent of the second conductivity type well contact region extends through and beyond the first conductivity type source region.

6. The device of claim 1, wherein a vertical extent of the second conductivity type well contact region and a vertical extent of the first conductivity type source region are equal.

7. The device of claim 1, wherein the second conductivity type well contact region meanders from a perspective of a cross-sectional view of the device and the second conductivity type well region contacts with the source metal region through the second conductivity type well contact region.

8. The device of claim 7, wherein the second conductivity type well contact region comprises a target size, a target spacing between adjacent junction points located between the second conductivity type well contact region, and the silicide layer between an adjacent ILD region, wherein the ILD region is on the SiC substrate.

9. The device of claim 8, wherein the target size ranges from 10 nm to 10 μm and the target spacing ranges from 10 nm to 10 μm.

10. The device of claim 7, wherein the second conductivity type well contact region meanders from the perspective of the cross-sectional view of the device comprises: the second conductivity type well contact region comprises a direct contact with the source metal region through the silicide layer; and the second conductivity type well contact region under an interlayer dielectric (ILD) region do not have direct contact with the source metal region, wherein the ILD region is on the SiC substrate.

11. The device of claim 1, wherein the device comprises the first conductivity type source region and the second conductivity type well contact region within the second conductivity type well region.

12. A device comprising a unit cell on a Silicon Carbide (SiC) substrate, the unit cell comprising: a first conductivity type source region on the SiC substrate; a second conductivity type well region that contains the first conductivity type source region; a second conductivity type well contact region located within the second conductivity type well region; and a silicide layer on the SiC substrate, wherein the second conductivity type well contact region meanders within the second conductivity type well region to form a contact region in a periodic contact with a source metal region, wherein the second conductivity type well contact region is located adjacent and contiguous between the first conductivity type source region in a lateral direction, and wherein the second conductivity type well region contacts with the source metal region through the second conductivity type well contact region, and wherein the source metal region in contact with the silicide layer.

13. The device of claim 12, wherein the device comprises a vertical Silicon Carbide double-implantation metal oxide semiconductor field-effect transistor (DMOSFET), the vertical Silicon Carbide (SiC) DMOSFET comprises one of (a) a planar gate DMOSFET and (b) a trench gate DMOSFET.

14. The device of claim 12, wherein the device comprises a metal oxide semiconductor field effect transistor (MOSFET), the MOSFET comprises one of (a) a planar gate MOSFET, and (b) a trench gate MOSFET.

15. A device comprising: a silicon carbide (SiC) double-implantation metal oxide semiconductor field effect transistor (DMOSFET) capable of carrying a drain current of less than negative 500 milliamperes at a drain voltage of negative 3 volts, wherein a second conductivity type well contact region meanders within a second conductivity type well region to form a contact region in a periodic contact with a source metal region, wherein the second conductivity type well contact region is located adjacent and contiguous between a first conductivity type source region in a lateral direction, wherein a second conductivity type well region contacts with the source metal region through the second conductivity type well contact region, wherein the second conductivity type well region contains the first conductivity type source region, and wherein the source metal region in contact with a silicide layer on a SiC substrate.

16. The device of claim 15, wherein the device comprises a Schottky diode region and a p-n diode region, the Schottky diode region connected in series with the p-n diode region on the SiC substrate.

17. The device of claim 15, wherein the device comprises the first conductivity type source region and the second conductivity type well contact region within the second conductivity type well region.

18. The device of claim 15, wherein a vertical extent of the second conductivity type well contact region extends through and beyond the first conductivity type source region.

19. The device of claim 15, wherein a vertical extent of the second conductivity type well contact region and a vertical extent of the first conductivity type source region are equal.

20. The device of claim 15, wherein the Silicon Carbide (SiC) DMOSFET comprises one of (a) a planar gate DMOSFET and (b) a trench gate DMOSFET.

* * * * *